US011164970B2

(12) United States Patent
Ho et al.

(10) Patent No.: US 11,164,970 B2
(45) Date of Patent: Nov. 2, 2021

(54) CONTACT FIELD PLATE

(71) Applicant: Taiwan Semiconductor Manufacturing Co., Ltd., Hsin-Chu (TW)

(72) Inventors: Chia-Cheng Ho, Hsinchu (TW); Hui-Ting Lu, Zhudong Township (TW); Pei-Lun Wang, Zhubei (TW); Yu-Chang Jong, Hsinchu (TW); Jyun-Guan Jhou, Taoyuan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/506,129

(22) Filed: Jul. 9, 2019

(65) Prior Publication Data

US 2019/0334032 A1 Oct. 31, 2019

Related U.S. Application Data

(60) Continuation-in-part of application No. 15/927,281, filed on Mar. 21, 2018, now Pat. No. 10,636,904.
(Continued)

(51) Int. Cl.
*H01L 29/40* (2006.01)
*H01L 29/78* (2006.01)
(Continued)

(52) U.S. Cl.
CPC ........ *H01L 29/7816* (2013.01); *H01L 21/761* (2013.01); *H01L 23/49562* (2013.01);
(Continued)

(58) Field of Classification Search
CPC . H01L 29/402; H01L 29/407; H01L 29/7816; H01L 29/66681
See application file for complete search history.

(56) References Cited

U.S. PATENT DOCUMENTS

| 4,288,803 A | 9/1981 | Ronen |
| 4,290,077 A | 9/1981 | Ronen |
(Continued)

FOREIGN PATENT DOCUMENTS

| TW | 201340327 A | 10/2013 |
| TW | 201430917 A | 8/2014 |

OTHER PUBLICATIONS

Knaipp, et al. "Investigations on an Isolated Lateral High-Voltage n-channel LDMOS Transistor with a Typical Breakdown of 150V." Proceeding of the 36th European Solid-State Device Research Conference, 2006. ESSDERC 2006. Sep. 2006.
(Continued)

*Primary Examiner* — Michele Fan
(74) *Attorney, Agent, or Firm* — Eschweiler & Potashnik, LLC

(57) ABSTRACT

The present disclosure, in some embodiments, relates to an integrated chip. The integrated chip includes a gate structure disposed over a substrate between a source region and a drain region. A first inter-level dielectric (ILD) layer is disposed over the substrate and the gate structure and a second ILD layer is disposed over the first ILD layer. A field plate etch stop structure is between the first ILD layer and the second ILD layer. A field plate extends from an uppermost surface of the second ILD layer to the field plate etch stop structure. A plurality of conductive contacts extend from the uppermost surface of the second ILD layer to the source region and the drain region.

20 Claims, 41 Drawing Sheets

Related U.S. Application Data which is a division of application No. 15/424,333, filed on Feb. 3, 2017, now Pat. No. 9,954,097, which is a continuation of application No. 14/604,885, filed on Jan. 26, 2015, now Pat. No. 9,590,053.

(60) Provisional application No. 62/084,038, filed on Nov. 25, 2014.

(51) Int. Cl.
   *H01L 23/495* (2006.01)
   *H01L 29/66* (2006.01)
   *H01L 21/761* (2006.01)
   *H01L 29/417* (2006.01)
   *H01L 29/10* (2006.01)

(52) U.S. Cl.
   CPC ...... *H01L 23/49575* (2013.01); *H01L 29/402* (2013.01); *H01L 29/407* (2013.01); *H01L 29/4175* (2013.01); *H01L 29/66659* (2013.01); *H01L 29/66681* (2013.01); *H01L 29/66689* (2013.01); *H01L 29/7835* (2013.01); *H01L 29/1045* (2013.01); *H01L 29/1087* (2013.01)

(56) References Cited

U.S. PATENT DOCUMENTS

| | | |
|---|---|---|
| 5,362,979 A | 11/1994 | Merchant |
| 5,374,843 A | 12/1994 | Williams et al. |
| 5,625,217 A | 4/1997 | Chau et al. |
| 5,831,320 A | 11/1998 | Kwon et al. |
| 6,160,290 A | 12/2000 | Pendharkar et al. |
| 6,465,845 B1 | 10/2002 | Baek |
| 8,173,510 B2 | 5/2012 | Denison et al. |
| 9,590,053 B2 | 3/2017 | Chou et al. |
| 9,871,132 B1 | 1/2018 | Liu et al. |
| 9,954,097 B2 | 4/2018 | Chou et al. |
| 2002/0145172 A1 | 10/2002 | Fujishima et al. |
| 2002/0182810 A1 | 12/2002 | Oh |
| 2005/0020021 A1 | 1/2005 | Fujiwara et al. |
| 2005/0110042 A1 | 5/2005 | Saito et al. |
| 2005/0156234 A1 | 7/2005 | Gammel et al. |
| 2006/0113601 A1 | 6/2006 | Shibib et al. |
| 2006/0113625 A1 | 6/2006 | Bude et al. |
| 2007/0114608 A1 | 5/2007 | Letavic |
| 2007/0152343 A1 | 7/2007 | Richter |
| 2007/0167010 A1 | 7/2007 | Furusawa et al. |
| 2007/0278568 A1 | 12/2007 | Williams et al. |
| 2008/0182394 A1 | 7/2008 | Yang et al. |
| 2008/0283844 A1 | 11/2008 | Shinichi |
| 2009/0146185 A1 | 6/2009 | Suh et al. |
| 2009/0242937 A1 | 10/2009 | Marui |
| 2011/0049526 A1 | 3/2011 | Chu et al. |
| 2012/0228704 A1 | 9/2012 | Ju |
| 2012/0264279 A1 | 10/2012 | Lu |
| 2012/0319182 A1* | 12/2012 | Satoh .................... H01L 29/402 257/288 |
| 2013/0020625 A1 | 1/2013 | Shih |
| 2013/0134512 A1 | 5/2013 | Cheng et al. |
| 2013/0313561 A1 | 11/2013 | Suh |
| 2014/0061659 A1 | 3/2014 | Teplik et al. |
| 2014/0231823 A1 | 8/2014 | Chowdhury et al. |
| 2014/0264556 A1 | 9/2014 | Lai et al. |
| 2014/0361342 A1 | 12/2014 | Sriram et al. |
| 2014/0367778 A1 | 12/2014 | Sharma et al. |
| 2015/0048447 A1 | 2/2015 | Sharma et al. |
| 2015/0179782 A1 | 6/2015 | Yamamura |
| 2015/0380487 A1 | 12/2015 | Yoshida et al. |
| 2016/0149007 A1 | 5/2016 | Chou et al. |
| 2016/0190297 A1 | 6/2016 | Kudymov et al. |
| 2017/0352731 A1 | 12/2017 | Kuo et al. |
| 2018/0151383 A1* | 5/2018 | He .................... H01L 29/42368 |
| 2018/0219093 A1 | 8/2018 | Chou et al. |
| 2019/0097001 A1* | 3/2019 | LaRoche ............. H01L 29/4175 |
| 2019/0288066 A1 | 9/2019 | Lee |
| 2019/0288112 A1* | 9/2019 | Wang .................. H01L 29/7816 |

OTHER PUBLICATIONS

Non-Final Office Action dated May 23, 2016 for U.S. Appl. No. 14/604,885.
Notice of Allowance dated Oct. 25, 2016 for U.S. Appl. No. 14/604,885.
Non-Final Office Action dated Jul. 17, 2017 for U.S. Appl. No. 15/424,333.
Notice of Allowance dated Dec. 20, 2017 for U.S. Appl. No. 15/424,333.
Non-Final Office Action dated Oct. 23, 2018 for U.S. Appl. No. 15/927,281.
Final Office Action dated Apr. 8, 2019 for U.S. Appl. No. 15/927,281.
Non-Final Office Action dated Oct. 7, 2019 in connection with U.S. Appl. No. 15/927,281.
Final Office Action dated Jan. 28, 2020 in connection with U.S. Appl. No. 16/174,626.
Notice of Allowance dated Dec. 18, 2019 in connection with U.S. Appl. No. 15/927,281.

* cited by examiner

CONTACT FIELD PLATE

REFERENCE TO RELATED APPLICATIONS

This Application is a Continuation-in-Part of U.S. application Ser. No. 15/927,281, filed on Mar. 21, 2018, which is a Divisional of U.S. application Ser. No. 15/424,333, filed on Feb. 3, 2017 (now U.S. Pat. No. 9,954,097, issued on Apr. 24, 2018), which is a Continuation of U.S. application Ser. No. 14/604,885, filed on Jan. 26, 2015 (now U.S. Pat. No. 9,590,053, issued on Mar. 7, 2017), which claims priority to U.S. Provisional Application No. 62/084,038, filed on Nov. 25, 2014. The contents of the above-referenced Patent Applications are hereby incorporated by reference in their entirety.

BACKGROUND

Modern day integrated chips comprise millions or billions of semiconductor devices formed on a semiconductor substrate (e.g., silicon). Integrated chips (ICs) may use many different types of transistor devices, depending on an application of an IC. In recent years, the increasing market for cellular and RF (radio frequency) devices has resulted in a significant increase in the use of high voltage transistor devices. For example, high voltage transistor devices are often used in power amplifiers in RF transmission/receiving chains due to their ability to handle high breakdown voltages (e.g., greater than about 50V) and high frequencies.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
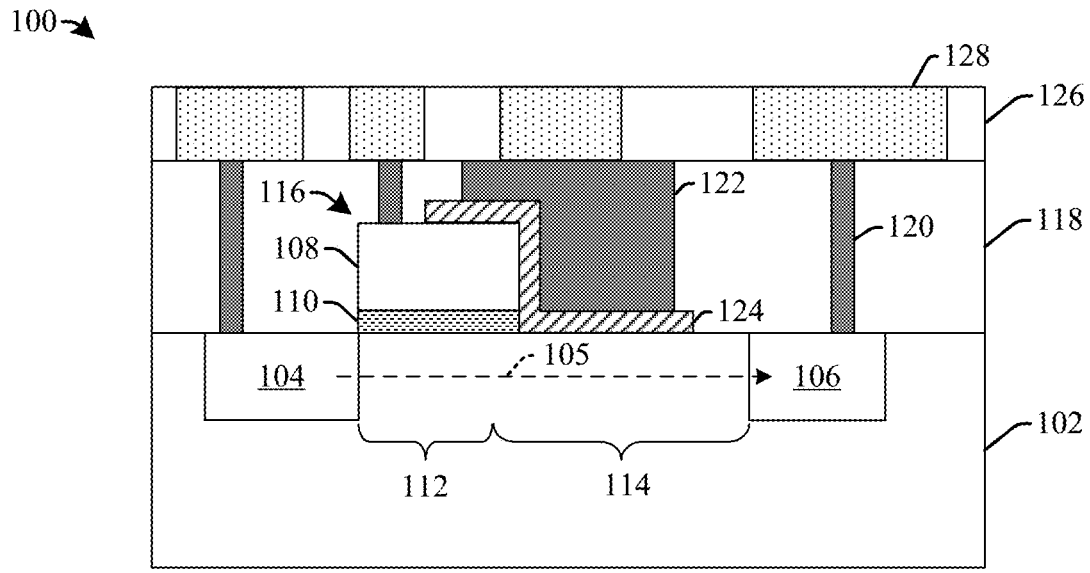
FIG. 1 illustrates a cross-sectional view of some embodiments of a disclosed high voltage transistor device having a field plate.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

High voltage transistor devices are often constructed to have field plates. Field plates are conductive elements, which are placed over a channel region to enhance the performance of a high voltage transistor device by manipulating electric fields (e.g., reducing peak electric fields) generated by a gate electrode. By manipulating the electric field generated by the gate electrode, the high voltage transistor device can achieve higher breakdown voltages. For example, LDMOS (laterally diffused metal oxide semiconductor) transistor devices often comprise field plates that extend from a channel region to an adjacent drift region disposed between the channel region and a drain region.

Field plates can be formed in a number of different ways. For example, field plates may be formed by extending a conductive gate material (e.g., polysilicon) from a gate electrode towards a drift region. However, in such configurations the field plate is synchronized to a gate bias, which burdens the gate-to-drain capacitance ($C_{gd}$) and worsens the switching losses of the device. Alternatively, the conductive gate material can be patterned to form a separate field plate. Such configurations reduce the gate-to-drain capacitance ($C_{gd}$), but placement of the field plates are often restricted by design rules. In yet another alternative, non-gate materials can be used for field plate formation. However, such solutions use additional processing steps that increase the fabrication cost of a resulting integrated chip.

Accordingly, the present disclosure relates to a high voltage transistor device having a field plate made from non-gate materials, which is formed concurrent with a formation of a back-end-of-the-line (BEOL) metal layer to enable a low-cost method of fabrication. In some embodiments, the high voltage transistor device has a gate electrode disposed over a substrate between a source region and a drain region located within the substrate. A dielectric layer laterally extends from over the gate electrode to a drift region arranged between the gate electrode and the drain region. A field plate is located within a first inter-level dielectric (ILD) layer overlying the substrate. The field plate laterally extends from over the gate electrode to over the drift region and vertically extends from the dielectric layer to a top surface of the first ILD layer. A plurality of metal contacts, having a same material as the field plate, vertically extend from a bottom surface of the first ILD layer to a top surface of the first ILD layer.

FIG. 1 illustrates a cross-sectional view of some embodiments of a high voltage transistor device 100 having a field plate 122.

The high voltage transistor device 100 comprises a source region 104 and a drain region 106 disposed within a semiconductor substrate 102. The semiconductor substrate 102 has a first doping type, while the source region 104 and the drain region 106 have a second doping type, with a higher doping concentration than the semiconductor substrate 102. In some embodiments, the first doping type may by an n-type doping and the second doping type may be a p-type doping.

A gate structure 116 is disposed over the semiconductor substrate 102 at a position that is laterally arranged between the source region 104 and the drain region 106. The gate structure 116 comprises gate electrode 108 that is separated from the semiconductor substrate 102 by a gate dielectric layer 110. Upon receiving a bias voltage, the gate electrode 108 is configured to generate an electric field that controls the movement of charge carriers within a channel region 112 laterally disposed between the source region 104 and the drain region 106. For example, during operation, a gate-source voltage ($V_{GS}$) can be selectively applied to the gate electrode 108 relative to the source region 104, forming a conductive channel in the channel region 112. While $V_{GS}$ is applied to form the conductive channel, a drain to source voltage ($V_{DS}$) is applied to move charge carriers (e.g., shown by arrow 105) between the source region 104 and the drain region 106.

The channel region 112 laterally extends from the source region 104 to an adjacent drift region 114 (i.e., a drain extension region). The drift region 114 comprises a second doping type having a relatively low doping concentration, which provides for a higher resistance at high operating voltages. The gate structure 116 is disposed over the channel region 112. In some embodiments, the gate structure 116 may extend from over the channel region 112 to a position overlying a portion of the drift region 114.

A first inter-level dielectric (ILD) layer 118 is disposed over the semiconductor substrate 102. One or more conductive metal structures are disposed within the first ILD layer 118. In some embodiments, the one or more conductive metal structures comprise a plurality of contacts 120 configured to provide for a vertical connection between the source region 104, the drain region 106, or the gate electrode 108 and a first back-end-of-the-line (BEOL) metal wire layer 128 disposed within a second ILD layer 126 overlying the first ILD layer 118.

The one or more conductive metal structures may further comprise a field plate 122 disposed within the first ILD layer 118 at a position overlying portions of the gate electrode 108 and the drift region 114. The field plate 122 comprises a same conductive material as the plurality of contacts 120. The field plate 122 may be disposed over a dielectric layer 124 configured to separate the field plate 122 the drift region 114 and the gate electrode 108. In some embodiments, the dielectric layer 124 laterally extends past the field plate 122 in one or more directions.

During operation, the field plate 122 is configured to act upon the electric field generated by the gate electrode 108. The field plate 122 may be configured to change distribution of the electric field generated by the gate electrode 108 in the drift region 114, which enhances the internal electric field of the drift region 114 and increases the drift doping concentration of the drift region 114, thereby enhancing the breakdown voltage capability of the high voltage transistor device 100.

Figure 2:
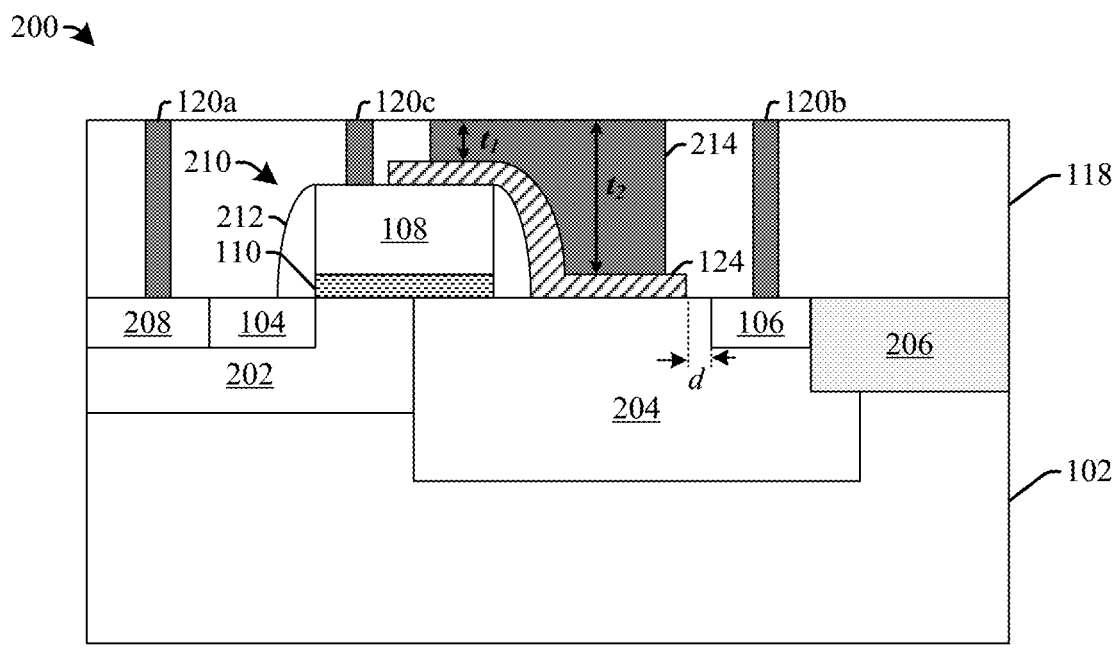
FIGS. 2-4 illustrate cross-sectional views of some additional embodiments of disclosed high voltage laterally diffused MOSFET (LDMOS) devices having a field plate.

FIG. 2 illustrates a cross-sectional view of some additional embodiments of disclosed high voltage transistor device comprising a high voltage laterally diffused MOSFET (LDMOS) device 200 having a field plate 214.

The LDMOS device 200 comprises a source region 104 and a drain region 106 disposed within a semiconductor substrate 102. The semiconductor substrate 102 has a first doping type, while the source region 104 and the drain region 106 comprise highly doped regions having a second doping type different than the first doping type. In some embodiments, the first doping type may be p-type and the second doping type may be n-type. In some embodiments, the source region 104 and the drain region 106 may have doping concentrations that are in a range of between approximately $10^{19}$ cm$^{-3}$ and approximately $10^{20}$ cm$^{-3}$.

A contact region 208 (e.g., a 'p-tap' or an 'n-tap') having the first doping type (e.g., a p+ doping) laterally abuts the source region 104. The contact region 208 provides for an ohmic connection to the semiconductor substrate 102. In some embodiments, the contact region 208 may have a p-type doping concentration that is in a range of between approximately $10^{18}$ cm$^{-3}$ and approximately $10^{20}$ cm$^{-3}$. The contact region 208 and the source region 104 are disposed within a body region 202. The body region 202 has the first doping type with a doping concentration that is higher than that of the semiconductor substrate 102. For example, the semiconductor substrate 102 may have a doping concentration that is in a range of between approximately $10^{14}$ cm$^{-3}$ and approximately $10^{16}$ cm$^{-3}$, while the body region 202 may have a doping concentration that is in a range of between approximately $10^{16}$ cm$^{-3}$ and approximately $10^{18}$ cm$^{-3}$ The drain region 106 is disposed within a drift region 204 that is arranged within the semiconductor substrate 102 at a position laterally abutting the body region 202. The drift region 204 comprises a second doping type having a relatively low doping concentration, which provides for a higher resistance when the LDMOS device 200 is operated at a high voltage. In some embodiments, the drift region 204 may have a doping concentration that is in a range of between approximately $10^{15}$ cm$^{-3}$ and approximately $10^{17}$ cm$^{-3}$.

A gate structure 210 is disposed over the semiconductor substrate 102 at a position that is laterally arranged between the source region 104 and the drain region 106. In some embodiments, the gate structure 210 may laterally extend from over the body region 202 to a position overlying a portion of the drift region 204. The gate structure 210 comprises a gate electrode 108 that is separated from the semiconductor substrate 102 by a gate dielectric layer 110. In some embodiments, the gate dielectric layer 110 may comprise silicon dioxide ($SiO_2$) or a high-k gate dielectric material and the gate electrode 108 may comprise polysilicon or a metal gate material (e.g., aluminum). In some embodiments, the gate structure 210 may also comprise sidewall spacers 212 disposed on opposing sides of the gate electrode 108. In various embodiments, the sidewall spacers 212 may comprise a nitride based sidewall spacer (e.g., comprising SiN) or an oxide-based sidewall spacer (e.g., $SiO_2$, SiOC, etc.).

One or more dielectric layers 124 are disposed over the gate electrode 108 and the drift region 204. In some embodiments, the one or more dielectric layers 124 continuously extend from over a portion of the gate electrode 108 to over a portion of the drift region 204. In some embodiments, the one or more dielectric layers 124 may be conformally disposed onto the drift region 204, the gate electrode 108, and the sidewall spacers 212.

A field plate 214 is disposed over the one or more dielectric layers 124 and is laterally surrounded by a first ILD layer 118. The field plate 214 extends from over the gate electrode 108 to over the drift region 204. The size of the field plate 214 may vary depending on the size and characteristics of the LDMOS device 200. In some embodiments, the field plate 214 may have a size that is between approximately 50 nanometers and approximately 1 um. In other embodiments, the field plate 214 may be larger or smaller. In some embodiments, the first ILD layer 118 may comprise a dielectric material having a relatively low dielectric constant (e.g., less than or equal to approximately 3.9), which provides for electrical isolation between the plurality of contacts 120 and/or the field plate 122. In some embodiments, the first ILD layer 118 may comprise an ultra-low k dielectric material or a low-k dielectric material (e.g., SiCO).

The field plate 214 vertically extends from the dielectric layer 124 to a top surface of the first ILD layer 118. In some embodiments, the field plate 214 may vertically extend to a height that is greater than or equal to a height of top surfaces of the contacts 120 and the first ILD layer 118. The field plate 122 has a non-flat surface abutting the one or more dielectric layers 124. The non-flat surface causes the field plate 122 to have a first thickness $t_1$ in a region over the gate electrode 108 and a second thickness $t_2$, larger than the first thickness $t_1$, in a region overlying the drift region 204.

A plurality of contacts 120 are also surrounded by the first ILD layer 118. The plurality of contacts 120 may comprise a first contact 120a coupled to the contact region 208, a second contact 120b coupled to the drain region 106, and a third contact 120c coupled to the gate electrode 108. In some embodiments, the first contact 120a may comprise a butted contact (not shown), which contacts both the contact region 208 and the source region 104. In some embodiments, the plurality of contacts 120 and the field plate 122 may comprise a same metal material. For example, the plurality of contacts 120 and the field plate 122 may comprise one or more of tungsten (W), tantalum-nitride (TaN), titanium (Ti), titanium-nitride (TiN), aluminum copper (AlCu), copper (Cu), and/or other similar conductive materials.

Figure 3:
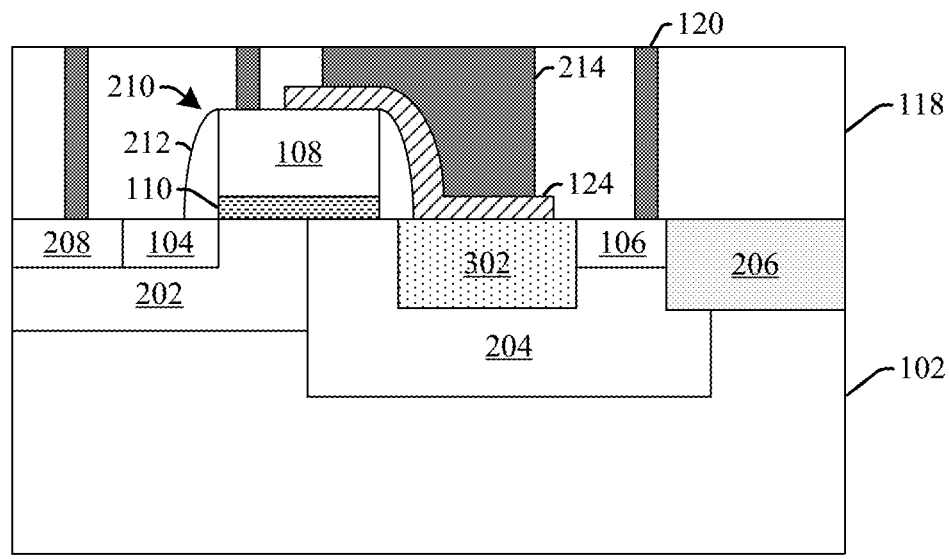

FIG. 3 illustrates a cross-sectional view of some additional embodiments of a disclosed high voltage LDMOS device 300 having a field plate 214.

LDMOS device 300 comprises an isolation region 302 disposed within the drift region 204 at a position that is laterally arranged between the gate structure 210 and the drain region 106. The isolation region 302 improves isolation between the gate structure 210 and the drain region 106, so as to prevent dielectric breakdown between the gate structure 210 and the drift region 204 when the LDMOS device 300 is operated at large operating voltages. For example, the isolation region 302 region may be introduced into the drift region 204 of an LDMOS device, which is designed to operate at a first breakdown voltage, to increase the breakdown voltage of the LDMOS device 300 without significantly changing the fabrication process the LDMOS device. In some embodiments, the isolation region 302 may comprise a shallow trench isolation (STI). In other embodiments, the isolation region 302 may comprise a field oxide.

Figure 4:
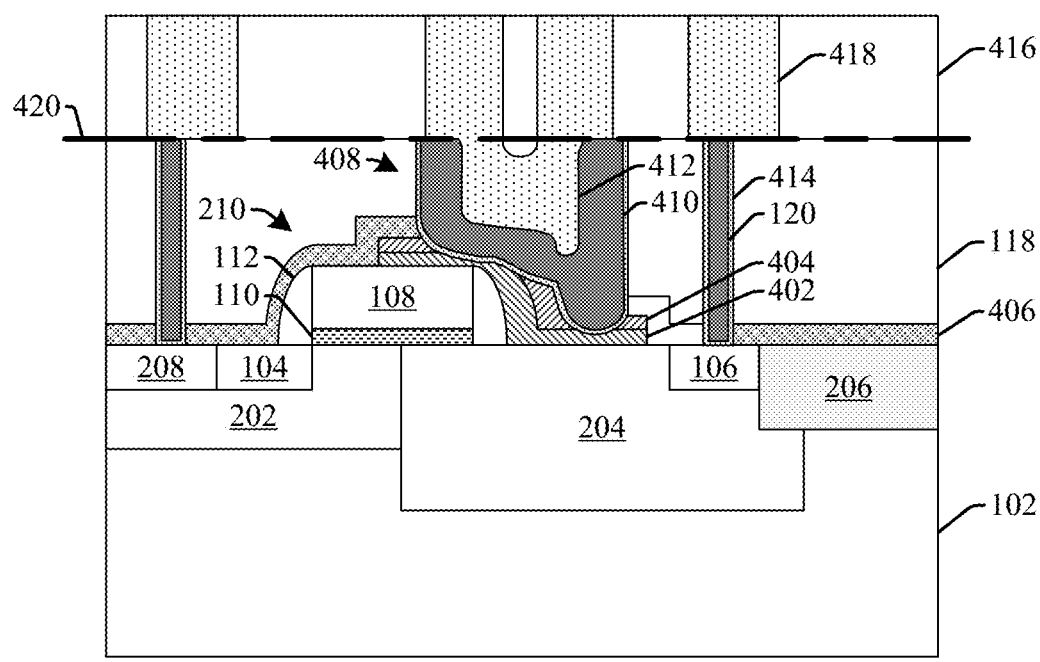

FIG. 4 illustrates a cross-sectional view of some additional embodiments of disclosed high voltage LDMOS device 400 having a field plate 408.

LDMOS device 400 comprises a plurality of dielectric layers 402-404 arranged between the field plate 122 and the gate structure 210 and/or the drift region 204. The plurality of dielectric layers 402-404 are configured to electrically isolate a field plate 408 from the gate structure 210 and/or the drift region 204. In embodiments, the plurality of dielectric layers 402-404 may comprise two or more different dielectric materials. In some embodiments, the plurality of dielectric layers 402-404 may comprise one or more dielectric layers that are used during a typical CMOS fabrication process, so as to limit additional fabrication steps used to electrically isolate the field plate 408 from the gate structure 210 and/or the drift region 204.

For example, the plurality of dielectric layers 402-404 may comprise a silicide blocking layer 402. In some embodiments, the silicide blocking layer 402 may comprise a resist-protection oxide (RPO) layer configured to prevent silicide formation. The silicide blocking layer 402 may be arranged over portions of the gate electrode 108 and the drift region 204. In some embodiments, the silicide blocking layer 402 may continuously extend from over the gate electrode 108 to over the drift region 204.

In some embodiments, the plurality of dielectric layers 402-404 may further comprise a field plate etch stop layer (ESL) 404. The field plate ESL 404 may be disposed over the silicide blocking layer 402 and is configured to control etching of an opening for the field plate 408. The field plate ESL 404 may account for differences in the etch depth between the contacts 120 and the field plate 408 and/or for differences in etching rate (e.g., due to the etch loading effect). In some embodiments, the field plate ESL 404 may comprise a silicon nitride (SiN) layer, for example.

In some alternative embodiments (not shown), the plurality of dielectric layers 402-404 may additionally or alternatively comprise a gate dielectric layer. In such embodiments, the gate dielectric layer may be arranged laterally adjacent to the gate structure 210 at a position that overlies the drift region 204. In some embodiments, the dielectric layer oxide may comprise silicon dioxide (e.g., $SiO_2$) or a high-k gate dielectric material. In yet other embodiments, the plurality of dielectric layers 402-404 may additionally or alternatively comprise an ILD layer (e.g., first ILD layer 118).

A contact etch stop layer (CESL) 406 is disposed over the semiconductor substrate 102 and the field plate ESL 404. In some embodiments, the CESL 406 extends over the semiconductor substrate 102 at positions between the plurality of contacts 120 and the field plate 408, so that the CESL 406 abuts sidewalls of the plurality of contacts 120 and the field plate 408. The CESL 406 overlies the gate structure 210. In some embodiments, the CESL 406 may also overlie the plurality of dielectric layers 402-404. In other embodiments, one or more of the plurality of dielectric layers 402-404 (e.g., the field plate ESL 404) may overlie the CESL 406. In some embodiments, the CESL 406 may comprise a nitride layer. For example, the CESL 406 may comprise silicon nitride (SiN).

A field plate 408 is disposed within first ILD layer 118 and abuts the CESL 406 and one or more of the plurality of dielectric layers 402-404. In some embodiments, the field plate 408 extends though the CESL 406 to abut one or more of the plurality of dielectric layers 402-404. In such embodiments, one or more of the plurality of dielectric layers 402-404 separate the field plate 408 from the gate structure 210 and the drift region 204.

In some embodiments, the field plate 408 may comprise a first metal material 410 and a second metal material 412. The first metal material 410 may comprise a glue layer that is disposed along outer edges of the field plate 408, while the second metal material 412 is embedded within the first metal material 410 in an inner region of the field plate 408 (i.e., the second metal material 412 is separated from the CESL 406 by way of the first metal material 410). In some embodiments, a liner layer 414 may be disposed between the first ILD layer 118 and the first metal material 410.

In some embodiments, the first metal material 410 disposed along outer edges of the field plate 408 has a top surface that is arranged along a substantially planar surface 420 (i.e., a planar surface formed by a planarization process). The planar surface 420 may be aligned with top surfaces of the plurality of contacts 120. In some embodiments, the first metal material 410 comprises a same material as the plurality of contacts 120 and the second metal material 412 comprises a same material as a first metal wire layer 418 overlying the plurality of contacts 120. For example, in some embodiments, the first metal material 410 may comprise tungsten (W), titanium (Ti), tantalum nitride (TaN) or titanium nitride (TiN). In some embodiments, the second metal material 412 may comprise copper (Cu) or aluminum copper (AlCu).

It will be appreciated that due to its integration with the BEOL (back-end-of-the-line) metallization layers, the disclosed field plate allows for various field plate bias configurations to be easily achieved for different design considerations. For example, the field plate biasing can be changed by changing a metal routing layer rather than by changing a design of a disclosed high voltage device. Furthermore, it will be appreciated that biasing the high voltage transistor device by way of BEOL metal interconnect routing allows for a variety of field plate bias configurations to be integrated on a same chip using a single fabrication process flow.

Figure 5:
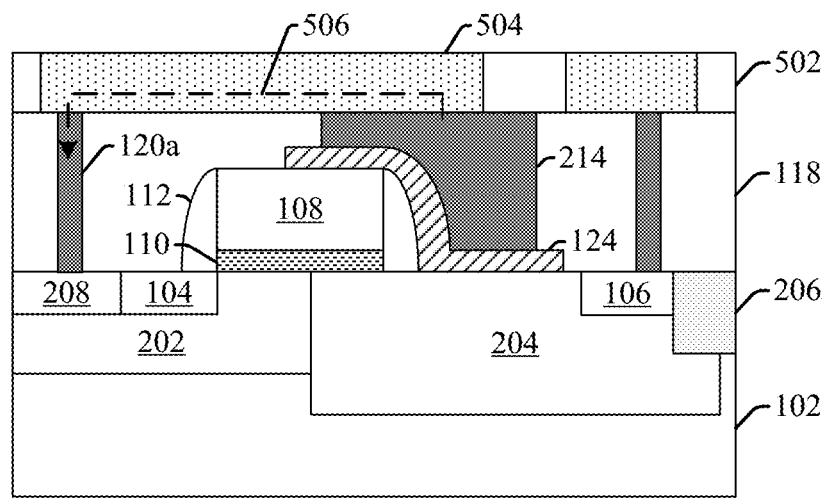
FIGS. 5-6 illustrate cross-sectional views of some embodiments of field plate biasing configurations for a high voltage LDMOS device achieved by metal interconnect routing.
Figure 6:
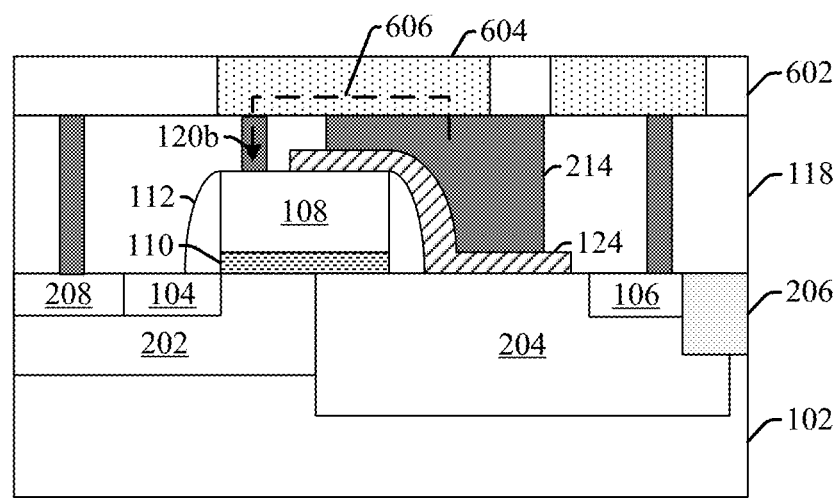

FIGS. 5-6 illustrate cross-sectional views of some embodiments of field plate biasing configurations for a high voltage transistor device achieved by BEOL metal interconnect routing. Although FIGS. 5-6 illustrate a connection between the field plate 214 and the contact region 208 or gate electrode 108 by way of a first metal wire layer (e.g., 504 or 604), the BEOL metal interconnect routing is not limited thereto. Rather, it will be appreciated that the field plate 214 can be connected to a source region, a gate electrode, a drain region, or a bulk contact by any combination of BEOL metal interconnect layers (e.g., a first metal wire layer, a first metal via layer, a second metal wire layer, etc.).

FIG. 5 illustrates a cross-sectional view of a high voltage LDMOS device 500 in which the field plate 214 is electrically coupled to the contact region 208 along conduction path 506. The field plate 214 is connected to a first metal wire layer 504 disposed within a second ILD layer 502. The first metal wire layer 504 is coupled to a first contact 120a that abuts the contact region 208. By electrically coupling the field plate 214 to the contact region 208, the field plate 214 is biased by the source voltage. Biasing the field plate 214 by the source voltage provides high voltage LDMOS device 500 with a low on-state resistance Rds(on) and low dynamic power dissipation (e.g., low Rds(on)*Qgd vs. BV). The low dynamic power dissipation provides for good performance during high frequency switching applications.

FIG. 6 illustrates a cross-sectional view of a high voltage LDMOS device 600 in which the field plate 214 is electrically coupled to the gate electrode 108 along conduction path 606. The field plate 214 is connected to a first metal wire layer 604 disposed within a second ILD layer 602. The first metal wire layer 604 is connected to a second contact 120b that abuts the gate electrode 108. By electrically coupling the field plate 214 to the gate electrode 108, the field plate 214 is biased by the gate voltage. Biasing the field plate 214 by the gate voltage provides high voltage LDMOS device 600 with a low Rds(on) vs. breakdown voltage.

The variety of field plate bias configurations allow for the disclosed field plate to form a versatile high voltage transistor device that can be used for different applications. For example, the on-state resistance Rds(on) of a high voltage transistor device having a gate bias field plate is lower than the Rds(on) of a high voltage transistor device having a source biased field plate. However, the Rds(on))*Qgd of a high voltage transistor device having a source bias field plate is lower than the Rds(on))*Qgd of a high voltage transistor device having a gate source biased field plate. Therefore, a high voltage transistor device having a gate bias field plate (e.g., high voltage LDMOS device 500) may be used in low frequency switching applications (e.g., below 10 MHz), while a high voltage transistor device having a source bias field plate (e.g., high voltage LDMOS device 600) may be used in high frequency switching applications (e.g., above 10 MHz).

Figure 7A:
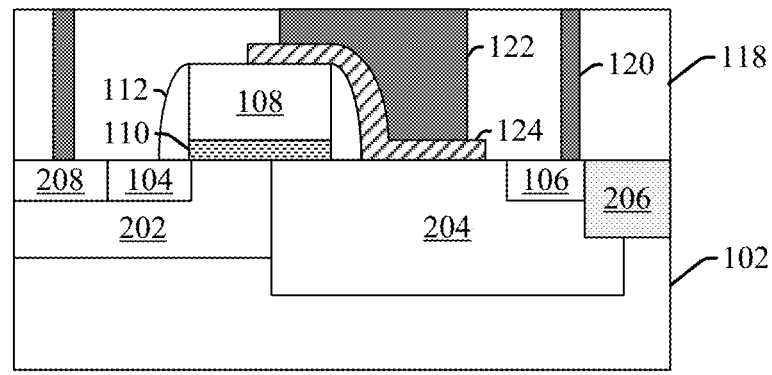
FIGS. 7A-7C illustrate cross-sectional views of some embodiments of high voltage LDMOS devices in different switching isolation configurations.
Figure 7B:
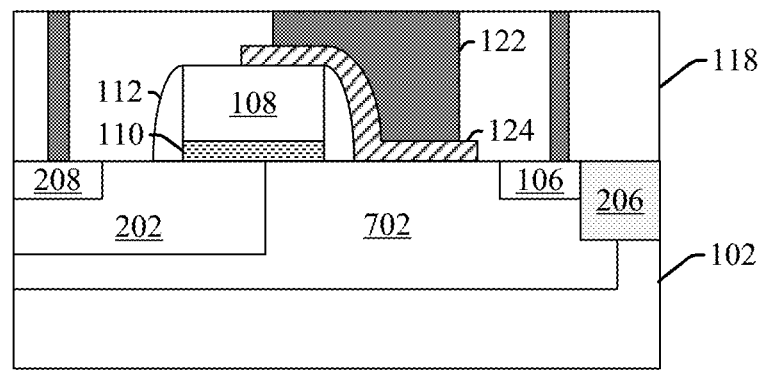
Figure 7C:
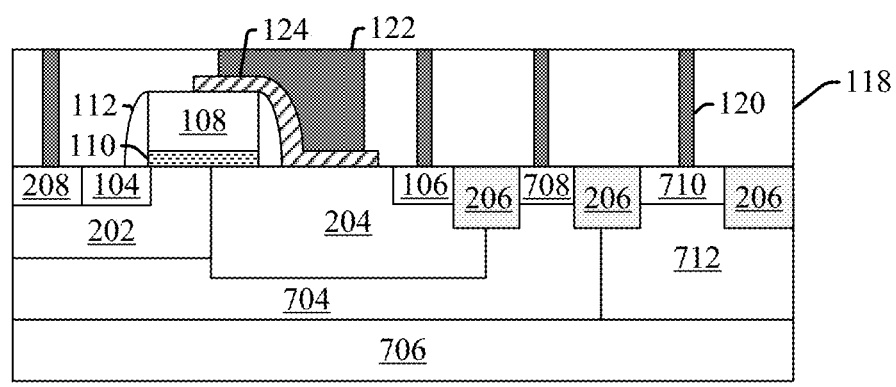

FIGS. 7A-7C illustrate cross-sectional views of some embodiments of high voltage LDMOS devices 700a-700c in different switching isolation configurations.

As shown in FIG. 700a, high voltage LDMOS device 700a is configured as a low-side switch (e.g., a switch connected to ground in an inverter). In such a configuration, the high voltage LDMOS device 700a has a source region 104 that is floating so that the voltage on the source region 104 can change during switching cycles.

As shown in FIG. 700b, high voltage LDMOS device 700b is configured as a high-side switch (e.g., a switch connected to $V_{DD}$ in an inverter). In such a configuration, the high voltage LDMOS device 700b has a source region 104 that is connected to a source voltage. The high voltage LDMOS device 700b has a drift region 702 that extends below the body region 202 to prevent the source voltage from being raised over the substrate voltage by preventing charge carriers from traveling from the contact region 208 to the semiconductor substrate 102 (e.g., by way of punch through).

As shown in FIG. 700c, high voltage LDMOS device 700c is fully isolated from the substrate to allow for independent biasing. The high voltage transistor device 700c comprises a deep well 704 and an oppositely doped underlying buried layer 706 configured to provide for vertical isolation. In some embodiments, the deep well 704 may have the first doping type (e.g., a same doping type as the body region 202) and the buried layer 706 may the second doping type.

The high voltage LDMOS device 700c further comprises one or more additional STI regions 206 that laterally separate the drain region from a bulk region 708 and a buried layer 710 having the second doping type. The bulk region 708 overlies the deep well 704 and the buried layer 710 overlies a well region 712 having second first doping type and abutting the buried layer 706. Contacts 120 are configured to provide for biasing voltages to the bulk region 708 and the buried layer 710, so as to form junction isolation between the deep well 704 and the buried layer 706 and the well region 712. The junction isolation allows the fully isolated, high voltage LDMOS device 700c to operate over a range of bias voltages.

Figure 8:
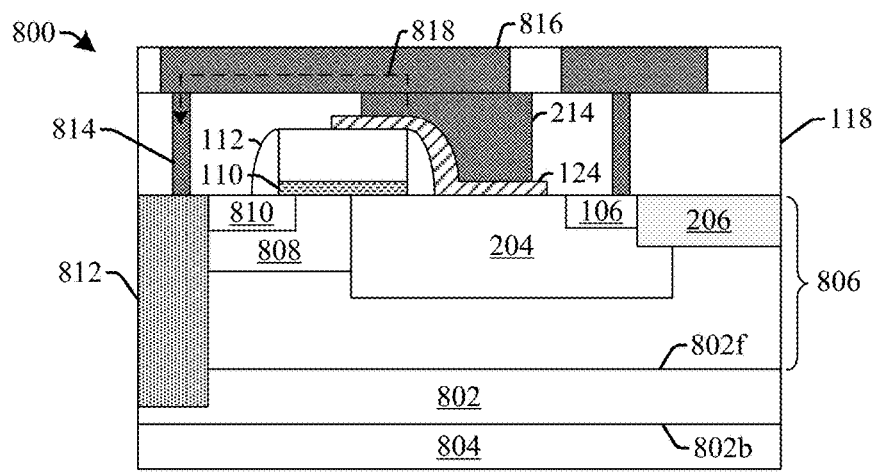
FIG. 8 illustrates a cross-sectional view of a source downward high voltage transistor device having a field plate.

FIG. 8 illustrates a cross-sectional view of a source downward high voltage transistor device 800 having a field plate 214.

The high voltage transistor device 800 comprises substrate 802 having a first doping type (e.g., a p+ doping type) with a high doping concentration. A source region 804 disposed along a backside 802b of a substrate 802. In various embodiments, the source region 804 may comprise a highly doped region or a metal layer. An epitaxial layer 806 having the first conductivity type is disposed over a front side surface 802f of the substrate 802. The dopant concentration of the epitaxial layer 806 is less than the dopant concentration of the substrate 802. A source contact region 810, a drain region 106, a body region 808, and a drift region 204 are disposed within a top surface of the epitaxial layer 806.

A conductive material 812 extends from the top surface of the epitaxial layer 806 to the substrate 802. The conductive material 812 may comprise a highly doped deep well region. The conductive material 812 allows for a source connection to be made from the backside of the substrate 802, thereby reducing metal routing complexity and enabling various packaging compatibility. In some embodiments, the field plate 214 may be biased by the source voltage, by way of an electrical path 818 extending through a contact 814 abutting the conductive material 812 and an overlying metal wire layer 816 coupled to the field plate 214.

Figures 9A, 9B:
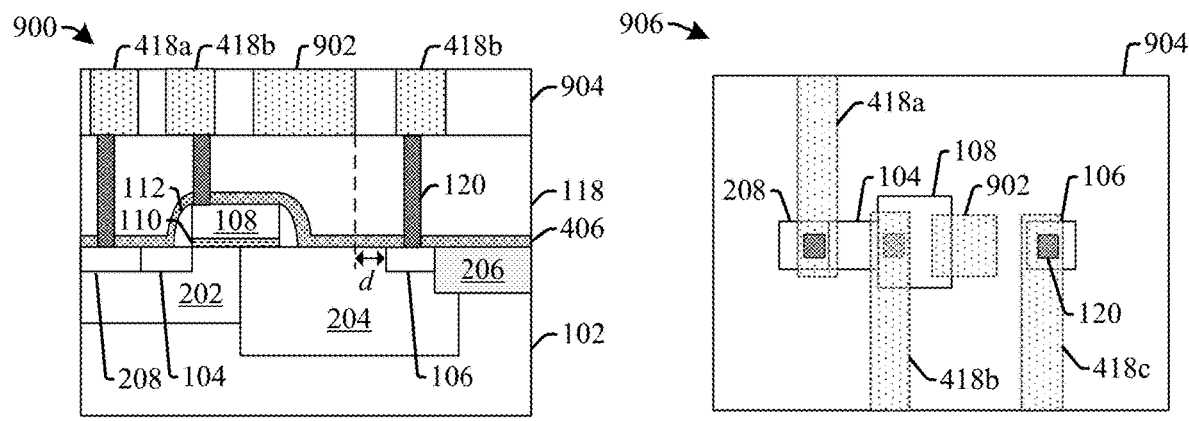
FIGS. 9A-9B illustrate some embodiments of a disclosed high voltage LDMOS having a field plate on a metal wire layer.

FIGS. 9A-9B illustrate some embodiments of a disclosed high voltage LDMOS device having a field plate 902 in a metal wire layer. Although FIGS. 9A-9B illustrate the field plate as being on a first metal wire layer, it will be appreciated that the disclosed field plate is not limited to a first metal wire layer, but rather may be implemented on alternative layers of a BEOL metallization stack.

As shown in cross-sectional view 900, of FIG. 9A, the field plate 902 is disposed in a first metal wire layer within a second ILD layer 904 overlying a first ILD layer 118. In some embodiments, the field plate 902 has substantially planar top and bottom surfaces so as to give the field plate 902 a planar topology. The field plate 902 is vertically separated from the gate structure 210 and the drift region 204 by way of the first ILD layer 118. The field plate 902 overlies portions of the gate electrode 108 and the drift region 204 and is laterally separated from the source region 104 and the drain region 106. For example, the field plate 902 may be laterally separated from the drain region 106 by a distance d. In some embodiments, the field plate 902 may laterally extend from over the gate electrode 108 to over the drift region 204.

As shown in top view 906, of FIG. 9B, the field plate 902 comprises a metal structure overlying portions of the gate electrode 108 and the drift region 204. The metal structure is not connected to an underlying element by way of a contact 120 or to another metal structure on the first metal wire layer. Rather, the metal structure will be connected to an overlying via (not shown) configured to connect the field plate to an overlying metal wire layer that enables the field plate 902 to be biased.

Figure 10:
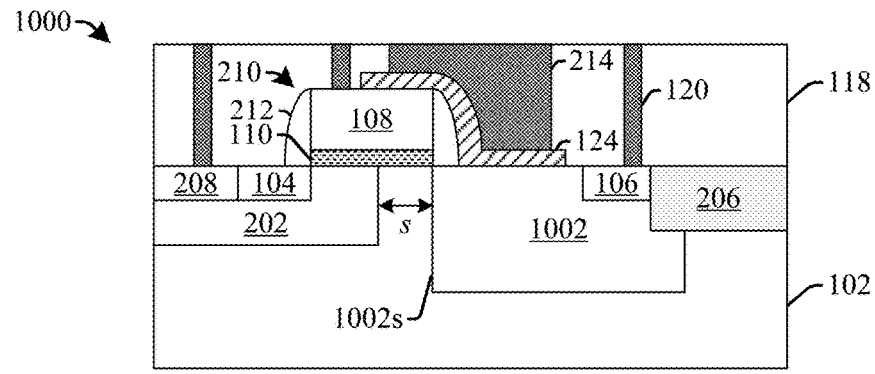
FIG. 10 illustrates some embodiments of a high voltage LDMOS device having a self-aligned drift region.

FIG. 10 illustrates some embodiments of a disclosed high voltage LDMOS device 1000 having a self-aligned drift region 1002.

The self-aligned drift region 1002 has a sidewall 1002s that is substantially aligned with a sidewall of the gate electrode 108 and the gate dielectric layer 110. In some alternative embodiments, the self-aligned drift region 1002 may be formed to have a sidewall 1002s that is substantially aligned with an edge of a sidewall spacer 212. By aligning the self-aligned drift region 1002 with a sidewall of the gate electrode 108 and the gate dielectric layer 110, the self-aligned drift region 1002 is laterally separated from the body region 202 by a spacing s, thereby minimizing gate-to-drain overlap and achieving low gate-drain charge (Qgd) and good high frequency performance. The field plate 214 overlying the self-aligned drift region 1002 can further reduce the gate-drain charge (Qgd).

Figure 11:
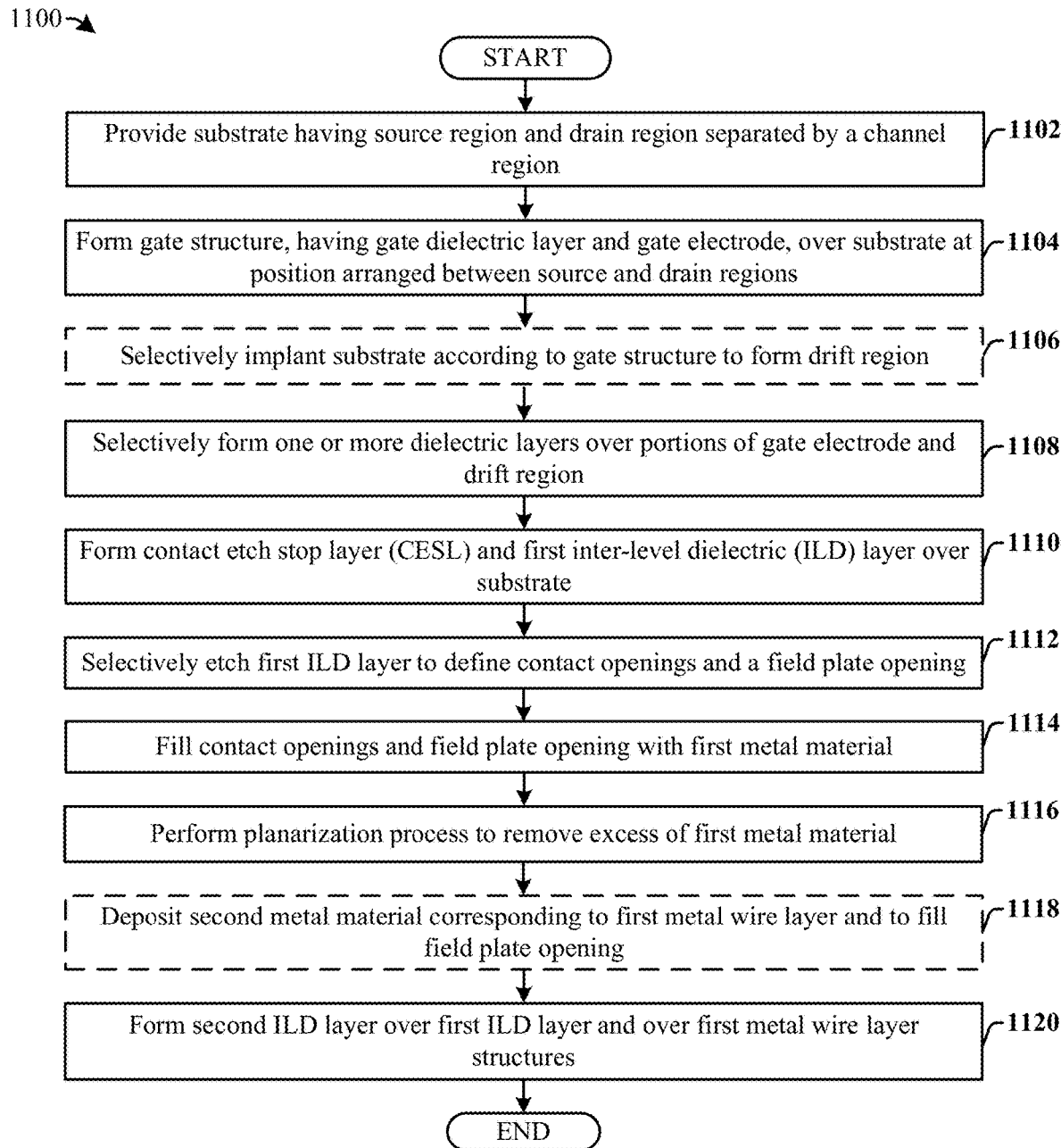
FIG. 11 illustrates a flow diagram of some embodiments of a method of forming a high voltage transistor device having a field plate.

FIG. 11 illustrates a flow diagram of some embodiments of a method 1100 of forming a high voltage transistor device having a field plate. The method may form the field plate using process steps that are already used during a standard CMOS fabrication process, and therefore can provide for a low cost, versatile field plate.

While the disclosed methods (e.g., methods 1100, 3300, and 7900) are illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 1102, a substrate is provided having a source region and a drain region separated by a channel region. In some embodiments, the substrate may further comprise a drift region located between the source region and the drain region at a position adjacent to the channel region and.

At 1104, a gate structure is formed over the substrate at a position arranged between the source region and the drain region. The gate structure may comprise a gate dielectric layer and an overlying gate electrode.

At 1106, the drift region may be formed using a self aligned process, which selectively implants the semiconductor substrate according to the gate structure to form a drift region, in some embodiments.

At 1108, one or more dielectric layers are selectively formed over a portion of the gate electrode and the drift region.

At 1110, a contact etch stop layer (CESL) and a first inter-level dielectric (ILD) layer are formed over the substrate.

At 1112, the first ILD layer is selectively etched to define contacts openings and a field plate opening.

At 1114, the contact openings and the field plate opening is filled with a first metal material.

At 1116, a planarization process may be performed to remove excess of the first metal material overlying the first ILD layer.

At 1118, a second metal material corresponding to a first metal wire layer is deposited. In some embodiments, the second metal material may further fill the field plate opening. In such embodiments, the second metal material is embedded within the first metal material within the field plate opening.

At 1120, a second inter-level dielectric (ILD) layer is formed over the first ILD layer and over first metal wire layer structures.

FIGS. 12-19 illustrate cross-sectional views of some embodiments showing a method of forming a MOSFET device having a field plate. Although FIGS. 12-19 are described in relation to method 1100, it will be appreciated that the structures disclosed in FIGS. 12-19 are not limited to such a method, but instead may stand alone as structures independent of the method.

Figure 12:
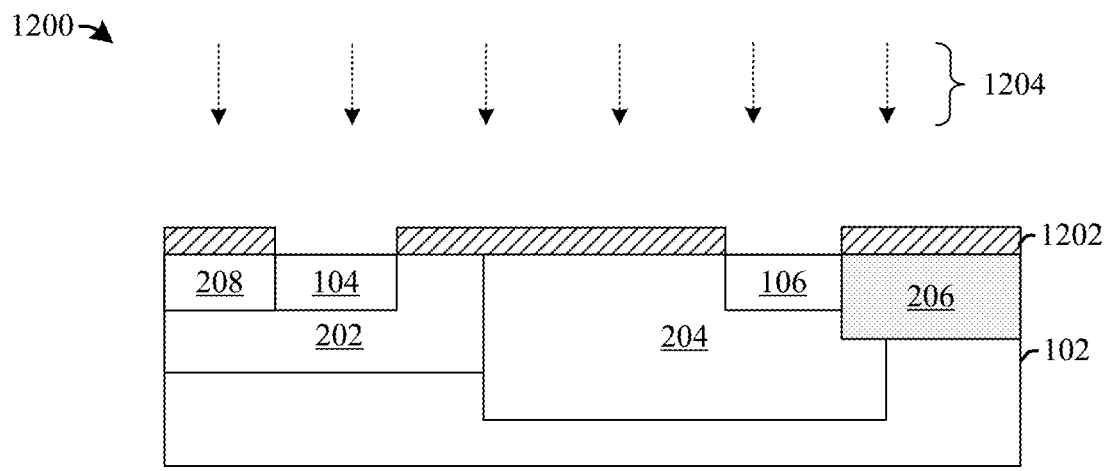
FIGS. 12-19 illustrate cross-sectional views of some embodiments showing a method of forming a high voltage transistor device having a field plate.

FIG. 12 illustrates some embodiments of a cross-sectional view 1200 corresponding to act 1102.

As shown in cross-sectional view 1200, a semiconductor substrate 102 is provided. The semiconductor substrate 102 may be intrinsically doped with a first doping type. In various embodiments, the semiconductor substrate 102 may comprise any type of semiconductor body (e.g., silicon, SOI), which includes, but is not limited to a semiconductor die or wafer or one or more die on a wafer, as well as any other type of semiconductor and/or epitaxial layers formed thereon and/or otherwise associated therewith.

The semiconductor substrate 102 may be selectively implanted using various implantation steps to form a plurality of implantation regions (e.g., well regions, contact regions, etc.). For example, the semiconductor substrate 102 may be selectively implanted to form a body region 202, a drift region 204, a source region 104, a drain region 106, and a contact region 208. The plurality of implantation regions may be formed by selectively masking the semiconductor substrate 102 (e.g., using a photoresist mask) and then introducing high-energy dopants 1204 (e.g., p-type dopant species such as boron or n-type dopants such as phosphorous) into exposed areas of the semiconductor substrate 102. For example, as shown in cross-sectional view 1200, a masking layer 1202 is selectively patterned to expose portions of the semiconductor substrate 102, into which high-energy dopants 1204 are subsequently implanted to form source region 104 and drain region 106.

It will be appreciated that the implantation regions shown in cross-sectional view 1200 are one example of possible implantation regions and that the semiconductor substrate 102 may comprise other configurations of implantation regions, such as any of those illustrated in FIGS. 1-10, for example.

Figure 13:
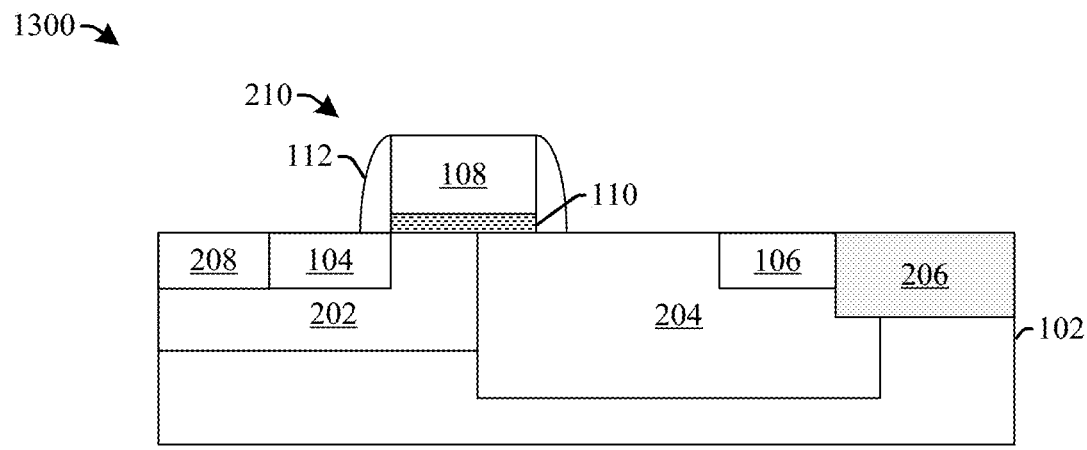

FIG. 13 illustrates some embodiments of a cross-sectional view 1300 corresponding to act 1104.

As shown in cross-sectional view 1300, a gate structure 210 is formed over a semiconductor substrate 102 at a position arranged between the source region 104 and the drain region 106. The gate structure 210 may be formed by forming a gate dielectric layer 110 over the semiconductor substrate 102, and by forming a gate electrode material 108 over the gate dielectric layer 110. In some embodiments, the gate dielectric layer 110 and the gate electrode material 108 may be deposited by a vapor deposition technique. The gate dielectric layer 110 and the gate electrode material 108 may be subsequently patterned and etched (e.g., according to a photoresist mask) to define the gate structure 210. In some embodiments, the sidewall spacers 212 may be formed on opposing sides of the gate electrode 108 by depositing a nitride or oxide based material onto the semiconductor substrate 102, and selectively etching the nitride or oxide based material to form the sidewall spacers 212.

Figure 14:
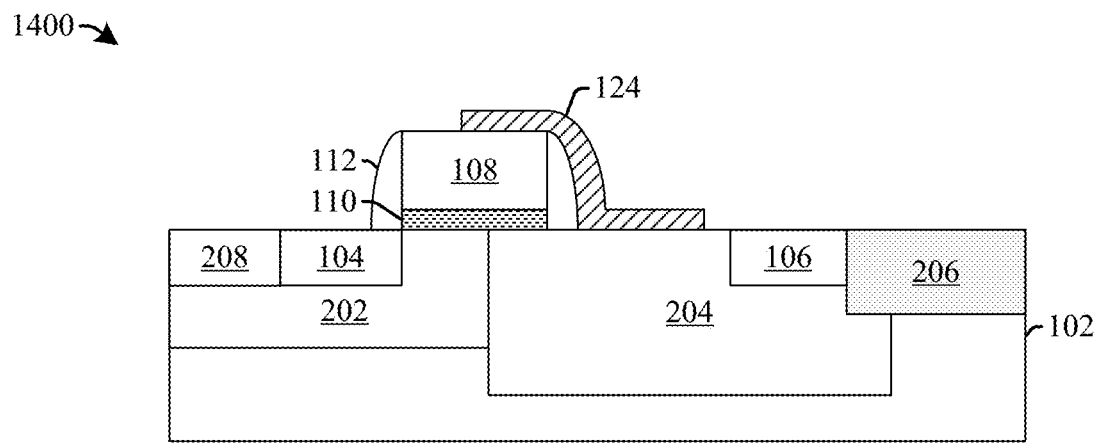

FIG. 14 illustrates some embodiments of a cross-sectional view 1400 corresponding to act 1108.

As shown in cross-sectional view 1400, one or more dielectric layers 124 are selectively formed over the gate electrode 108 and the drift region 204. In some embodiments, the one or more dielectric layers 124 may be deposited by a vapor deposition technique, and subsequently patterned and etched (e.g., according to a photoresist mask). In some embodiments, the one or more dielectric layers 124 may be etched to expose a portion of the gate electrode 108 and to be laterally spaced apart from the drain region 106.

In some embodiments, the one or more dielectric layers 124 may comprise a silicide blocking layer, such as a resist-protection oxide (RPO) layer. In other embodiments, the one or more dielectric layers 124 may further and/or alternatively comprise a field plate etch stop layer (ESL). In some embodiments, the field plate ESL may be a silicon nitride (SiN) layer formed by a vapor deposition technique. In yet other embodiments, the one or more dielectric layers 124 may further and/or alternatively comprise a gate dielectric layer or an inter-level dielectric (ILD) layer.

Figure 15:
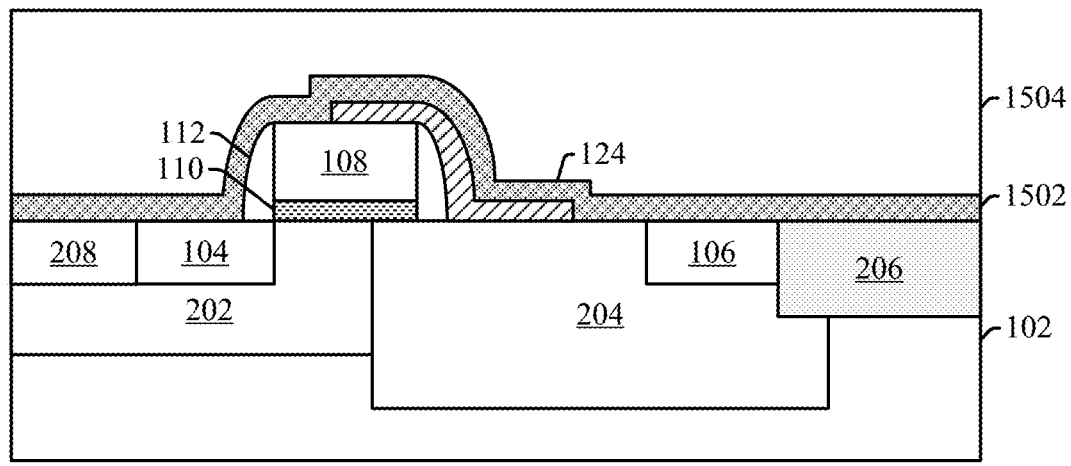

FIG. 15 illustrates some embodiments of a cross-sectional view 1500 corresponding to act 1110.

As shown in cross-sectional view 1500, a contact etch stop layer (CESL) 1502 is formed over the semiconductor substrate 102. In some embodiments, the CESL 1502 may be formed by a vapor deposition process. A first inter-level dielectric (ILD) layer 1504 is then formed over the CESL 1502. In some embodiments, the first ILD layer 1504 may comprise an ultra-low k dielectric material or a low-k dielectric material (e.g., SiCO). In some embodiments, the first ILD layer 1504 may also be formed by a vapor deposition process. In other embodiments, the first ILD layer 1504 may be formed by a spin coating process. It will be appreciated that the term inter-level dielectric (ILD) layer as used herein may also refer to inter-metal dielectric (IMD) layers.

Figure 16:
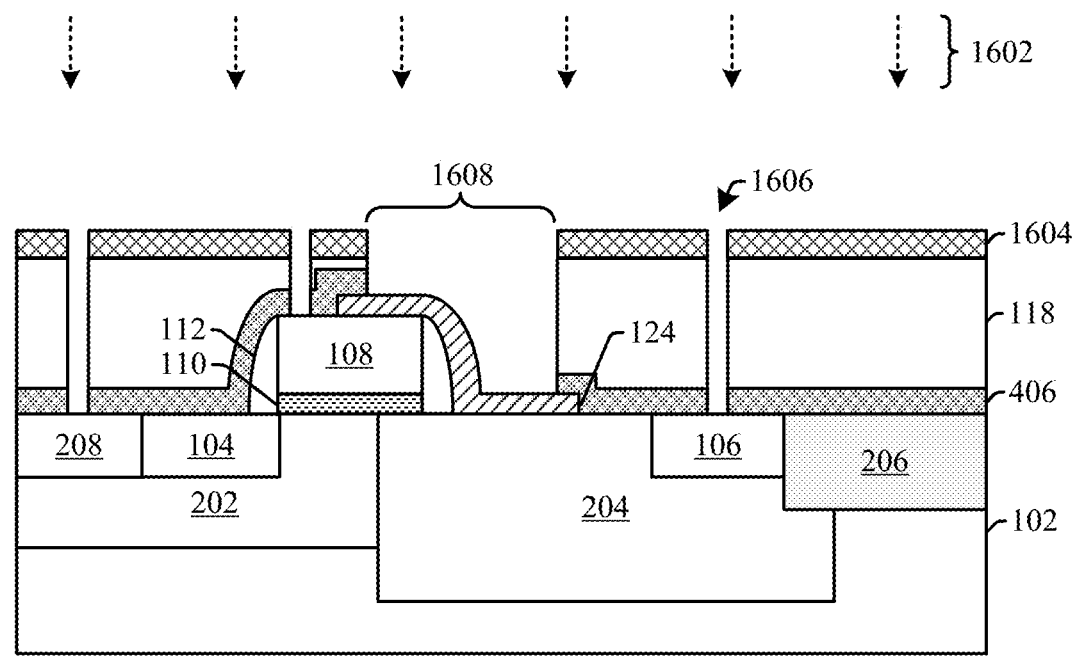

FIG. 16 illustrates some embodiments of a cross-sectional view 1600 corresponding to act 1112.

As shown in cross-sectional view 1600, the first ILD layer 1504 is selectively exposed to a first etchant 1602 configured to form contacts openings 1606 and a field plate opening 1608. In some embodiments, the contact openings 1606 may be smaller than the field plate opening 1608. In some embodiments, the first ILD layer 1504 is selectively exposed to the first etchant 1602 according to a masking layer 1604 (e.g., a photoresist layer or a hard mask layer). In some embodiments, the first etchant 1602 may have a large etching selectivity between the first ILD layer 1504 and a field plate ESL within the one or more dielectric layers 124. In some embodiments, the first etchant 1602 may comprise a dry etchant. In some embodiments, the dry etchant may have an etching chemistry comprising one or more of oxygen (O2), nitrogen (N2), hydrogen (H2), argon (Ar), and/or a fluorine species (e.g., $CF_4$, $CHF_3$, $C_4F_8$, etc.). In other embodiments, the first etchant 1602 may comprise a wet etchant comprising a buffered hydroflouric acid (BHF).

Figure 17:
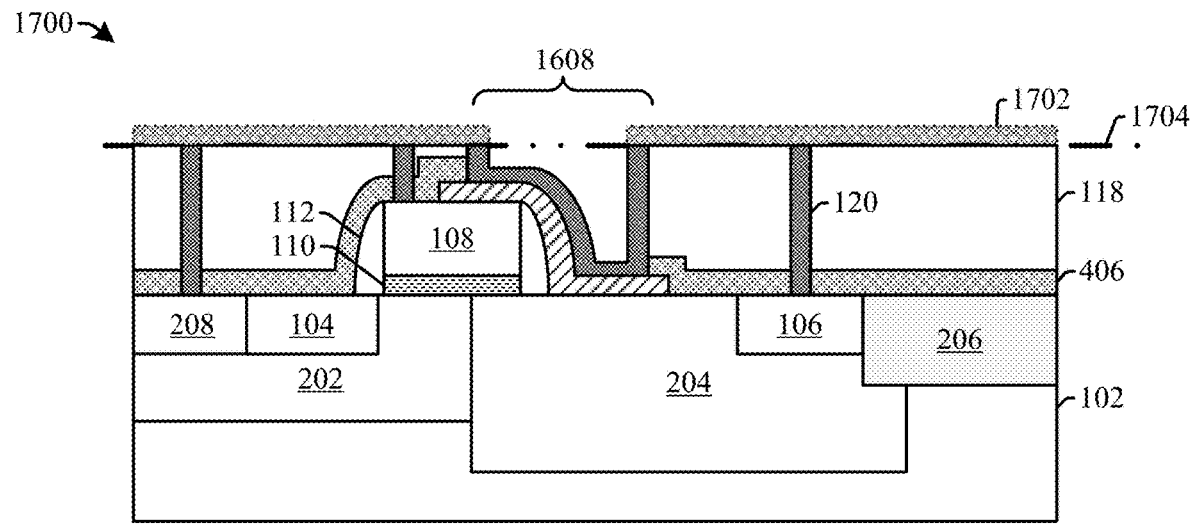

FIG. 17 illustrates some embodiments of a cross-sectional view 1700 corresponding to acts 1114-1116.

As shown in cross-sectional view 1700, the contact openings 1606 and the field plate opening 1608 are filled with a first metal material 1702. In some embodiments, the first metal material 1702 may be deposited by way of a vapor deposition technique (e.g., CVD, PVD, PE-CVD, etc.). In some embodiments, the first metal material 1702 may be formed by depositing a seed layer by way of physical vapor deposition, followed by a plating process (e.g., an electro-plating or electro-less plating process). A planarization process (e.g., chemical mechanical planarization) may be subsequently performed to remove excess of the first metal material 1702 and to form a planar surface along line 1704.

In some embodiments, the first metal material 1702 may comprise tungsten (W), titanium (Ti), titanium nitride (TiN), or tantalum nitride (TaN). In some embodiments, a diffusion barrier layer and/or a liner layer may be deposited into the contact openings 1606 and the field plate opening 1608 prior to depositing the first metal material 1702.

Figure 18:
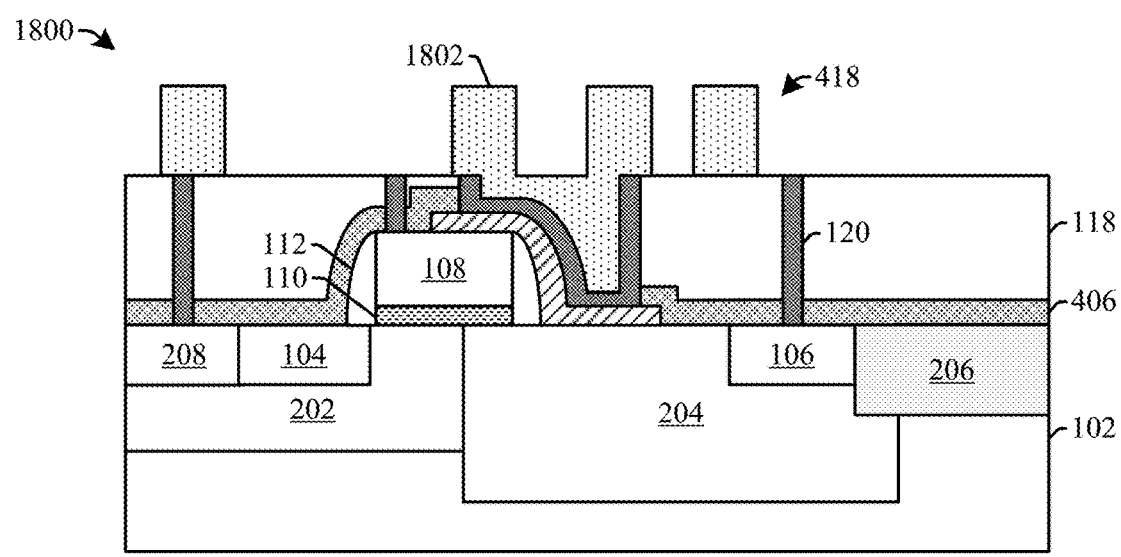

FIG. 18 illustrates some embodiments of a cross-sectional view 1800 corresponding to act 1118.

As shown in cross-sectional view 1800, a second metal material 1802 is deposited. The second metal material 1802 is formed within remaining openings in the field plate opening and over the first ILD layer 118. In some embodiments, the second metal material 1802 may be deposited by way of a vapor deposition technique (e.g., CVD, PVD, PE-CVD, etc.). In some embodiments, the second metal material 1802 may be formed by depositing a seed layer by way of physical vapor deposition, followed by a plating process. In some embodiments, the second metal material 1802 may comprise copper (Cu) or an aluminum copper (AlCu) alloy.

After formation, the second metal material 1802 may be selectively patterned to define one or more metal structures of a first metal wire layer 418 overlying the first ILD layer 118. In some embodiments, the second metal material 1802 may be selectively patterned by forming a patterned masking layer (e.g., a photoresist layer or a hard mask layer)(not shown) over the second metal material 1802 and by subsequently etching the second metal material 1802 in areas exposed by the patterned masking layer.

Figure 19:
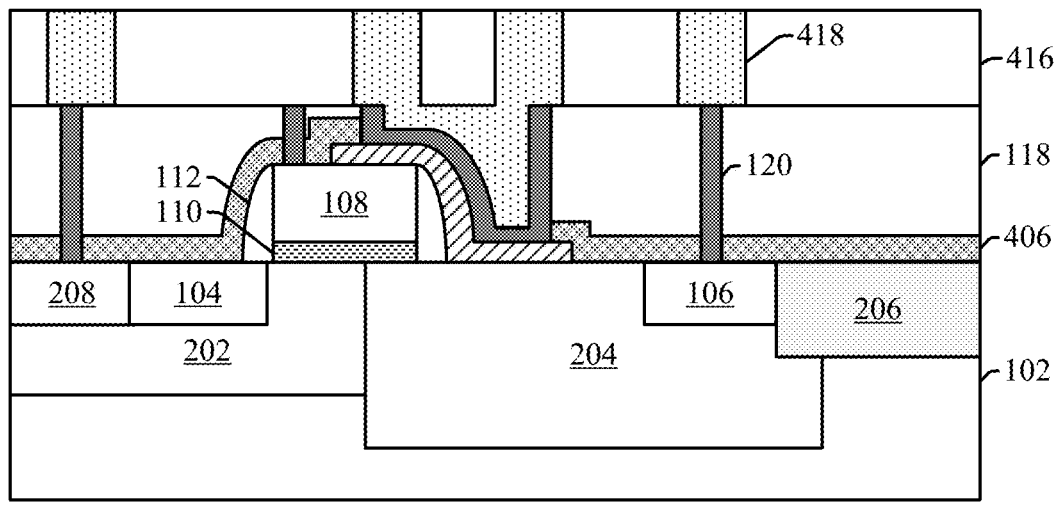

FIG. 19 illustrates some embodiments of a cross-sectional view 1900 corresponding to act 1120.

As shown in cross-sectional view 1900, a second ILD layer 416 is formed over the first ILD layer 118 and the one or more metal structures of a first metal wire layer 418. In various embodiments, the second ILD layer 416 may be formed by depositing a second ILD material over the first ILD layer 118 and the one or more metal structures of the first metal wire layer 418. After the second ILD layer 416 is formed, a planarization process (e.g., CMP) is performed to remove excess of the second ILD layer 416 and to expose top surfaces of the one or more metal structures of the first metal wire layer 418. In various embodiments, the second ILD layer 416 may comprise an ultra-low k dielectric material or a low-k dielectric material (e.g., SiCO) formed by a vapor deposition processor a spin coating process.

It has been appreciated that differences in heights of the plurality of contacts (e.g., 120) and the field plate (e.g., 122) may cause difficulties during fabrication of a disclosed transistor device. For example, because the field plate (e.g., 122) is formed over a dielectric layer 124 (e.g., a resist protective oxide), the field plate (e.g., 122) has a smaller height than the plurality of contacts (e.g., 120). However, the field plate (e.g., 122) and the plurality of contacts (e.g., 120) are formed using a same etching process. The differences in heights can lead to either an over-etching of a field plate opening (e.g., 1608 of FIG. 16) that results in shorting between the field plate (e.g., 122) and a conductive channel of a transistor device, or to an under-etching of contact openings (e.g., 1606 of FIG. 16) that results in poor connections between the plurality of contacts (e.g., 120) and the source region (e.g., 104), the drain region (e.g., 106), and/or the gate region (e.g., 116).

To prevent over-etching of a field plate opening or under-etching of contact openings, a composite etch stop layer may be used to control an etching depth of a field plate opening, in some embodiments. By controlling an etching depth of a field plate opening, the composite etch stop layer allows for both of the plurality of contacts (e.g., 120) and the field plate (e.g., 122) to be accurately formed to different heights.

Figure 20:
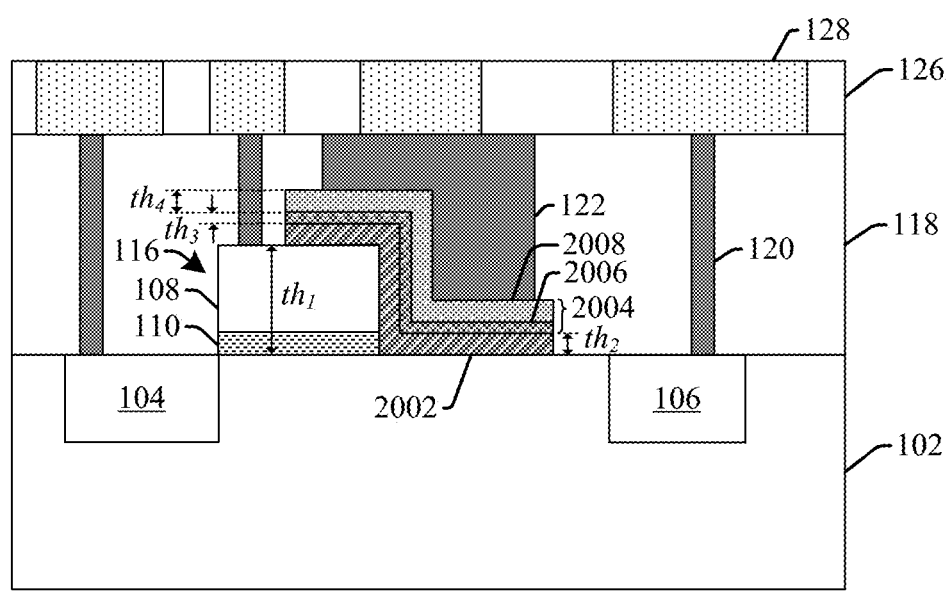
FIGS. 20-24 illustrate some embodiments of disclosed high voltage transistor devices having a composite etch stop layer that defines a field plate.

FIG. 20 illustrates a cross-sectional view of some embodiments of a high voltage transistor device 2000 having a composite etch stop layer that defines a field plate.

The high voltage transistor device 2000 comprises a gate structure 116 disposed over a semiconductor substrate 102. The gate structure 116 comprises a gate dielectric layer 110 and an overlying gate electrode 108. In some embodiments, the gate structure 116 may have a first thickness $th_1$ in a range of between approximately 1000 Angstroms and approximately 2000 Angstroms. A source region 104 and a drain region 106 are disposed within the semiconductor substrate 102 on opposing sides of the gate structure 116.

A resist protective oxide (RPO) 2002 is arranged over the gate structure 116. The RPO 2002 extends from directly over the gate structure 116 to laterally past an outermost sidewall of the gate structure 116. In some embodiments, the RPO 2002 may vertically extend from an upper surface of the gate structure 116 to an upper surface of the semiconductor substrate 102, and laterally extend from directly over the gate structure 116 to between the gate structure 116 and the drain region 106. In some embodiments, the RPO 2002 may comprise silicon dioxide, silicon nitride, or the like. In some embodiments, the RPO 2002 may have a second thickness $th_2$ in a range of between approximately 100 Angstroms and approximately 1000 Angstroms.

A composite etch stop layer 2004 is arranged over the RPO 2002. In some embodiments, the composite etch stop layer 2004 directly contacts one or more upper surfaces of the RPO 2002. A first inter-level dielectric (ILD) layer 118 and a field plate 122 are arranged over the composite etch stop layer 2004. The first ILD layer 118 surrounds the field plate 122 and a plurality of contacts 120, which are coupled to the source region 104, the drain region 106, and the gate structure 116. In some embodiments, the field plate 122 and the plurality of contacts 120 may comprise a diffusion barrier (not shown) surrounding a conductive core including one or more metals.

The composite etch stop layer 2004 comprises a plurality of different dielectric materials 2006-2008 stacked over the RPO 2002. In some embodiments, the plurality of different dielectric materials 2006-2008 may have outermost sidewalls that are substantially aligned along lines perpendicular to an upper surface of the semiconductor substrate 102. In some embodiments, the plurality of different dielectric materials 2006-2008 may have outermost sidewalls that are substantially aligned with outermost sidewalls of the RPO 2002. In such embodiments, the RPO 2002 has a first width that is substantially equal to a second width of the composite etch stop layer 2004. The plurality of different dielectric materials 2006-2008 have different etching properties, which provide respective ones of the plurality of different dielectric materials 2006-2008 with a different etching selectivity to an etchant. The different etching selectivities allow the composite etch stop layer 2004 to slow etching of a field plate opening (i.e., an opening that defines the field plate 122) and therefore both closely control a height of the field plate and enable differences in heights between the plurality of contacts 120 and the field plate 122 (e.g., to enable the plurality of contacts 120 to have larger heights than the field plate 122).

For example, in some embodiments, a bottom of the field plate 122 contacts the composite etch stop layer 2004 along an interface that is vertically above a bottom surface of one or more of the plurality of contacts 120 (e.g., the contacts that are coupled to the source region 104 and the drain region 106). In such embodiments, during fabrication of the high voltage transistor device 2000, the composite etch stop layer 2004 reduces the etching rate of an etchant used to form a field plate opening (i.e., an opening that defines the field plate 122). The reduction in the etching rate causes the field plate 122 to have a bottom surface that is above bottom surfaces of one or more of the plurality of contacts 120.

In some embodiments, the composite etch stop layer 2004 may comprise a first dielectric material 2006 directly contacting an upper surface of the RPO 2002 and a second dielectric material 2008 directly contacting an upper surface of the first dielectric material 2006. In some embodiments, the first dielectric material 2006 may have a third thickness $th_3$ and the second dielectric material 2008 may have a fourth thickness $th_4$. In some embodiments, the RPO 2002 and the composite etch stop layer 2004 may respectively have a substantially constant thickness between outermost sidewalls. If the third thickness $th_3$ and the fourth thickness $th_4$ are too small (e.g., less than the minimum values set forth below), the composite etch stop layer 2004 is unable to effectively stop an etch that forms a field plate opening. If the third thickness $th_3$ and the fourth thickness $th_4$ are too large (e.g., larger than the maximum values set forth below), an effect of the field plate 122 on the high voltage transistor device 2000 is reduced, thereby negatively impacting device performance.

In some embodiments, the first dielectric material 2006 may comprise or be silicon nitride ($Si_xN_y$) and the second dielectric material 2008 may comprise or be silicon dioxide ($SiO_2$). In such embodiments, the first thickness $th_1$ may be in a first range of between approximately 50 Angstroms and approximately 400 Angstrom, and the second thickness $th_2$ may be in a second range of between approximately 150 Angstroms and approximately 700 Angstrom. In other embodiments, the first dielectric material 2006 may comprise or be silicon dioxide ($SiO_2$) and the second dielectric material 2008 may comprise or be silicon nitride ($SiN_x$) or silicon oxy-nitride ($SiO_xN_y$). In such embodiments, the first thickness $th_1$ may be in a first range of between approximately 600 Angstroms and approximately 900 Angstrom. In some embodiments, the second thickness $th_2$ may be in a second range of between approximately 100 Angstroms and approximately 500 Angstrom.

Figure 21A:
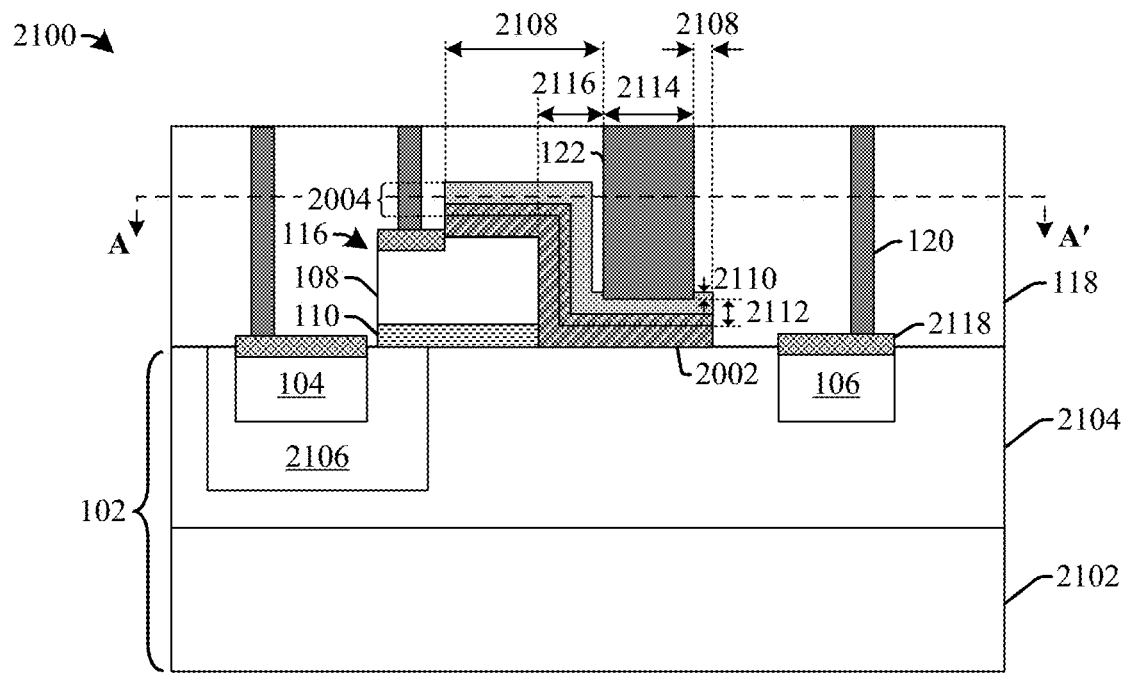
Figure 21B:
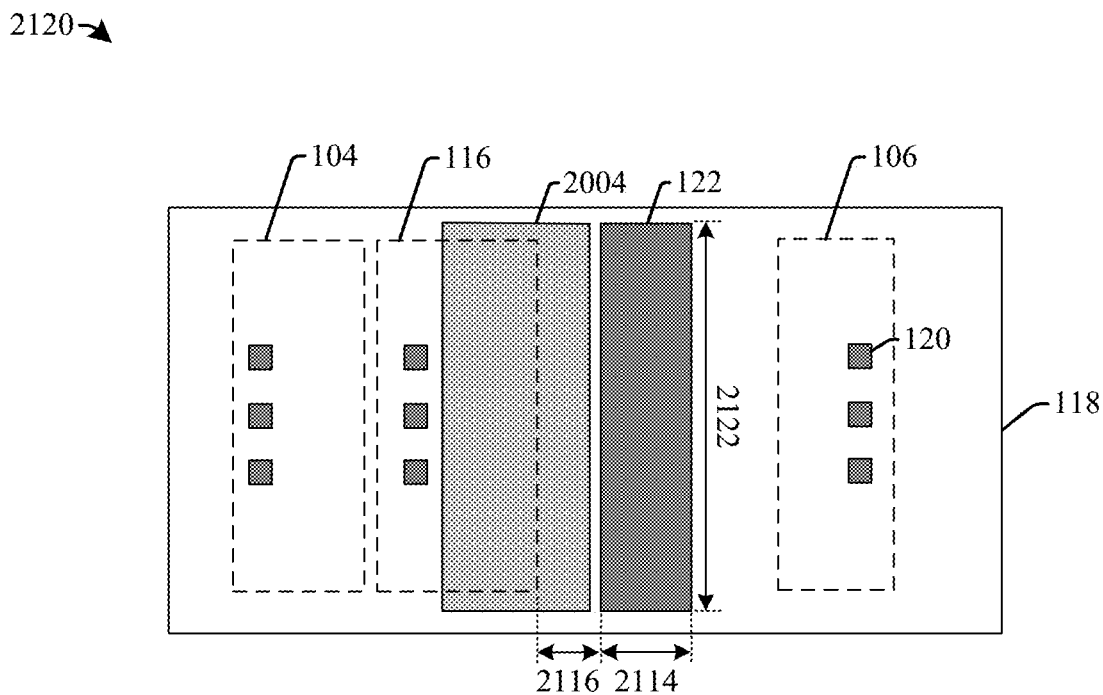

FIGS. 21A-21B illustrate some additional embodiments of a disclosed high voltage transistor device having a composite etch stop layer that defines a field plate.

As shown in cross-sectional view 2100 of FIG. 21A, the high voltage transistor device comprises a semiconductor substrate 102 having a body region 2106 disposed within a drift region 2104 over a substrate 2102. A source region 104 is arranged within the body region 2106 and a drain region 106 is arranged within the drift region 2104. In some embodiments, the source region 104, the drain region 106, and the drift region 2104 may have a first doping type (e.g., n-type), while the body region 2106 and the substrate 2102 have a second doping type (e.g., p-type) opposite the first doping type. In some embodiments, the source region 104 and the drain region 106 may comprise highly doped regions (i.e., n+ regions) having doping concentrations greater than the drift region 2104.

A gate structure 116 is arranged over the semiconductor substrate 102 between the source region 104 and the drain region 106. An RPO 2002 is arranged over the gate structure 116 and laterally extends past an outermost sidewall of the gate structure 116. A composite etch stop layer 2004 is arranged between the RPO 2002 and a field plate 122. In some embodiments, the RPO 2002 may enclose the field plate 122 (i.e., extend past an outermost sidewall of the field plate 122) for one or more lateral distances 2108 that are in a range of between approximately 0 microns and approximately 2 microns.

In some embodiments, the field plate 122 may extend to a non-zero depth 2110 into the composite etch stop layer 2004. In such embodiments, the field plate 122 contacts sidewalls of the composite etch stop layer 2004. In various embodiments, the field plate 122 may also contact a horizontally extending surface of the composite etch stop layer 2004 or a horizontally extending surface of the RPO 2002. In some embodiments, the non-zero depth 2110 may be in a range of between approximately 400 Angstroms and approximately 700 Angstroms. Because the field plate 122 extends into the composite etch stop layer 2004, the composite etch stop layer 2004 has a first thickness 2112 directly below the field plate 122 and a second thickness outside of the field plate 122 that is larger than the first thickness 2112. In some embodiments, the first thickness 2112 in a range of between approximately 0 Angstroms and approximately 10000 Angstroms. In some additional embodiments, the first thickness 2112 in a range of between approximately 600 Angstroms and approximately 300 Angstroms.

As shown in top-view 2120 of FIG. 21B (along cross-sectional line A-A' of FIG. 21A), the field plate 122 has a width 2114 that extends in a first direction for a distance having a range of between approximately 150 nanometers and approximately 2000 nanometers. The field plate 122 also has a length 2122 that extends in a second direction (perpendicular to the first direction) for a distance that is less than approximately 1000 um.

Referring again to cross-sectional view 2100 of FIG. 21A, in some embodiments, the field plate 122 may be laterally separated from the gate structure 116 by a distance 2116. For example, the field plate 122 may be laterally separated from the gate structure 116 by a distance 2116 in a range of between approximately 0 nm and approximately 500 nm. In other embodiments (not shown), the field plate 122 may laterally overlap (i.e., extend to directly over) the gate structure 116. For example, the field plate 122 may laterally overlap the gate structure 116 for a distance in a range of between approximately 0 nm and approximately 200 nm.

In some embodiments, a silicide layer 2118 is arranged over the source region 104, the drain region 106, and parts of the gate structure 116 that are not covered by the RPO 2002. In various embodiments, the silicide layer 2118 may comprise a compound having silicon and a metal such as nickel, platinum, titanium, tungsten, magnesium, or the like. In some embodiments, the silicide layer 2118 has a thickness in a range of between approximately 150 Angstroms and approximately 400 Angstroms.

Figure 22:
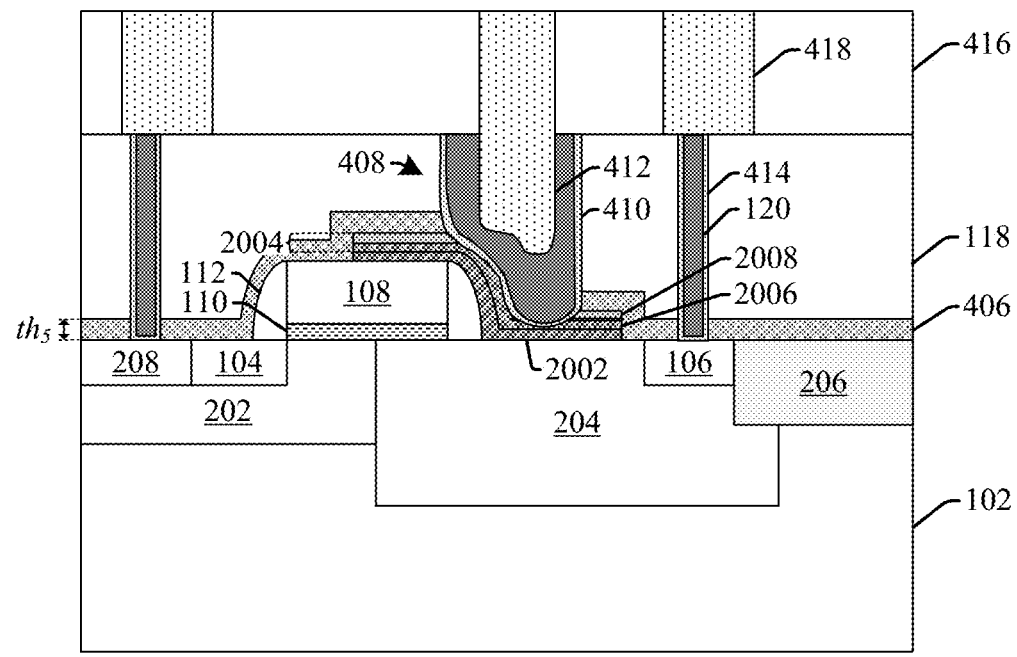

FIG. 22 illustrates a cross-sectional view of some additional embodiments of high voltage transistor device 2200 having a composite etch stop layer that defines a field plate.

The high voltage transistor device 2200 comprises a gate electrode 108 arranged over a semiconductor substrate 102. An RPO 2002 and a composite etch stop layer 2004 are over the gate electrode 108 and the semiconductor substrate 102. A contact etch stop layer (CESL) 406 is disposed over the composite etch stop layer 2004. In some embodiments, a bottom surface of the composite etch stop layer 2004 may directly contact the RPO 2002 and a top surface of the composite etch stop layer 2004 may directly contact the CESL 406. The CESL 406 laterally extends past outermost sidewalls of the composite etch stop layer 2004 and contacts the semiconductor substrate 102. In some embodiments, the CESL 406 may have a thickness $th_5$ in a range of between approximately 100 Angstroms and approximately 1000 Angstroms. In some embodiments, the CESL 406 may comprise silicon nitride, silicon carbide, or the like.

A field plate 408 is disposed within a first ILD layer 118 over the CESL 406. In some embodiments, the field plate 408 may comprise a first metal material 410 and a second metal material 412. The composite etch stop layer 2004 is laterally arranged between the field plate 408 and the gate structure 116 and vertically arranged between the field plate 122 and the semiconductor substrate 102. The RPO 2002 and the composite etch stop layer 2004 have sidewalls contacting the CESL 406. The composite etch stop layer 2004 further has horizontally extending surfaces (e.g., upper surfaces) contacting the CESL 406.

In some embodiments, the field plate 122 may extend into one or more of the plurality of different dielectric materials 2006-2008 within the composite etch stop layer 2004. For example, in some embodiments the composite etch stop layer 2004 may comprise a first dielectric material 2006 and a second dielectric material 2008 contacting upper surfaces of the first dielectric material 2006. The field plate 122 may extend through the second dielectric material 2008 (e.g., silicon oxide) and have a bottom surface contacting the first dielectric material 2006 (e.g., silicon nitride). In such embodiments, the second dielectric material 2008 may vertically separate a bottommost point of the field plate 122 from the RPO 2002. In other embodiments, the field plate 122 may further extend through the first dielectric material 2006 and have a bottom surface and/or sidewalls contacting the RPO 2002. In some embodiments, the field plate 122 may vertically extend through the second dielectric material 2008 and also be laterally separated from the gate structure 116 by the second dielectric material 2008.

Figure 23:
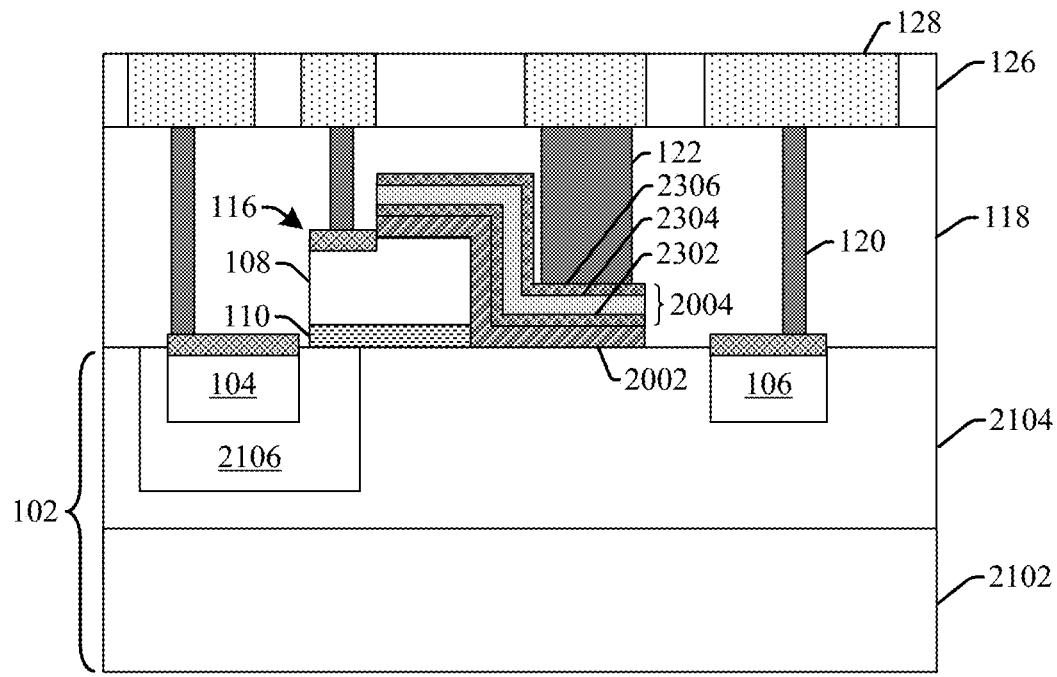
Figure 24:
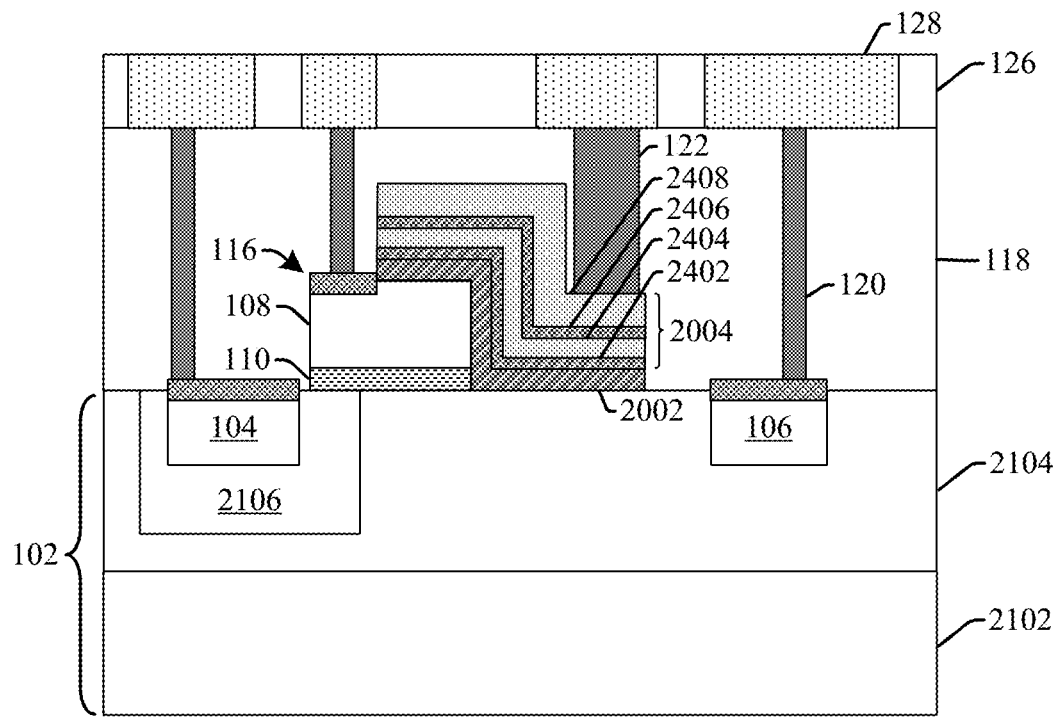

Although the disclosed composite etch stop layer 2004 is illustrated in FIGS. 20-22 as having two different dielectric materials 2006-2008 stacked over an RPO 2002, it will be appreciated that the disclosed composite etch stop layer 2004 is not limited to such configurations. Rather, in various embodiments, the composite etch stop layer 2004 may include additional layers of dielectric material. FIGS. 23-24 illustrates some non-limiting examples of alternative embodiments of a disclosed composite etch stop layer 2004.

FIG. 23 illustrates a cross-sectional view of some additional embodiments of a high voltage transistor device 2300 having a composite etch stop layer that defines a field plate.

The high voltage transistor device 2300 comprises a composite etch stop layer 2004 arranged over an RPO 2002. The composite etch stop layer 2004 comprises a first dielectric material 2302, a second dielectric material 2304 contacting an upper surface of the first dielectric material 2302, and a third dielectric material 2306 contacting an upper surface of the second dielectric material 2304. In some embodiments, the first dielectric material 2302 may comprise or be silicon dioxide ($SiO_2$), the second dielectric material 2304 may comprise or be silicon nitride ($Si_xN_y$) or silicon oxy-nitride ($SiO_xN_y$), and the third dielectric material 2306 may comprise or be silicon dioxide ($SiO_2$).

In some embodiments, the first dielectric material 2302 may have a first thickness, the second dielectric material 2304 may have a second thickness, and the third dielectric material 2306 may have a third thickness. In some embodiments, the first thickness may be in a first range of between approximately 300 Angstroms and approximately 900 Angstrom, the second thickness may be in a second range of between approximately 50 Angstroms and approximately 200 Angstrom, and the third thickness may be in a third range of between approximately 200 Angstroms and approximately 600 Angstrom.

FIG. 24 illustrates a cross-sectional view of some additional embodiments of a high voltage transistor device 2400 having a composite etch stop layer that defines a field plate.

The high voltage transistor device 2400 comprises a composite etch stop layer 2004 arranged over an RPO 2002. The composite etch stop layer 2004 comprises a first dielectric material 2402, a second dielectric material 2404 contacting an upper surface of the first dielectric material 2402, a third dielectric material 2406 contacting an upper surface of the second dielectric material 2404, and a fourth dielectric material 2408 contacting an upper surface of the third dielectric material 2406. In some embodiments, the first dielectric material 2402 may comprise or be silicon dioxide ($SiO_2$), the second dielectric material 2404 may or be comprise silicon nitride ($Si_xN_y$) or silicon oxy-nitride ($SiO_xN_y$), the third dielectric material 2406 may comprise or be silicon dioxide ($SiO_2$), and the fourth dielectric material 2408 may comprise or be silicon nitride ($Si_xN_y$) or silicon oxy-nitride ($SiO_xN_y$).

In some embodiments, the first dielectric material 2402 may have a first thickness, the second dielectric material 2404 may have a second thickness, the third dielectric material 2406 may have a third thickness, and the fourth dielectric material 2408 may have a fourth thickness. In some embodiments, the first thickness may be in a first range of between approximately 300 Angstroms and approximately 900 Angstrom, the second thickness may be in a second range of between approximately 50 Angstroms and approximately 200 Angstrom the third thickness may be in a third range of between approximately 200 Angstroms and approximately 600 Angstrom, and the fourth thickness may be in a fourth range of between approximately 50 Angstroms and approximately 200 Angstrom.

FIGS. 25-32 illustrate cross-sectional views of some embodiments showing a method of forming a high voltage transistor device having a composite etch stop layer that defines a field plate. Although the cross-sectional views 2500-3200 shown in FIGS. 25-32 are described with reference to a method, it will be appreciated that the structures shown in FIGS. 25-32 are not limited to the method but rather may stand alone separate of the method.

Figure 25:
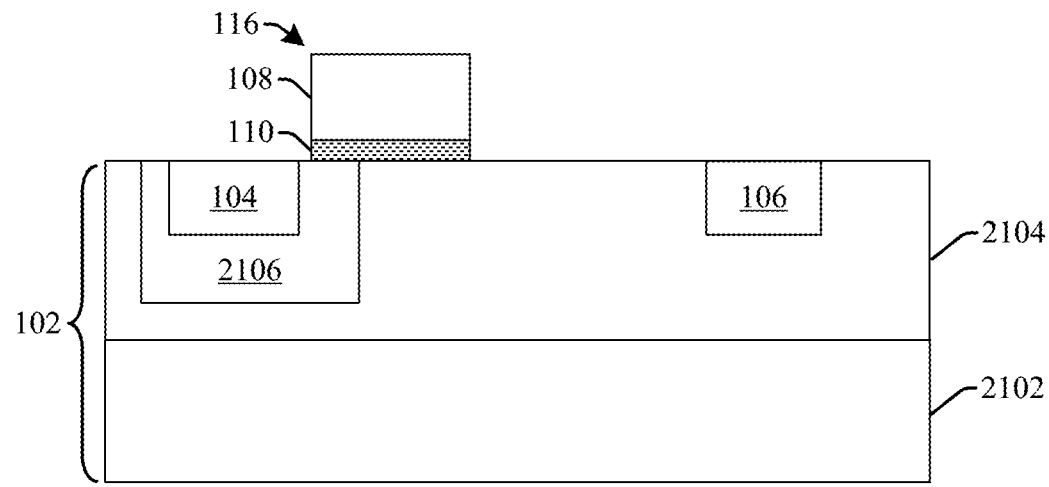
FIGS. 25-32 illustrate cross-sectional views of some embodiments showing a method of forming a high voltage transistor device having a composite etch stop layer that defines a field plate.

As shown in cross-sectional view 2500 of FIG. 25, a semiconductor substrate 102 is selectively implanted to form a plurality of implantation regions (e.g., well regions, contact regions, etc.). In some embodiments, the semiconductor substrate 102 may be selectively implanted to form a body region 2106, a drift region 2104, a source region 104, and a drain region 106. In other embodiments, the semiconductor substrate 102 may be selectively implanted to form different implantation regions (e.g., such as any of those illustrated in FIGS. 1-10). In some embodiments, the plurality of implantation regions may be formed by selectively masking the semiconductor substrate 102 (e.g., using a photoresist mask) and then introducing high-energy dopants (e.g., p-type dopant species such as boron or n-type dopants such as phosphorous) into exposed areas of the semiconductor substrate 102.

A gate structure 116 is formed over a semiconductor substrate 102 between the source region 104 and the drain region 106. The gate structure 116 may be formed by depositing a gate dielectric layer 110 over the semiconductor substrate 102, and by depositing a gate electrode material 108 over the gate dielectric layer 110. The gate dielectric layer 110 and the gate electrode material 108 may be subsequently patterned (e.g., etched according to a photoresist mask and/or a hard mask) to define the gate structure 116.

Figure 26:
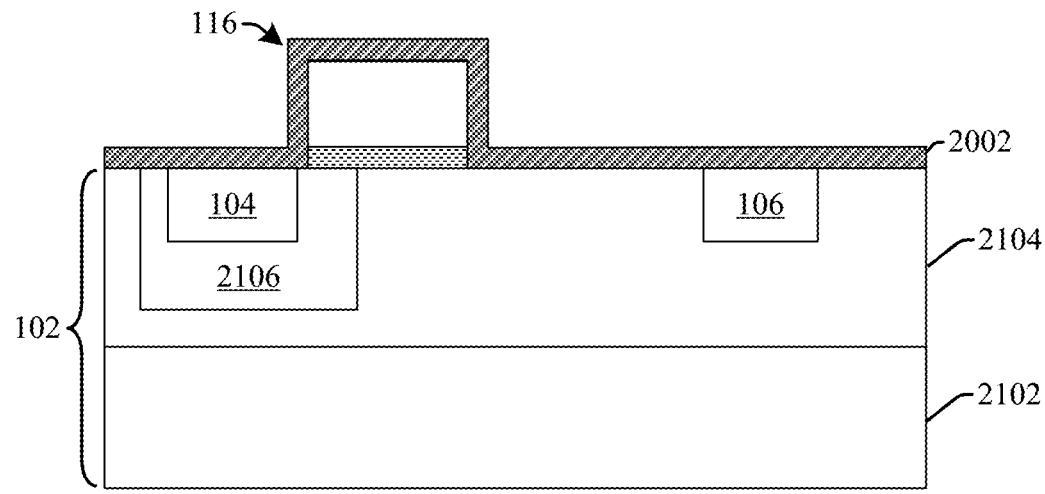

As shown in cross-sectional view 2600 of FIG. 26, a resist protective oxide (RPO) 2002 is formed over the gate structure 116. The RPO 2002 laterally extends from directly over the gate structure 116 to past an outermost sidewall of the gate structure 116. The RPO 2002 is configured to block the formation of a silicide on underlying layers. In some embodiments, the RPO 2002 may be deposited by a vapor deposition technique (e.g., CVD). In some embodiments, the RPO 2002 may comprise silicon dioxide ($SiO_2$), silicon nitride, or the like.

Figure 27:
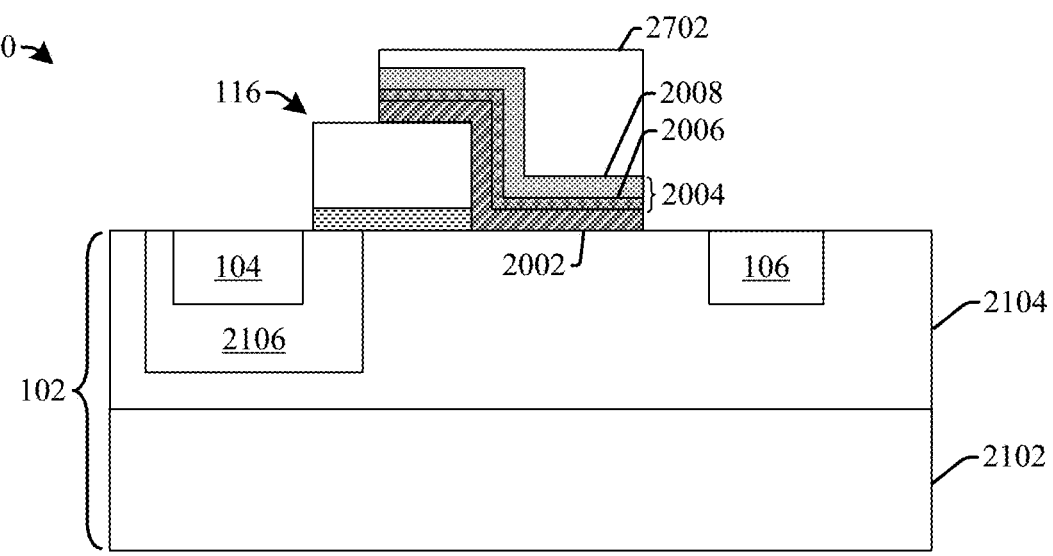

As shown in cross-sectional view 2700 of FIG. 27, a composite etch stop layer 2004 comprising a plurality of different dielectric materials 2006-2008 is selectively formed over the RPO 2002. In some embodiments, the plurality of different dielectric materials 2006-2008 may be sequentially deposited by vapor deposition techniques. In some embodiments, the composite etch stop layer 2004 may comprise stacked layers including two or more of a layer of silicon nitride ($Si_xN_y$), a layer of silicon oxy-nitride ($Si_xO_yN_y$), and/or a layer of silicon dioxide ($SiO_2$).

In some embodiments, the plurality of different dielectric materials 2006-2008 and the RPO 2002 may be patterned using a same masking layer 2702 (e.g., photoresist layer) and etching process. Using a same masking layer 2702 to pattern the plurality of different dielectric materials 2006-2008 and the RPO 2002 mitigates a cost of forming the composite etch stop layer 2004. In such embodiments, the plurality of different dielectric materials 2006-2008 and the RPO 2002 may have sidewalls that are substantially aligned.

Figure 28:
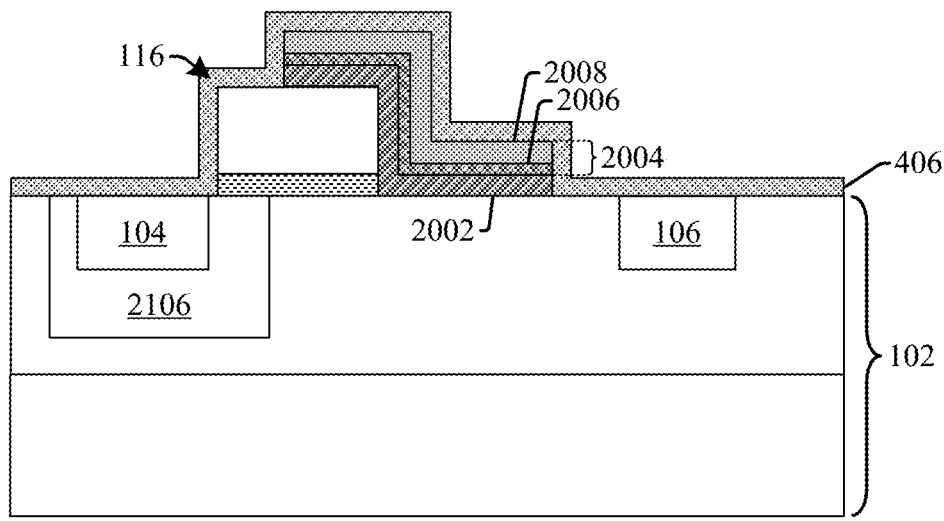

As shown in cross-sectional view 2800 of FIG. 28, a contact etch stop layer (CESL) 406 is formed over the semiconductor substrate 102 and the composite etch stop layer 2004. In some embodiments, the CESL 406 may be formed by a vapor deposition process. The CESL may comprise a nitride layer (e.g., $Si_3N_4$), a carbide layer (SiC), or the like.

Figure 29:
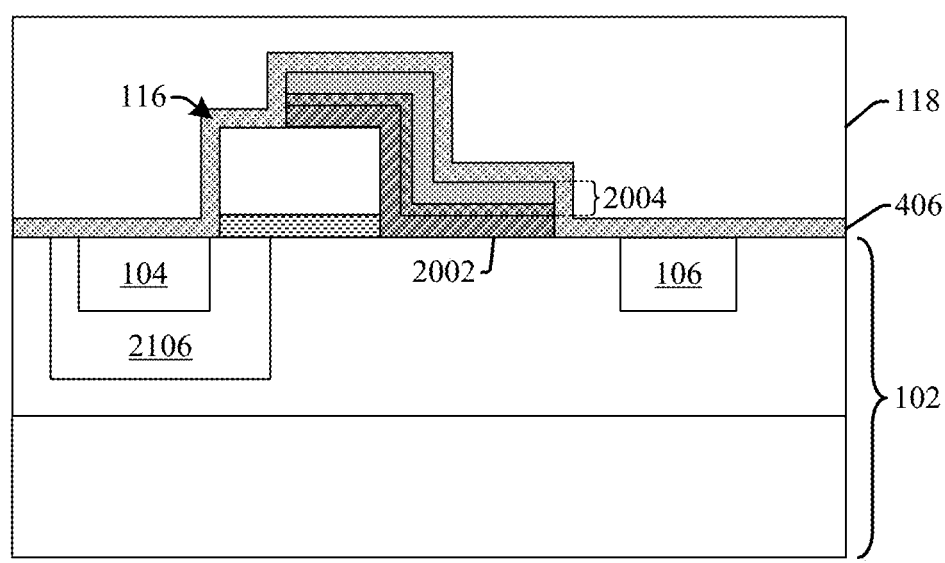

As shown in cross-sectional view 2900 of FIG. 29, a first inter-level dielectric (ILD) layer 118 is formed over the CESL 406. In some embodiments, the first ILD layer 118 may comprise an oxide (e.g., $SiO_2$), an ultra-low k dielectric material, a low-k dielectric material (e.g., SiCO), or the like. In some embodiments, the first ILD layer 118 may be formed by a vapor deposition process.

Figure 30:
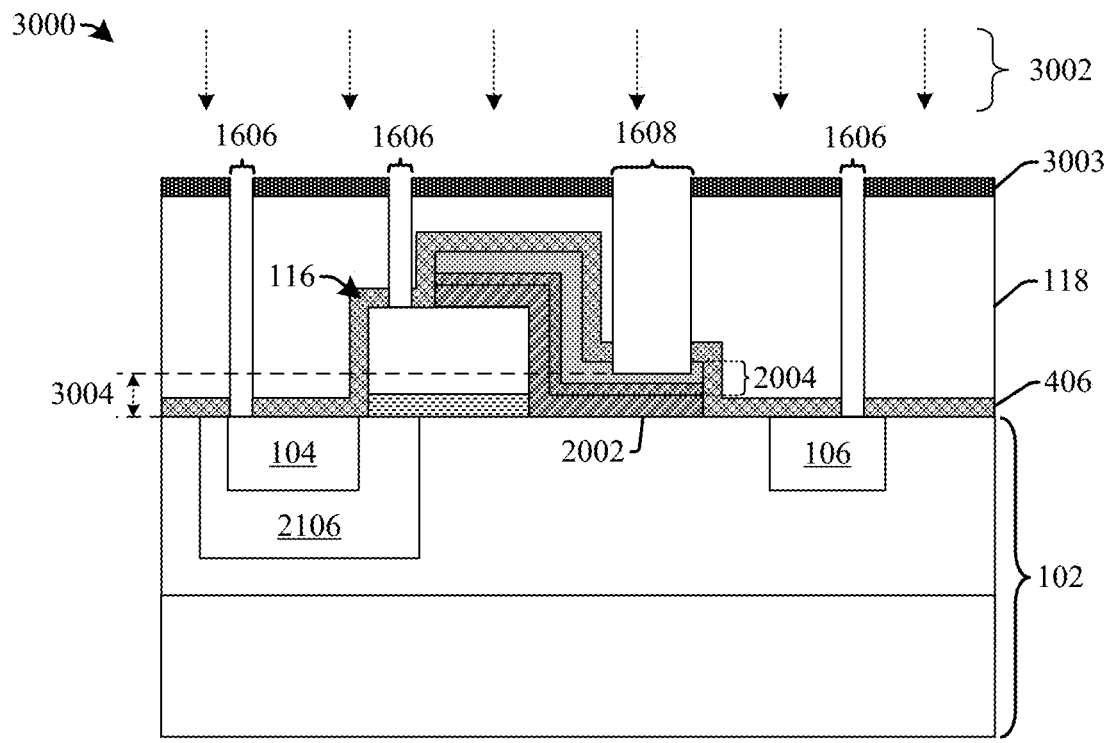

As shown in cross-sectional view 3000 of FIG. 30, the first ILD layer 118 is selectively exposed to an etchant 3002 (e.g., according to masking layer 3003) to form contact openings 1606 and a field plate opening 1608 within the first ILD layer 118. The contact openings 1606 and the field plate opening 1608 have an etching depth offset of a non-zero distance 3004. In some embodiments, the non-zero distance 3004 may be in a range of between approximately 400 Angstroms and approximately 2000 Angstroms. In some embodiments, the field plate opening 1608 extends into the composite etch stop layer 2004, so that sidewalls of the composite etch stop layer 2004 define the field plate opening 1608. In various embodiments, the composite etch stop layer 2004 or the RPO 2002 may define a bottom of the field plate opening 1608.

In some embodiments, the etchant 3002 may reduce a thickness of the composite etch stop layer 2004 by an amount that is in a range of between approximately 400 Angstroms and approximately 700 Angstroms. In some embodiments, a thickness of the composite etch stop layer 2004 directly below the field plate opening 1608 is in a range of between approximately 0 Angstroms and approximately 1,000 Angstroms. In some additional embodiments, a thickness of the composite etch stop layer 2004 directly below the field plate opening 1608 is in a range of between approximately 300 Angstroms and approximately 900 Angstroms.

The etchant 3002 used to form the contact openings 1606 and the field plate opening 1608 is selected to etch through a material of the CESL 406. However, because the composite etch stop layer 2004 is formed of multiple different materials, the composite etch stop layer 2004 is able to resist etching from the etchant 3002 to a higher degree. The composite etch stop layer 2004 thereby allows the contact openings 1606 to extend to the semiconductor substrate 102, while preventing the field plate opening 1608 from extending to the semiconductor substrate 102. The composite etch stop layer 2004 also allows for a high degree of uniformity in etching depths at different locations on a substrate, between substrates of a same lot, and/or over substrates of different lots. For example, the composite etch stop layer 2004 allows for the etching depth of field plate openings 1608 on different substrates to be within a deviation of approximately 2% or less. This etch depth uniformity allows for improved device uniformity and performance over devices not having the composite etch stop layer 2004.

Figure 31:
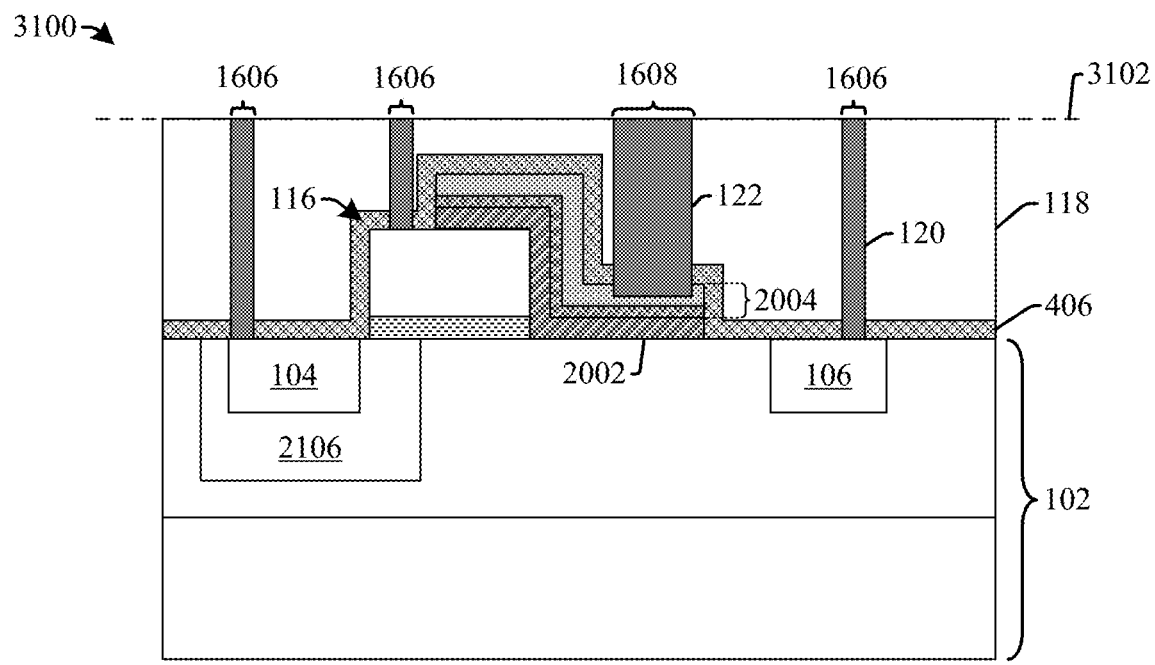

As shown in cross-sectional view 3100 of FIG. 31, the contact openings 1606 and the field plate opening 1608 are filled with one or more conductive materials. In some embodiments, the one or more conductive materials may be deposited by way of a vapor deposition technique (e.g., CVD, PVD, PE-CVD, etc.) and/or a plating process (e.g., an electroplating or electro-less plating process). A planarization process (e.g., chemical mechanical planarization) may be subsequently performed to remove excess of the one or more conductive materials and to form a planar surface along line 3102. In some embodiments, the one or more conductive materials may comprise tungsten (W), titanium (Ti), titanium nitride (TiN), and/or tantalum nitride (TaN). In some embodiments, a diffusion barrier layer and/or a liner layer may be deposited into the contact openings 1606 and the field plate opening 1608 prior to depositing the one or more conductive materials.

Figure 32:
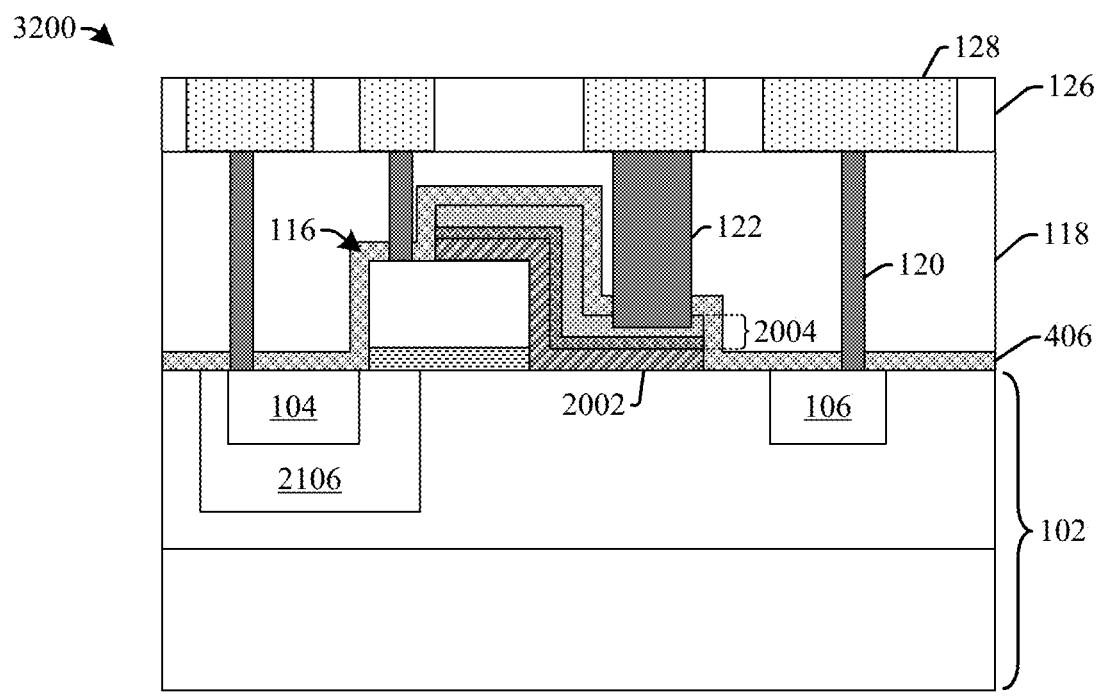

As shown in cross-sectional view 3200 of FIG. 32, a second ILD layer 126 is formed over the first ILD layer 118 and a first back-end-of-the-line (BEOL) metal wire layer 128 is formed within the second ILD layer 126. In various embodiments, the second ILD layer 126 may be formed by depositing a second ILD material over the first ILD layer 118. The second ILD layer 126 is subsequently etched to form trenches extending within the second ILD layer 126. The trenches are filled with a conductive material and a planarization process (e.g., CMP) is performed to remove excess of the conductive material from over the second ILD layer 126.

Figure 33:
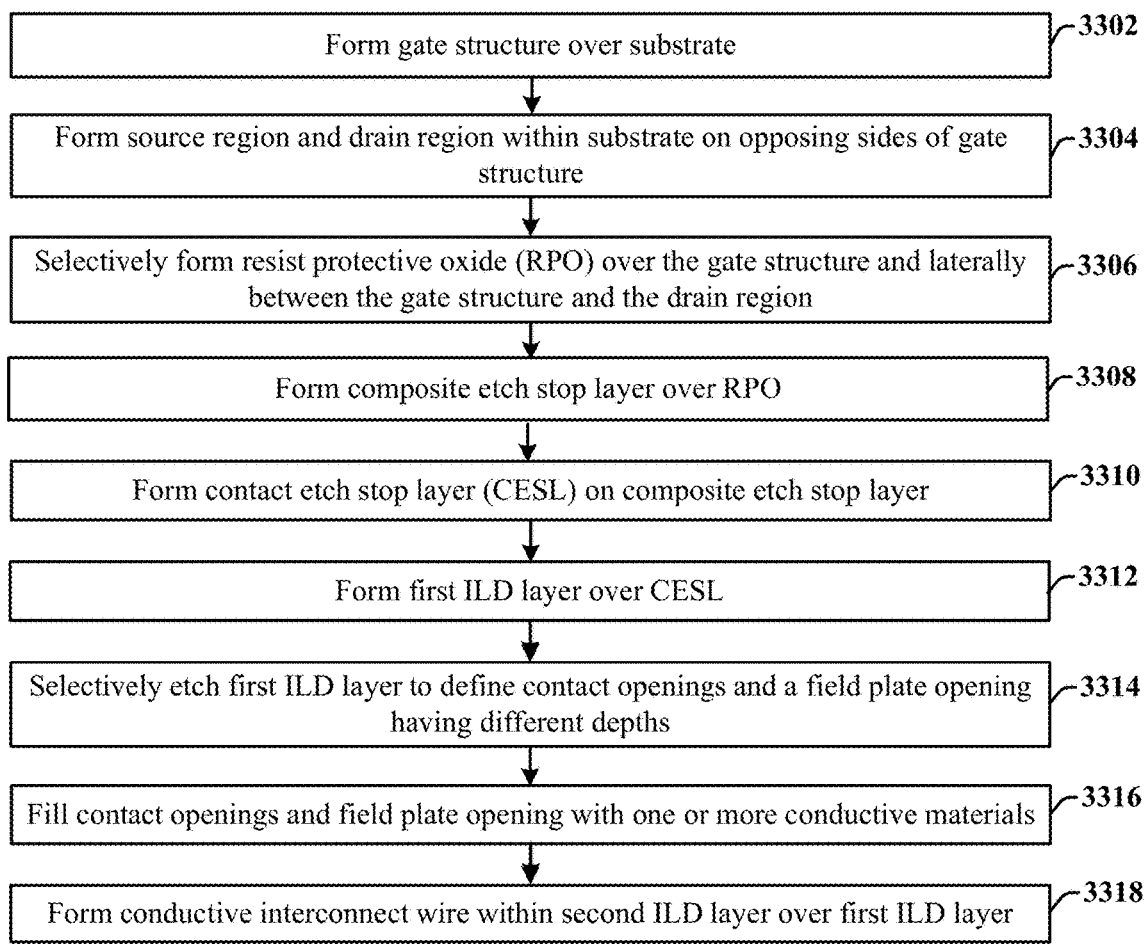
FIG. 33 illustrates a flow diagram of some embodiments of a method of forming a high voltage transistor device having a composite etch stop layer that defines a field plate.

FIG. 33 illustrates a flow diagram of some embodiments of a method 3300 of forming a high voltage transistor device having a composite etch stop layer that defines a field plate.

At 3302, a gate structure is formed over a substrate. FIG. 25 illustrates a cross-sectional view 2500 corresponding to some embodiments of act 3302.

At 3304, source and drain regions are formed within the substrate on opposing sides of the gate structure. In some additional embodiments, one or more additional doped regions (e.g., a body region, a drift region, etc.) may also be formed within the substrate. FIG. 25 illustrates a cross-sectional view 2500 corresponding to some embodiments of act 3304.

At 3306, a resistor protective oxide (RPO) is formed over the gate structure and laterally between the gate structure and the drain region. FIG. 26 illustrates a cross-sectional view 2600 corresponding to some embodiments of act 3306.

At 3308, a composite etch stop layer is formed over the RPO. FIG. 27 illustrates a cross-sectional view 2700 corresponding to some embodiments of act 3308.

At 3310, a contact etch stop layer (CESL) is formed on the composite etch stop layer. FIG. 28 illustrates a cross-sectional view 2800 corresponding to some embodiments of act 3310.

At 3312, a first inter-level dielectric (ILD) layer is formed over the CESL. FIG. 29 illustrates a cross-sectional view 2900 corresponding to some embodiments of act 3312.

At 3314, the first ILD layer is selectively etched to define a plurality of contact openings and a field plate opening. The plurality of contact openings and the field plate opening have different depths. FIG. 30 illustrates a cross-sectional view 3000 corresponding to some embodiments of act 3314.

At 3316, the plurality of contact openings and the field plate opening are filled with one or more conductive materials. FIG. 31 illustrates a cross-sectional view 3100 corresponding to some embodiments of act 3316.

At 3318, a conductive interconnect wire is formed within a second ILD layer over the first ILD layer. FIG. 32 illustrates a cross-sectional view 3200 corresponding to some embodiments of act 3318.

Figure 34:
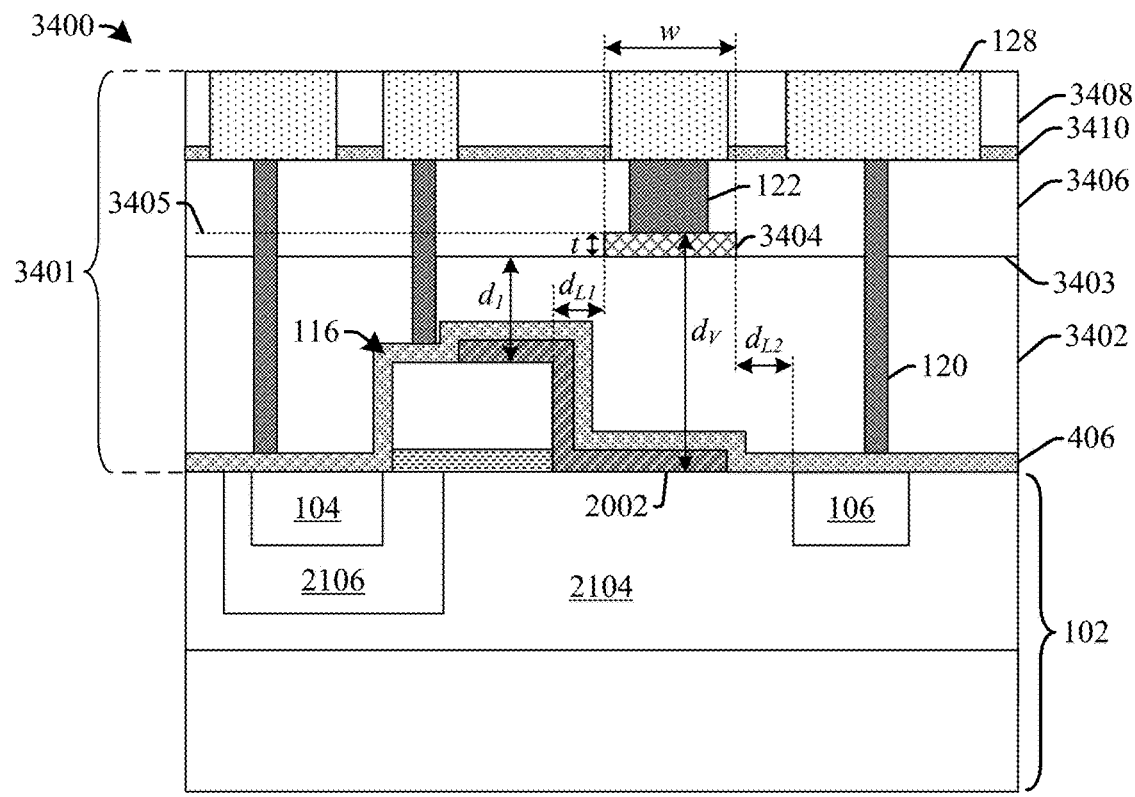
FIGS. 34-39 illustrate cross-sectional views of some embodiments of disclosed high voltage transistor devices having a field plate etch stop structure defining a field plate comprising a bottom surface that is vertically offset from bottom surfaces of conductive contacts.

FIG. 34 illustrates a cross-sectional view of some embodiments of a high voltage transistor device 3400 having a field plate etch stop structure defining a field plate comprising a bottom surface that is vertically offset from bottom surfaces of conductive contacts.

The high voltage transistor device 3400 comprises a gate structure 116 arranged vertically over a semiconductor substrate 102 at a location that is laterally between a source region 104 and a drain region 106. In some embodiments, the semiconductor substrate 102 may further comprise a body region 2106 surrounding the source region 104 and/or a drift region 2104 between the body region 2106 and the drain region 106. A resist protective oxide (RPO) 2002 is over the gate structure 116. The RPO 2002 extends from directly over the gate structure 116 to laterally between the gate structure 116 and the drain region 106. A contact etch stop layer (CESL) 406 is disposed over the RPO 2002, the gate structure 116, and the semiconductor substrate 102.

A dielectric structure 3401 is arranged over the CESL 406. The dielectric structure 3401 comprises a first ILD layer 3402 is disposed over the CESL 406, a second ILD layer 3406 over the first ILD layer 3402, and a third ILD layer 3408 over the second ILD layer 3406. In some embodiments, the first ILD layer 3402 has an uppermost surface that overlies a top of the gate structure 116 by a non-zero distance $d_1$. In some embodiments, the second ILD layer 3406 is separated from the third ILD layer 3408 by an etch stop layer 3410. In such embodiments, the second ILD layer 3406 has a bottom surface directly contacting a top surface of the first ILD layer 3402 and a top surface directly contacting a bottom surface of the etch stop layer 3410. A plurality of contacts 120 vertically extend from the top surface of the second ILD layer 3406 to a lower surface of the first ILD layer 3402 (through an interface 3403 of the first ILD layer 3402 and the second ILD layer 3406). The plurality of contacts 120 are configured to contact the source region 104, the drain region 106, and the gate structure 116.

A field plate etch stop structure 3404 is disposed between the first ILD layer 3402 and the second ILD layer 3406. A bottommost surface and a topmost surface of the field plate etch stop structure 3404 are vertically between bottom and top surfaces of the plurality of contacts 120. In some embodiments, the field plate etch stop structure 3404 is disposed directly over the RPO 2002. In some such embodiments, the field plate etch stop structure 3404 is completely confined over the RPO 2002, while in other embodiments the field plate etch stop structure 3404 may extend from directly over the RPO 2002 to laterally between the RPO 2002 and the drain region 106. In some embodiments, the field plate etch stop structure 3404 may have opposing outermost sidewalls that are laterally between the gate structure 116 and the drain region 106. For example, the field plate etch stop structure 3404 may have a first outermost sidewall that is separated from the gate structure 116 by a first lateral distance $d_{L1}$ and an opposing second outermost sidewall that is separated from the drain region 106 by a second lateral distance $d_{L2}$. In other embodiments, the field plate etch stop structure 3404 may extend to directly over the gate structure 116 and/or the drain region 106.

A field plate 122 is disposed on the field plate etch stop structure 3404. The field plate 122 comprises a same material as the plurality of contacts 120 (e.g., tungsten, cobalt, or the like). A bottommost surface of the field plate 122 is vertically between the bottom and top surfaces of the plurality of contacts 120. For example, a bottommost surface of the field plate 122 may be arranged along a horizontal plane 3405 that is parallel to an upper surface of the substrate 102 and that extends through sidewalls of the plurality of contacts 120. The bottommost surface of the field plate 122 is separated from the semiconductor substrate 102 by a distance $d_V$. In some embodiments, the distance $d_V$ has a value of between approximately 400 Angstroms and approximately 700 Angstroms. A breakdown voltage of the high voltage transistor device 3400 is proportional to the distance $d_V$. For example, as the distance $d_V$ decreases a breakdown voltage of the high voltage transistor device 3400 also decreases.

The field plate etch stop structure 3404 comprises a material with a high etching selectivity relative to the first ILD layer 3402 and the second ILD layer 3406. For example, in various embodiments, the field plate etch stop structure 3404 may comprise silicon nitride ($SiN_x$), silicon oxynitride ($SiO_xN_y$), amorphous silicon (a-Si), hafnium oxide ($HfO_x$), zirconium oxide ($ZrO_x$), a metal-oxide, or the like. In various embodiments, the field plate etch stop structure 3404 may have a thickness t in a range of between approximately 1 nm and approximately 100 nm. In various embodiments, the field plate etch stop structure 3404 may have a width w in a range of between approximately 10 nm and approximately 1,000 nm. The high etching selectivity allows for the field plate 122 to be formed concurrent to the plurality of contacts 120, while providing for a vertical offset between the bottommost surface of the field plate 122 and the bottom surfaces of the plurality of contacts 120. The vertical offset provides for good control of the distance $d_V$ between the bottommost surface of the field plate 122 and the semiconductor substrate 102 (i.e., good control of the breakdown voltage of the high voltage transistor device 3400).

Figure 35:
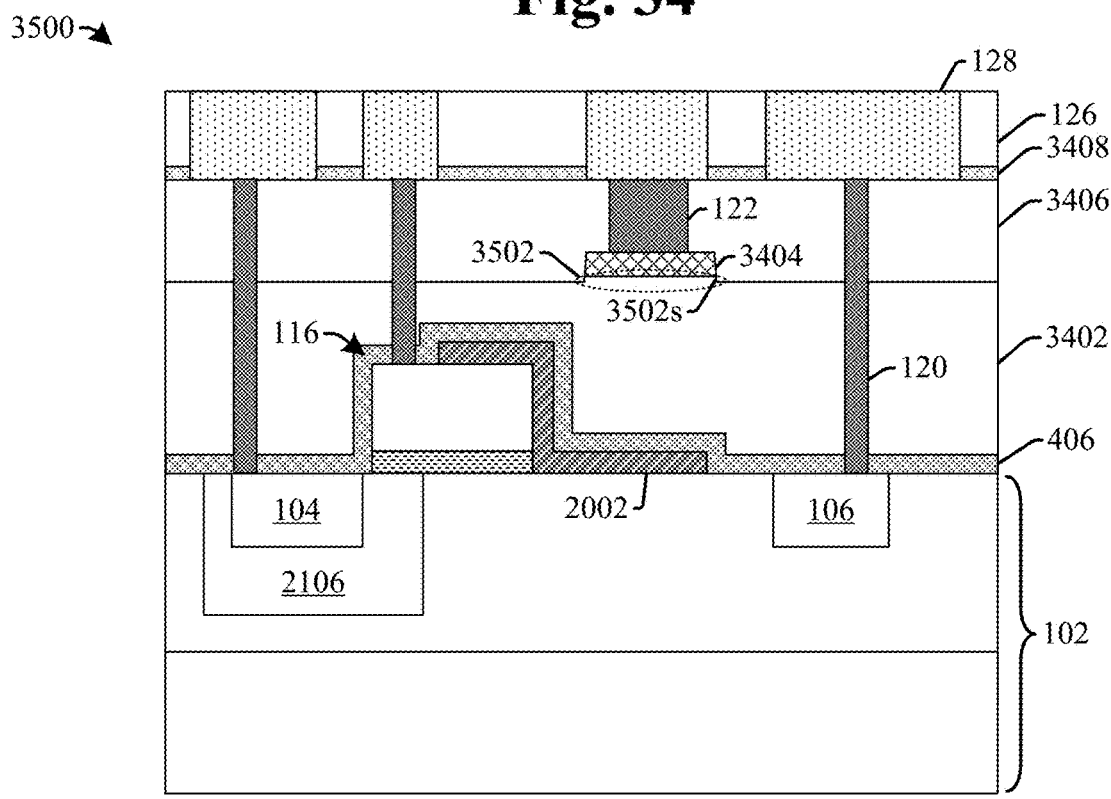

FIG. 35 illustrates a cross-sectional view of some additional embodiments of a high voltage transistor device 3500 having a field plate etch stop structure defining a field plate comprising a bottom surface that is vertically offset from bottom surfaces of conductive contacts.

The high voltage transistor device 3500 comprises a field plate etch stop structure 3404 disposed over a first ILD layer 3402. In some embodiments, the field plate etch stop structure 3404 may have sidewalls that are oriented at a non-zero angle with respect to a line that is normal to an upper surface of the first ILD layer 3402. For example, in some embodiments the non-zero angle may be in a range of between 0° and approximately 30°.

A second ILD layer 3406 is disposed over the field plate etch stop structure 3404 and the first ILD layer 3402. In some embodiments, the first ILD layer 3402 comprises sidewalls 3502s defining a protrusion 3502 underlying the field plate etch stop structure 3404. In such embodiments, the second ILD layer 3406 laterally contacts the first ILD layer 3402 along the sidewalls 3502s.

Figure 36:
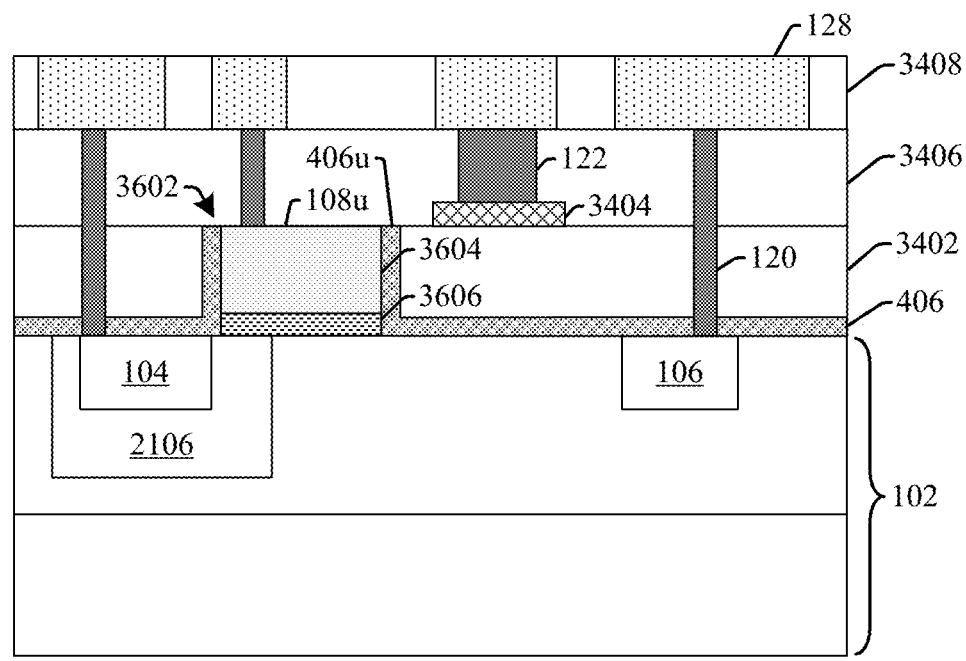

FIG. 36 illustrates a cross-sectional view of some additional embodiments of a high voltage transistor device 3600 having a field plate etch stop structure defining a field plate comprising a bottom surface that is vertically offset from bottom surfaces of conductive contacts.

The high voltage transistor device 3600 comprises a metal gate structure 3602 arranged over a semiconductor substrate 102 between a source region 104 and a drain region 106. The metal gate structure 3602 comprises a metal gate electrode 3604 separated from the substrate by a gate dielectric 3606. In some embodiments, the metal gate electrode 3604 may comprise aluminum, ruthenium, palladium, hafnium, zirconium, titanium, or the like. In some embodiments, the gate dielectric 3606 comprises a high-k dielectric, such as hafnium oxide, hafnium silicon oxide, hafnium tantalum oxide, aluminum oxide, zirconium oxide, or the like.

A contact etch stop layer (CESL) 406 is disposed over the semiconductor substrate 102. The CESL 406 has an uppermost surface 406u that is laterally adjacent to the metal gate structure 3602. A first ILD layer 3402 is disposed over the CESL 406. In some embodiments, the metal gate structure 3602, the CESL 406, and the first ILD layer 3402 have uppermost surfaces that are substantially planar (e.g., planar within a tolerance of a chemical mechanical planarization process). A second ILD layer 3406 is disposed over the first ILD layer 3402. The second ILD layer 3406 contacts the upper surfaces of the metal gate structure 3602, the CESL 406, and the first ILD layer 3402.

A field plate etch stop structure 3404 is disposed over an uppermost surface of the first ILD layer 3402 at a position that is laterally between the metal gate structure 3602 and the drain region 106. The field plate etch stop structure 3404 has a bottom surface that is disposed along a horizontal plane extending along uppermost surfaces of the metal gate structure 3602, the CESL 406, and the first ILD layer 3402. In some embodiments (not shown), the first ILD layer 3402 may be recessed between an outermost sidewall of the field plate etch stop structure 3404 and the CESL 406. A field plate 122 is over the field plate etch stop structure 3404. The field plate 122 extends from a top of the second ILD layer 3406 to the field plate etch stop structure 3404, such that a bottommost surface of the field plate 122 is over a top of the metal gate structure 3602.

Figure 37:
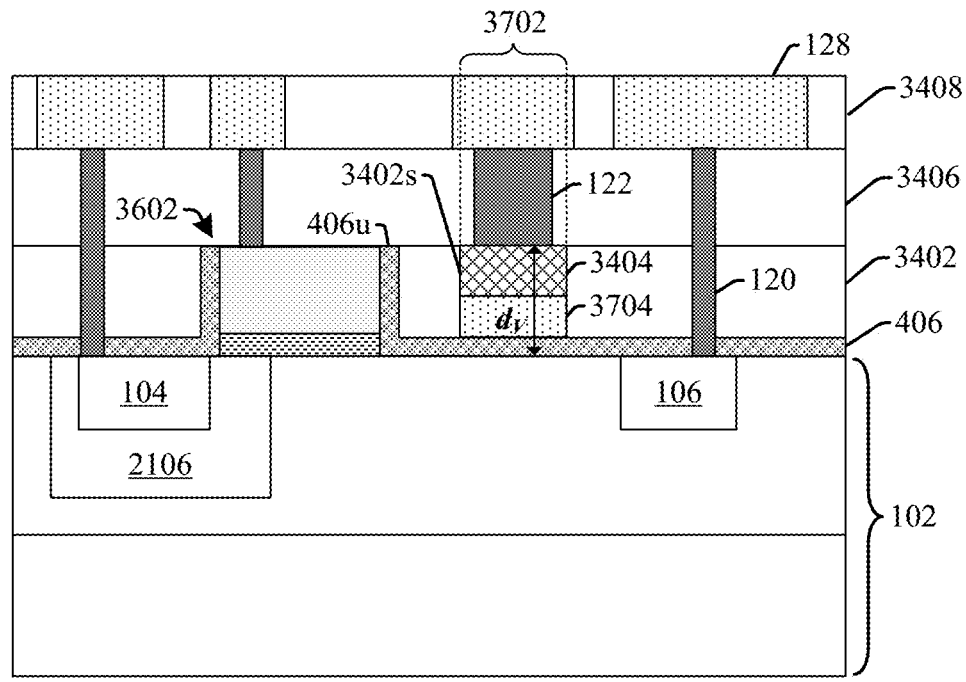

FIG. 37 illustrates a cross-sectional view of some additional embodiments of a high voltage transistor device 3700 having a field plate etch stop structure defining a field plate comprising a bottom surface that is vertically offset from bottom surfaces of conductive contacts.

The high voltage transistor device 3700 comprises a metal gate structure 3602 arranged over a semiconductor substrate 102 between a source region 104 and a drain region 106. A CESL 406 is disposed over the semiconductor substrate 102 and has an uppermost surface 406u that is laterally adjacent to the metal gate structure 3602. A first ILD layer 3402 is disposed over the CESL 406. A second ILD layer 3406 is disposed over the first ILD layer 3402. The second ILD layer 3406 contacts uppermost surfaces of the metal gate structure 3602, the CESL 406, and the first ILD layer 3402.

The first ILD layer 3402 has sidewalls 3402s that define a cavity 3702 within the first ILD layer 3402 that is between the metal gate structure 3602 and the drain region 106. In some embodiments, the sidewalls 3402s extend from the uppermost surface of the first ILD layer 3402 to the CESL 406, so that a bottom of the cavity 3702 is defined by the CESL 406.

In some embodiments, a dielectric material 3704 is disposed within the cavity 3702 and a field plate etch stop structure 3404 is disposed within the cavity 3702 over the dielectric material 3704. In some embodiments, the dielectric material 3704 may comprise an oxide (e.g., silicon oxide), a nitride, or the like. In some other embodiments, wherein the field plate etch stop structure 3404 is a dielectric, the dielectric material 3704 may be omitted (e.g., so that the field plate etch stop structure 3404 contacts the CESL 406). A second ILD layer 3406 is disposed over the first ILD layer 3402 and a field plate 122 is over the field plate etch stop structure 3404. The field plate 122 is laterally surrounded by the second ILD layer 3406. The field plate 122 extends from a top of the second ILD layer 3406 to the field plate etch stop structure 3404.

In some embodiments, the field plate etch stop structure 3404 extends from a top of the dielectric material 3704 to a top of the first ILD layer 3402. In such embodiments, a bottom of the field plate 122 is separated from the semiconductor substrate 102 by a distance $d_V$ defined by the dielectric material 3704, the field plate etch stop structure 3404, and the CESL 406. In some embodiments, the distance $d_V$ is substantially equal to a thickness of the first ILD layer 3402.

Figure 38:
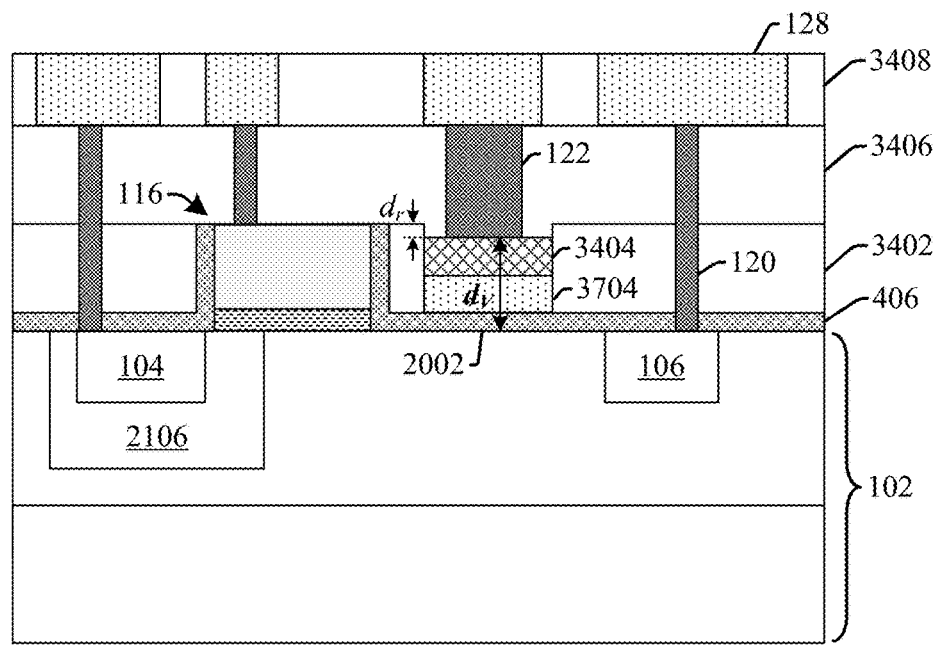

In other embodiments, shown in cross-sectional view 3800 of FIG. 38, the field plate etch stop structure 3404 has an uppermost surface that is recessed below an uppermost surface of the first ILD layer 3402 by a non-zero distance $d_r$.

Recessing the field plate etch stop structure 3404 below the uppermost surface of the first ILD layer 3402 allows for the distance $d_f$ between the bottommost surface of the field plate 122 and the semiconductor substrate 102 to be decreased below a thickness of the first ILD layer 3402.

Figure 39:
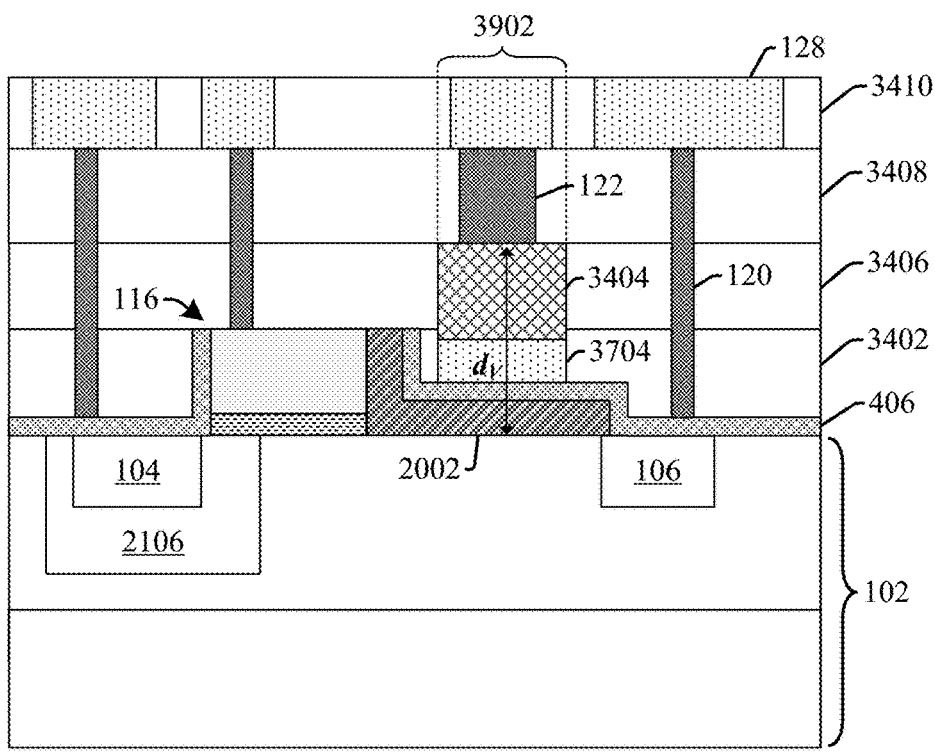

FIG. 39 illustrates a cross-sectional view of some additional embodiments of a high voltage transistor device 3900 having a field plate etch stop structure defining a field plate comprising a bottom surface that is vertically offset from bottom surfaces of conductive contacts.

The high voltage transistor device 3900 comprises an RPO 2002 disposed laterally between the metal gate structure 3602 and the CESL 406 and vertically between the semiconductor substrate 102 and the CESL 406. A first ILD layer 3402 is disposed over the CESL 406, and a second ILD layer 3406 is disposed over the first ILD layer 3402. The second ILD layer 3406 contacts uppermost surfaces of the metal gate structure 3602, the CESL 406, and the first ILD layer 3402.

Sidewalls of the first ILD layer 3402 and the second ILD layer 3406 define a cavity 3902 that vertically extends from a top of the second ILD layer 3406 to the CESL 406 and that is laterally between the metal gate structure 3602 and the drain region 106. A dielectric material 3704 is disposed within the cavity 3902 and a field plate etch stop structure 3404 is disposed within the cavity 3902 over the dielectric material 3704. In some embodiments, the field plate etch stop structure 3404 extends from a top of the dielectric material 3704 to a top of the second ILD layer 3406. In other embodiments (not shown), the field plate etch stop structure 3404 may have an uppermost surface that is recessed below a top of the second ILD layer 3406.

A third ILD layer 3408 is disposed over the second ILD layer 3406. A field plate 122 extends through the third ILD layer 3408 to the field plate etch stop structure 3404. A bottommost surface of the field plate 122 is vertically separated from the semiconductor substrate 102 by a non-zero distance $d_v$. Using both the first ILD layer 3402 and the second ILD layer 3406 to define the cavity 3902 allows for a greater range of the non-zero distance $d_v$.

FIGS. 40-50 illustrate cross-sectional views 4000-5000 of some embodiments showing a method of forming a high voltage transistor device having a field plate etch stop structure defining a field plate comprising a bottom surface that is vertically offset from bottom surfaces of conductive contacts. Although the cross-sectional views 4000-5000 shown in FIGS. 40-50 are described with reference to a method, it will be appreciated that the structures shown in FIGS. 40-50 are not limited to the method but rather may stand alone separate of the method.

Figure 40:
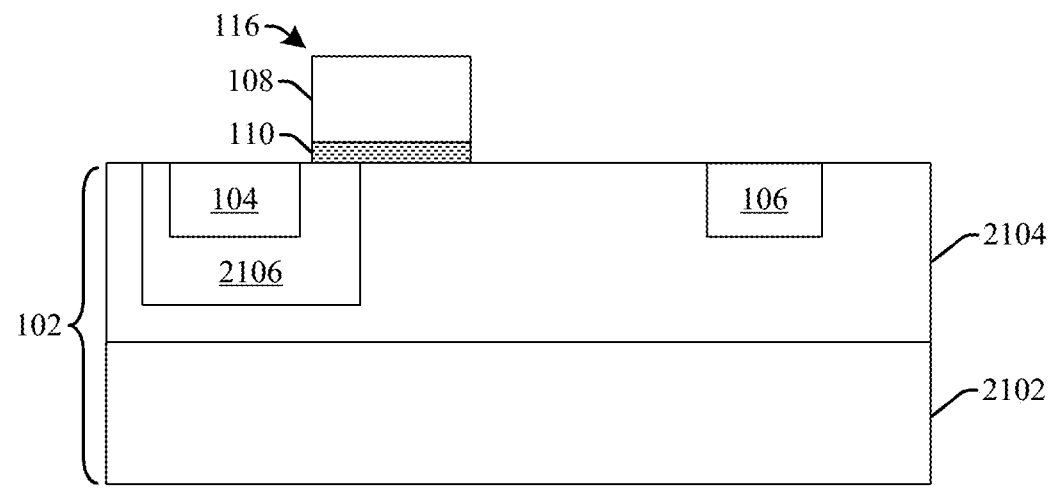
FIGS. 40-50 illustrate cross-sectional views of some embodiments showing a method of forming a high voltage transistor device having a field plate etch stop structure defining a field plate comprising a bottom surface that is vertically offset from bottom surfaces of conductive contacts.

As shown in cross-sectional view 4000 of FIG. 40, a semiconductor substrate 102 is selectively implanted to form a plurality of implantation regions (e.g., well regions, contact regions, etc.). In some embodiments, the semiconductor substrate 102 may be selectively implanted to form a body region 2106, a drift region 2104, a source region 104, and a drain region 106. In other embodiments, the semiconductor substrate 102 may be selectively implanted to form different implantation regions (e.g., such as any of those illustrated in FIGS. 1-10). In some embodiments, the plurality of implantation regions may be formed by selectively masking the semiconductor substrate 102 (e.g., using a photoresist mask) and then introducing high-energy dopants (e.g., p-type dopant species such as boron or n-type dopants such as phosphorous) into exposed areas of the semiconductor substrate 102.

A gate structure 116 having a gate dielectric layer 110 and a gate electrode material 108 is formed over the semiconductor substrate 102 between the source region 104 and the drain region 106. The gate structure 116 may be formed by depositing a gate dielectric layer over the semiconductor substrate 102, and by depositing a gate electrode material over the gate dielectric layer. The gate dielectric layer and the gate electrode material may be subsequently patterned (e.g., etched according to a photoresist mask and/or a hard mask) to define the gate structure 116.

Figure 41:
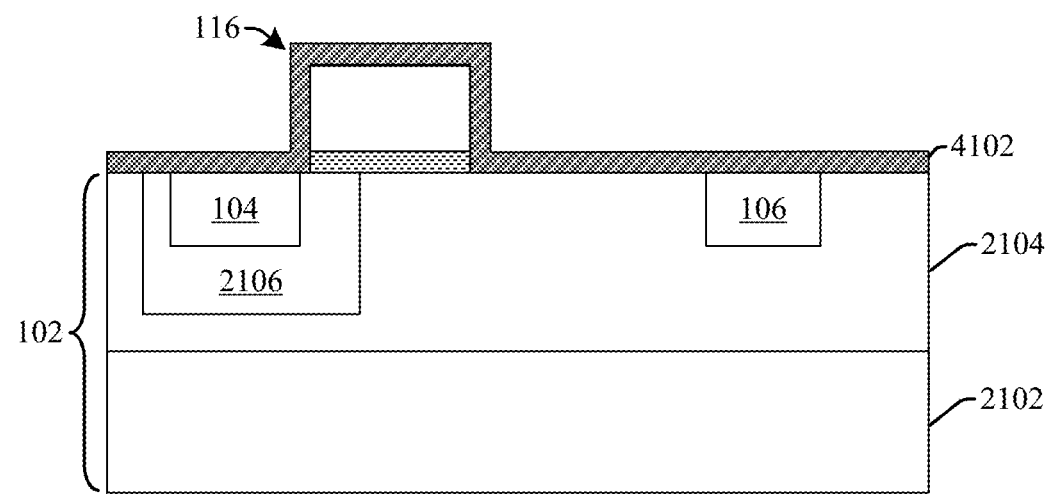

As shown in cross-sectional view 4100 of FIG. 41, a resist protective oxide (RPO) layer 4102 is formed over the gate structure 116. The RPO layer 4102 is configured to block the formation of a silicide on underlying layers. In some embodiments, the RPO layer 4102 may be deposited by a vapor deposition technique (e.g., CVD). In some embodiments, the RPO layer 4102 may comprise silicon dioxide ($SiO_2$), silicon nitride, or the like.

Figure 42:
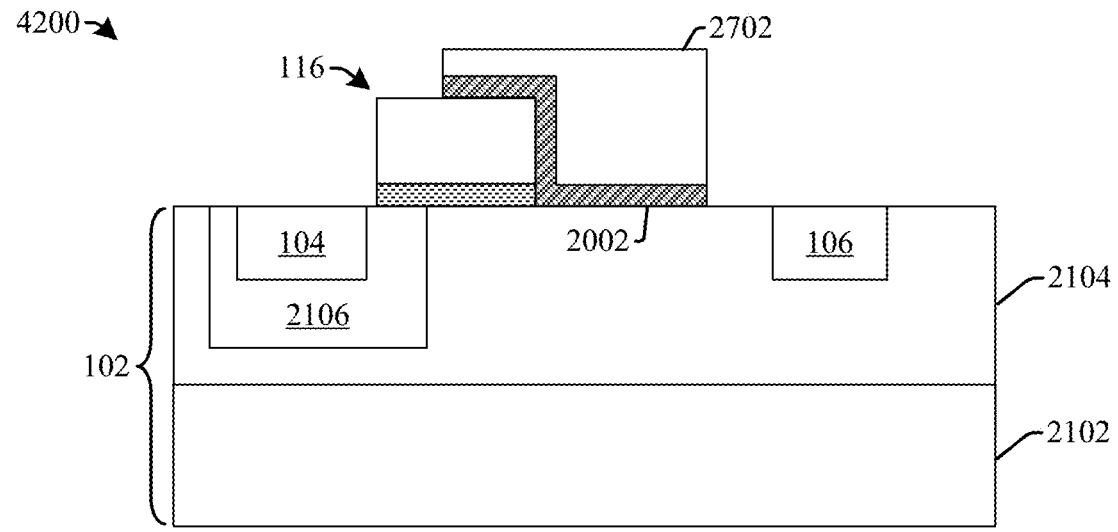

As shown in cross-sectional view 4200 of FIG. 42, the RPO layer (4102 of FIG. 41) is selectively patterned to define an RPO 2002. In some embodiments, selectively patterning the RPO layer causes the RPO 2002 to extend from a first outermost sidewall that is directly over the gate structure 116 to a second outermost sidewall that is laterally between the gate structure 116 and the drain region 106. In some embodiments, the RPO layer may be selectively patterned by forming a masking layer 2702 over the RPO layer and subsequently exposing the RPO layer to an etchant in areas not covered by the masking layer 2702.

Figure 43:
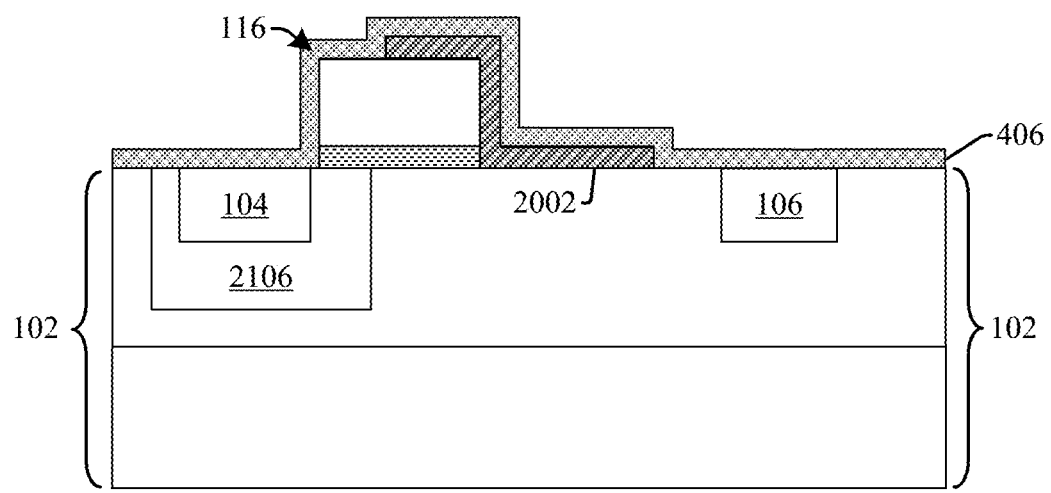

As shown in cross-sectional view 4300 of FIG. 43, a contact etch stop layer (CESL) 406 is formed over the semiconductor substrate 102 and the RPO 2002. In some embodiments, the CESL 406 may be formed by a vapor deposition process. The CESL 406 may comprise a nitride layer (e.g., $Si_3N_4$), a carbide layer (SiC), or the like.

Figure 44:
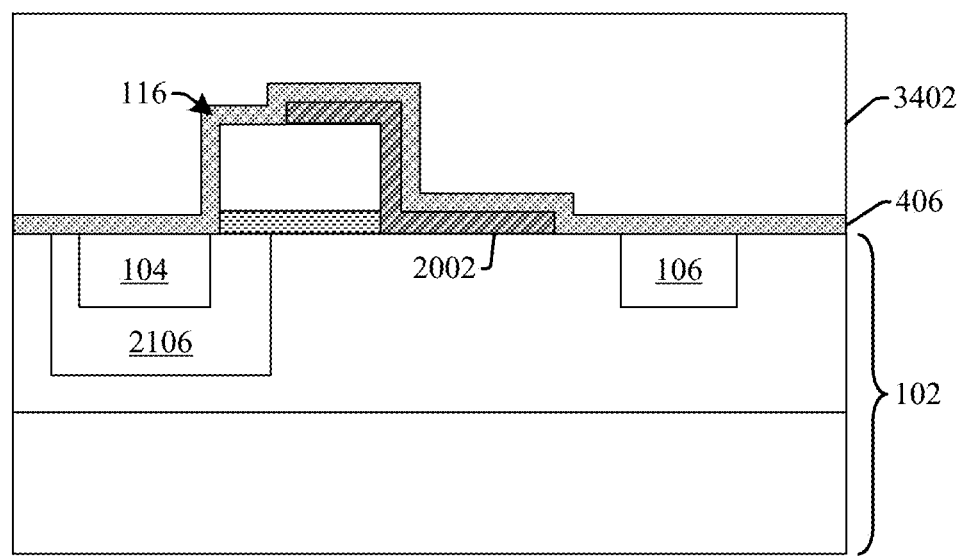

As shown in cross-sectional view 4400 of FIG. 44, a first inter-level dielectric (ILD) layer 3402 is formed over the CESL 406. In some embodiments, the first ILD layer 3402 may comprise an oxide (e.g., $SiO_2$), an ultra-low k dielectric material, a low-k dielectric material (e.g., SiCO), or the like. In some embodiments, the first ILD layer 3402 may be formed by a vapor deposition process.

Figure 45:
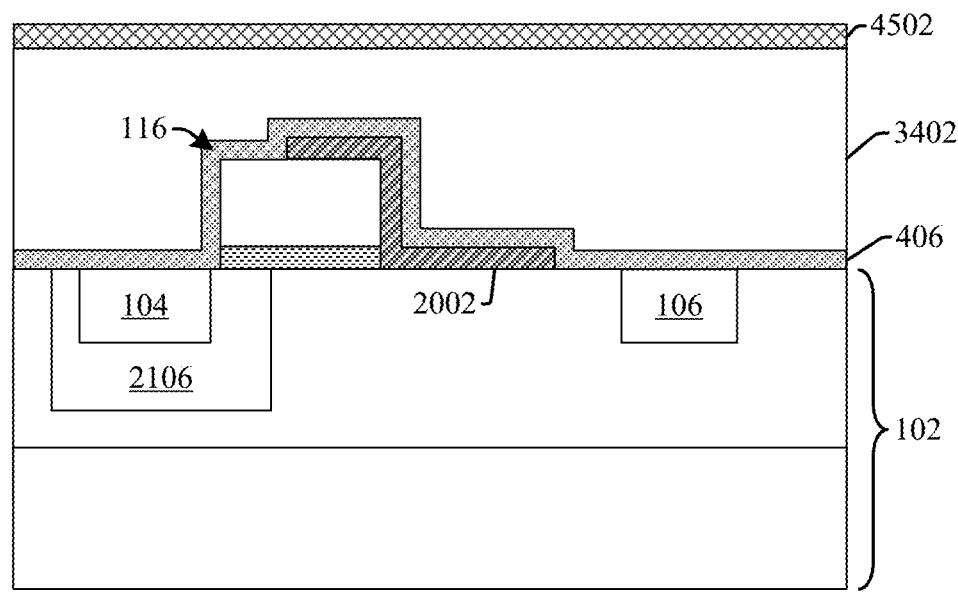

As shown in cross-sectional view 4500 of FIG. 45, a field plate etch stop layer 4502 is formed over the first ILD layer 3402. In various embodiments, the field plate etch stop layer 4502 may comprise silicon nitride ($SiN_x$), silicon oxynitride ($SiO_xN_y$), amorphous silicon (a-Si), hafnium oxide ($HfO_x$), zirconium oxide ($ZrO_x$), a metal-oxide, or the like. In various embodiments, the field plate etch stop layer 4502 may be formed to have a thickness in a range of between approximately 1 nm and approximately 150 nm.

Figure 46:
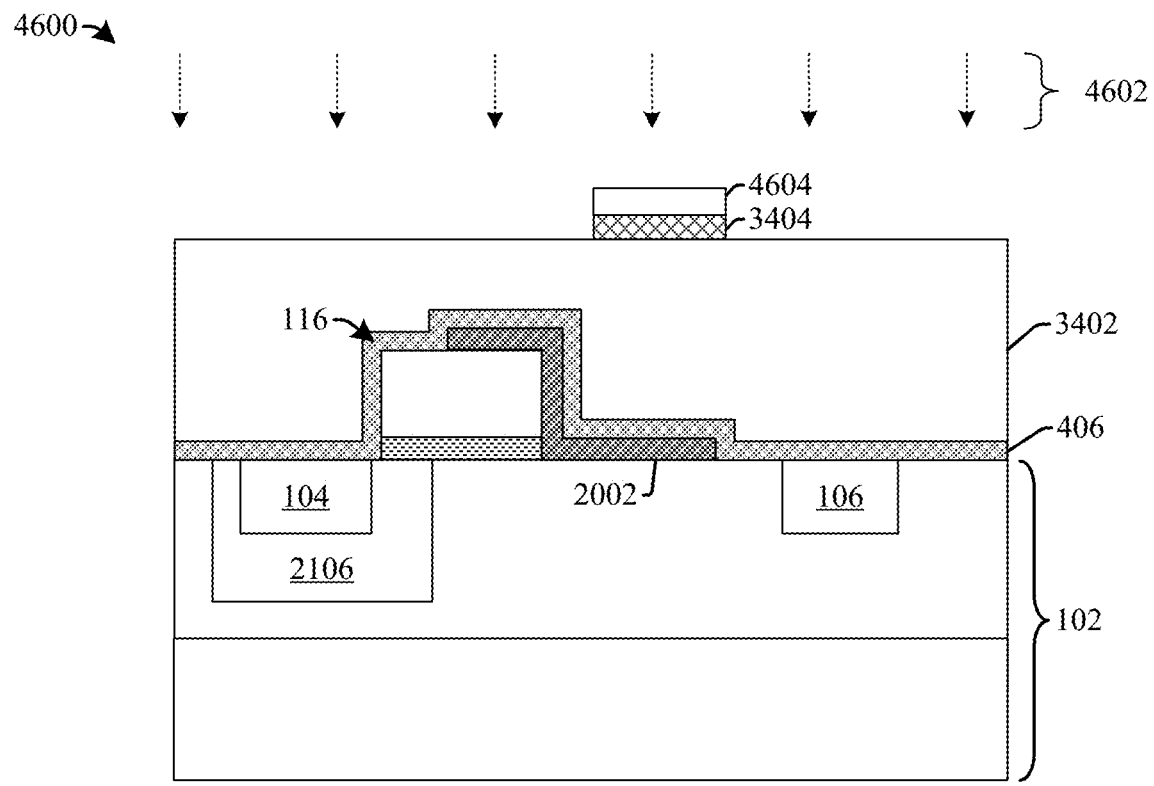

As shown in cross-sectional view 4600 of FIG. 46, the field plate etch stop layer (4502 of FIG. 45) is patterned to define a field plate etch stop structure 3404 over the first ILD layer 3402. In some embodiments, the field plate etch stop layer may be selectively patterned by forming a masking layer 4604 over the field plate etch stop layer and subsequently exposing the field plate etch stop layer to an etchant 4602 in areas not covered by the masking layer 4604. In some embodiments, the etchant 4602 may comprise ions used in an ion bombardment etch. In other embodiments, the etchant 4602 may comprise a plasma etchant (e.g., having a fluorine chemistry, a chlorine chemistry, or the like).

Figure 47:
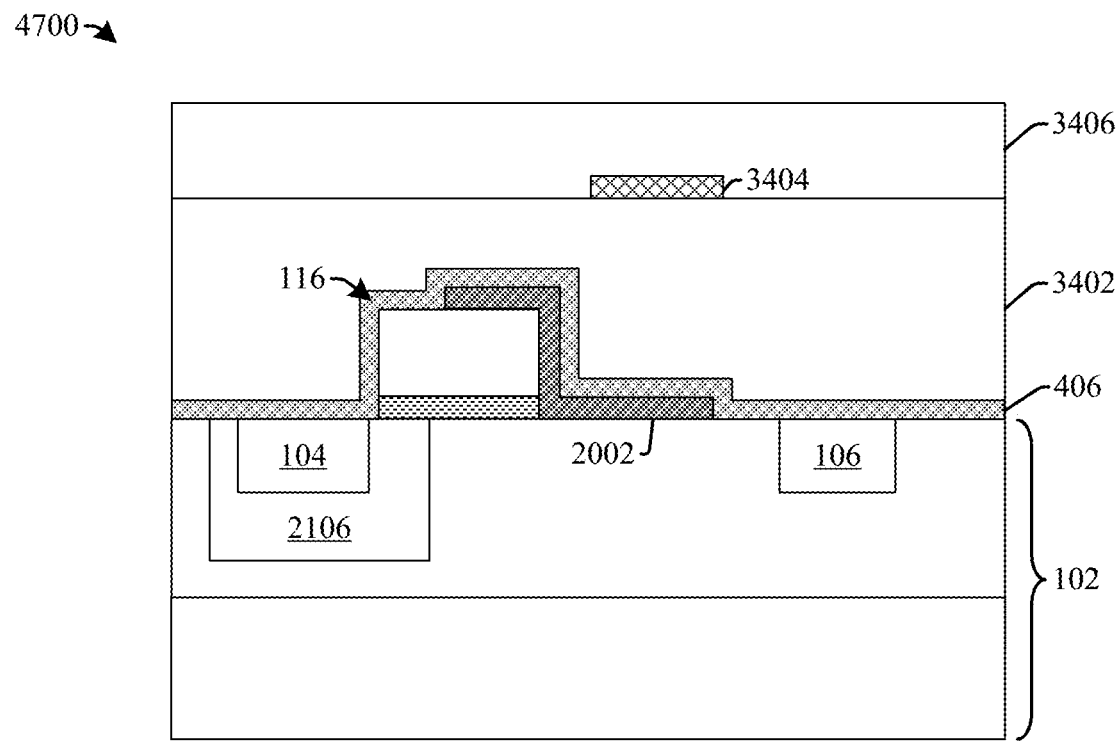

As shown in cross-sectional view 4700 of FIG. 47, a second ILD layer 3406 is formed over the first ILD layer 3402 and the field plate etch stop structure 3404. In some embodiments, the second ILD layer 3406 may comprise an oxide (e.g., SiO$_2$), an ultra-low k dielectric material, a low-k dielectric material (e.g., SiCO), or the like. In some embodiments, the second ILD layer 3406 may be formed by a vapor deposition process. In some embodiments, the second ILD layer 3406 is formed in direct contact with the first ILD layer 3402.

Figure 48:
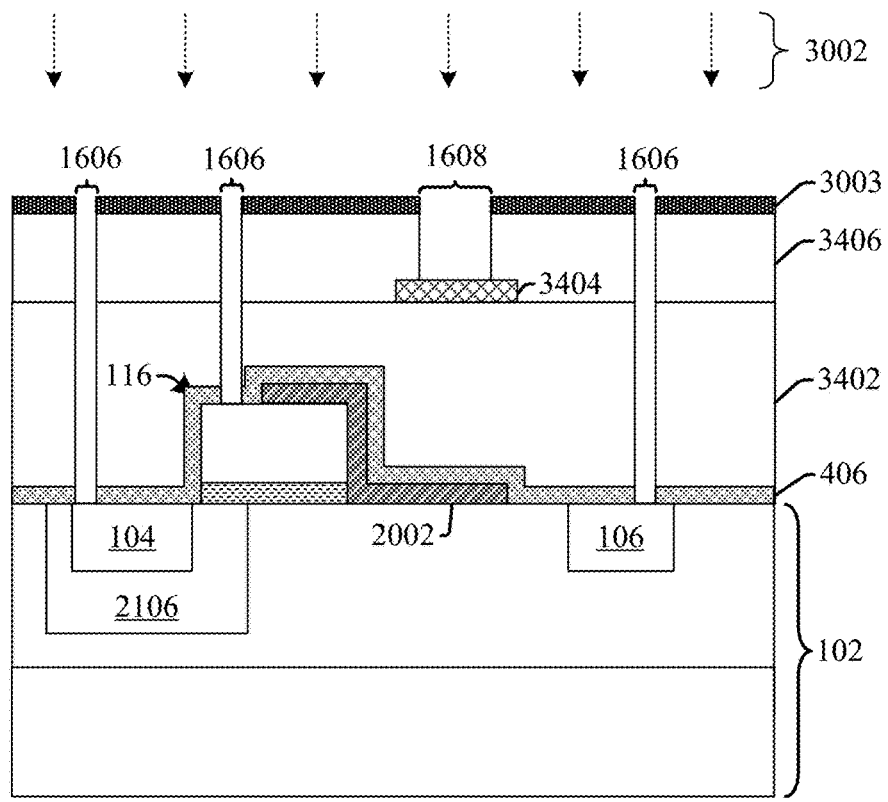

As shown in cross-sectional view 4800 of FIG. 48, an etching process is performed to concurrently define a plurality of contact openings 1606 and a field plate opening 1608. The plurality of contact openings 1606 are defined by sidewalls of the first ILD layer 3402 and the second ILD layer 3406. The resulting field plate opening 1608 is defined by the second ILD layer 3406 and an upper surface of the field plate etch stop structure 3404. The etching process uses an etchant that is highly selective between the field plate etch stop structure 3404 and the first ILD layer 3402 and the second ILD layer 3406 (e.g., the etchant etches the first ILD layer 3402 and the second ILD layer 3406 faster than the field plate etch stop structure 3404), resulting in the contact openings 1606 and the field plate opening 1608 having an etching depth offset of a non-zero distance.

Because thicknesses of deposition processes are typically easier to control than a depth of an etch process, a distance between a bottom of the field plate opening 1608 and the semiconductor substrate 102 can be well controlled (since it is defined by thicknesses of deposition processes used to form the CESL 406, the first ILD layer 3402, and the field plate etch stop structure 3404) to achieve a field plate that has well defined electrical properties (e.g., a well defined breakdown voltage). In some embodiments, the distance between the bottom of the field plate opening 1608 and the semiconductor substrate 102 may be in a range of between approximately 400 Angstroms and approximately 700 Angstroms.

Figure 49:
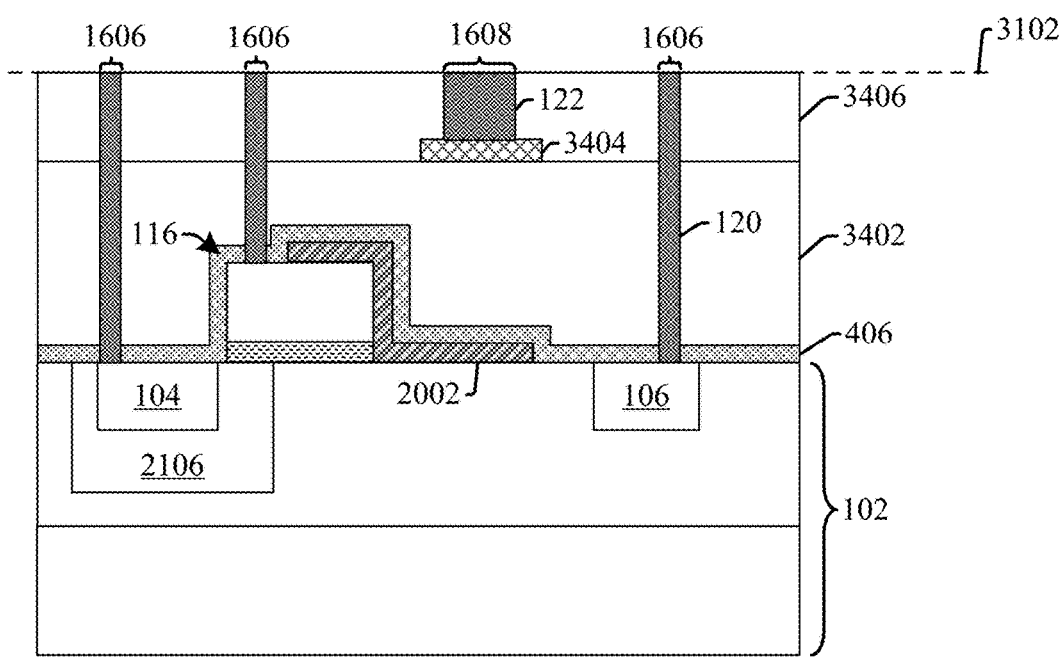

As shown in cross-sectional view 4900 of FIG. 49, the contact openings 1606 and the field plate opening 1608 are filled with one or more conductive materials to define a plurality of contacts 120 and a field plate 122. In some embodiments, the one or more conductive materials may be deposited by way of a deposition technique (e.g., CVD, PVD, PE-CVD, sputtering, etc.) and/or a plating process (e.g., an electroplating or electro-less plating process). A planarization process (e.g., chemical mechanical planarization) may be subsequently performed to remove excess of the one or more conductive materials and to form a planar surface along line 3102. In some embodiments, the one or more conductive materials may comprise tungsten (W), cobalt (Co), titanium (Ti), titanium nitride (TiN), and/or tantalum nitride (TaN), or the like. In some embodiments, a diffusion barrier layer and/or a liner layer may be deposited into the contact openings 1606 and the field plate opening 1608 prior to depositing the one or more conductive materials.

Figure 50:
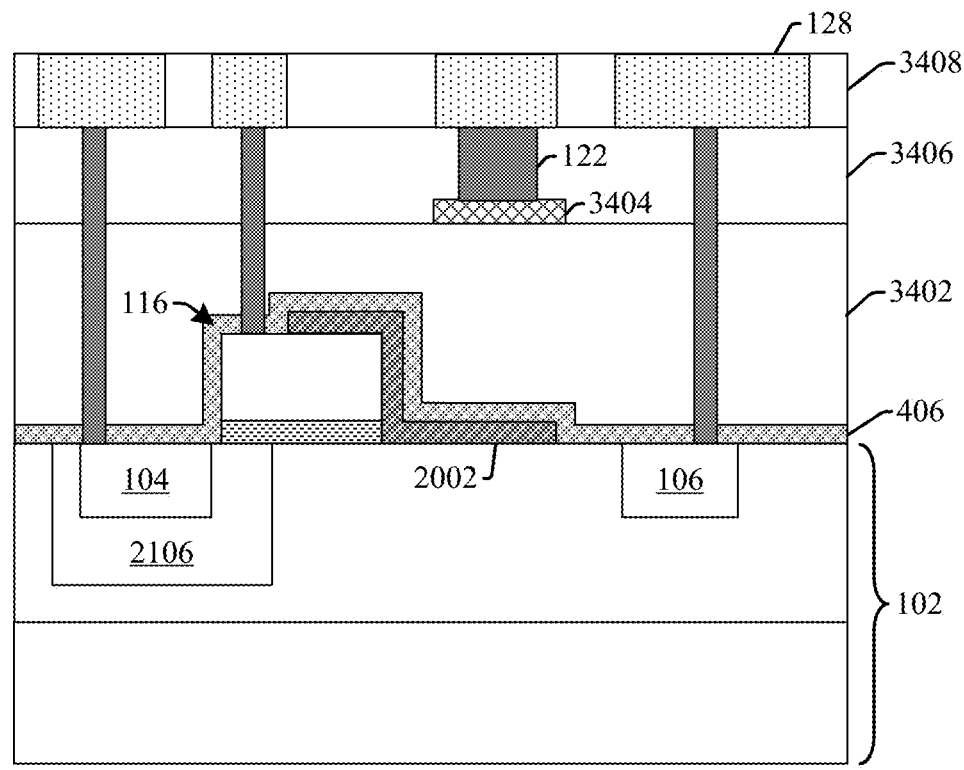

As shown in cross-sectional view 5000 of FIG. 50, a third ILD layer 3408 is formed over the second ILD layer 3406 and a first back-end-of-the-line (BEOL) metal wire layer 128 is formed within the third ILD layer 3408. In various embodiments, the third ILD layer 3408 may be formed by depositing a third ILD material over the second ILD layer 3406. The third ILD layer 3408 is subsequently etched to form trenches extending within the third ILD layer 3408. The trenches are filled with a conductive material and a planarization process (e.g., CMP) is performed to remove excess of the conductive material from over the second ILD layer 3406.

FIGS. 51-65 illustrate cross-sectional views 5100-6500 of some additional embodiments showing a method of forming a high voltage transistor device having a field plate etch stop structure defining a field plate comprising a bottom surface that is vertically offset from bottom surfaces of conductive contacts. Although the cross-sectional views 5100-6500 shown in FIGS. 51-65 are described with reference to a method, it will be appreciated that the structures shown in FIGS. 51-65 are not limited to the method but rather may stand alone separate of the method.

Figure 51:
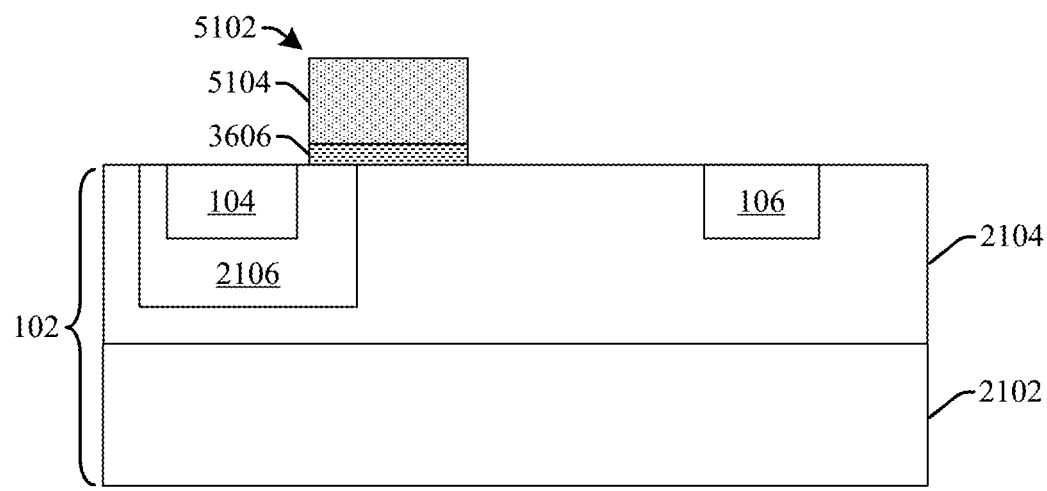
FIGS. 51-65 illustrate cross-sectional views of some additional embodiments showing a method of forming a high voltage transistor device having a field plate etch stop structure defining a field plate comprising a bottom surface that is vertically offset from bottom surfaces of conductive contacts.

As shown in cross-sectional view 5100 of FIG. 51, a semiconductor substrate 102 is selectively implanted to form a plurality of implantation regions (e.g., well regions, contact regions, etc.). In some embodiments, the semiconductor substrate 102 may be selectively implanted to form a body region 2106, a drift region 2104, a source region 104, and a drain region 106. In other embodiments, the semiconductor substrate 102 may be selectively implanted to form different implantation regions (e.g., such as any of those illustrated in FIGS. 1-10).

A sacrificial gate structure 5102 is formed over the semiconductor substrate 102 between the source region 104 and the drain region 106. The sacrificial gate structure 5102 comprises a sacrificial gate electrode 5104. In some embodiments, the sacrificial gate electrode 5104 may comprise polysilicon. In some embodiments, the sacrificial gate structure 5102 may further comprise a gate dielectric 3606 separating the sacrificial gate electrode 5104 from the semiconductor substrate 102. In some embodiments, the gate dielectric 3606 may comprise a high-k dielectric material.

Figure 52:
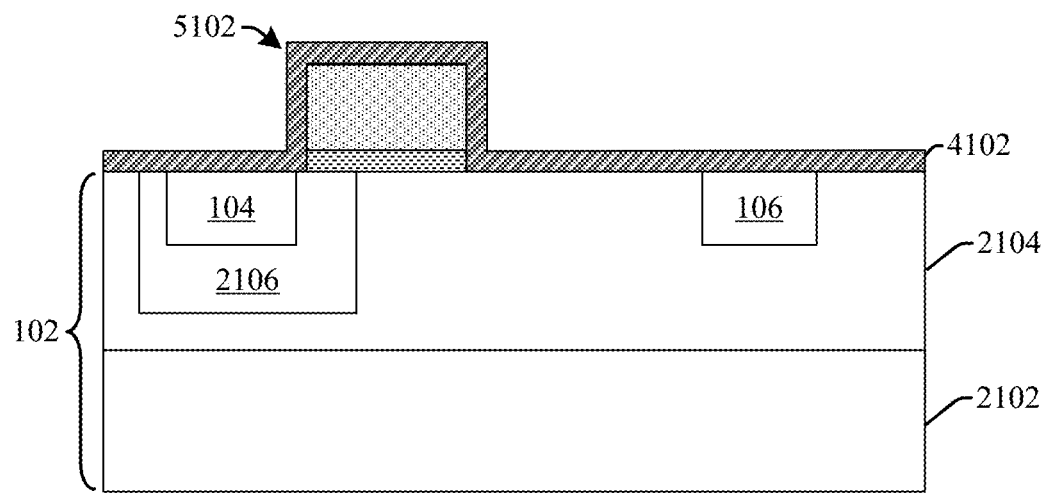

As shown in cross-sectional view 5200 of FIG. 52, a resist protective oxide (RPO) layer 4102 is formed over the sacrificial gate structure 5102. In some embodiments, the RPO layer 4102 may be deposited by a vapor deposition technique (e.g., CVD, PVD, or the like). In some embodiments, the RPO layer 4102 may comprise silicon dioxide (SiO$_2$), silicon nitride, or the like.

Figure 53:
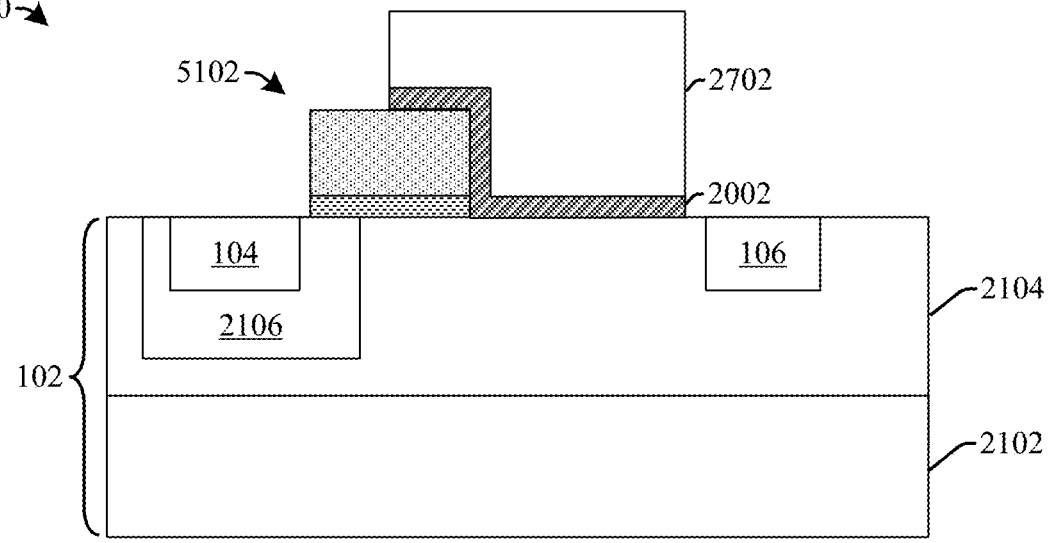

As shown in cross-sectional view 5300 of FIG. 53, the RPO layer (4102 of FIG. 52) is selectively patterned to define an RPO 2002. In some embodiments, selectively patterning the RPO layer causes the RPO 2002 to extend from a first outermost sidewall that is directly over the sacrificial gate structure 5102 to a second outermost sidewall that is laterally between the sacrificial gate structure 5102 and the drain region 106. In some embodiments, the RPO layer may be selectively patterned by forming a masking layer 2702 over the RPO layer and subsequently exposing the RPO layer to an etchant in areas not covered by the masking layer 2702.

Figure 54:
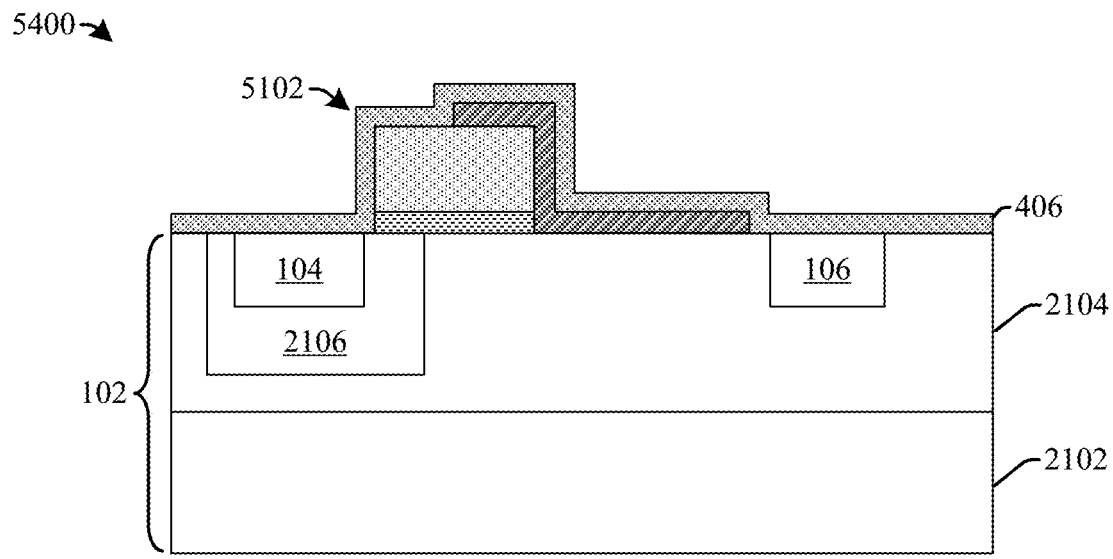

As shown in cross-sectional view 5400 of FIG. 54, a contact etch stop layer (CESL) 406 is formed over the semiconductor substrate 102 and the RPO 2002. In some embodiments, the CESL 406 may be formed by a vapor deposition process. The CESL 406 may comprise a nitride layer (e.g., Si$_3$N$_4$), a carbide layer (SiC), or the like.

Figure 55:
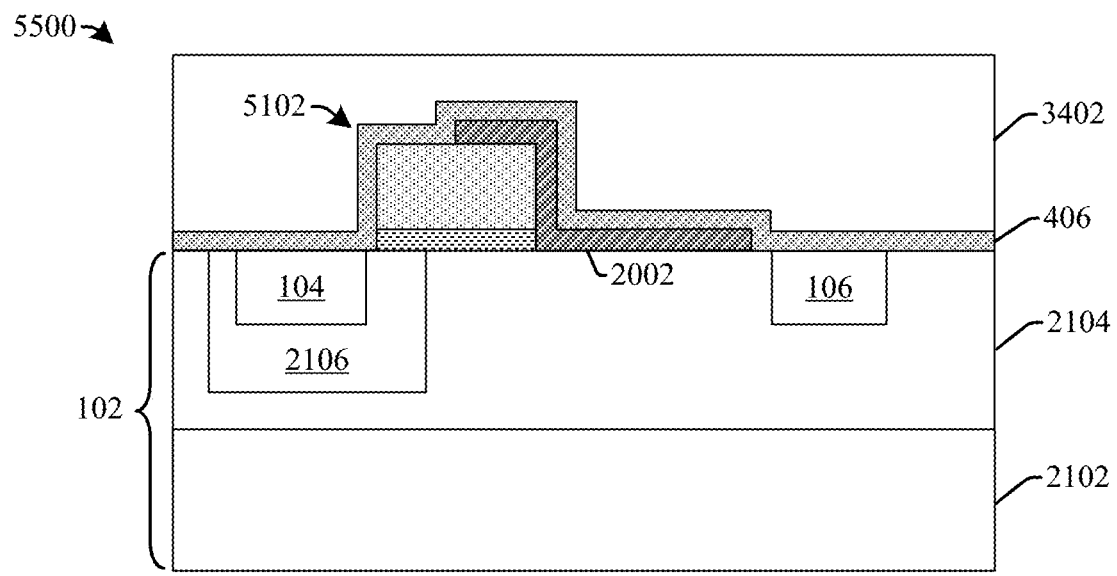

As shown in cross-sectional view 5500 of FIG. 55, a first inter-level dielectric (ILD) layer 3402 is formed over the CESL 406.

Figure 56:
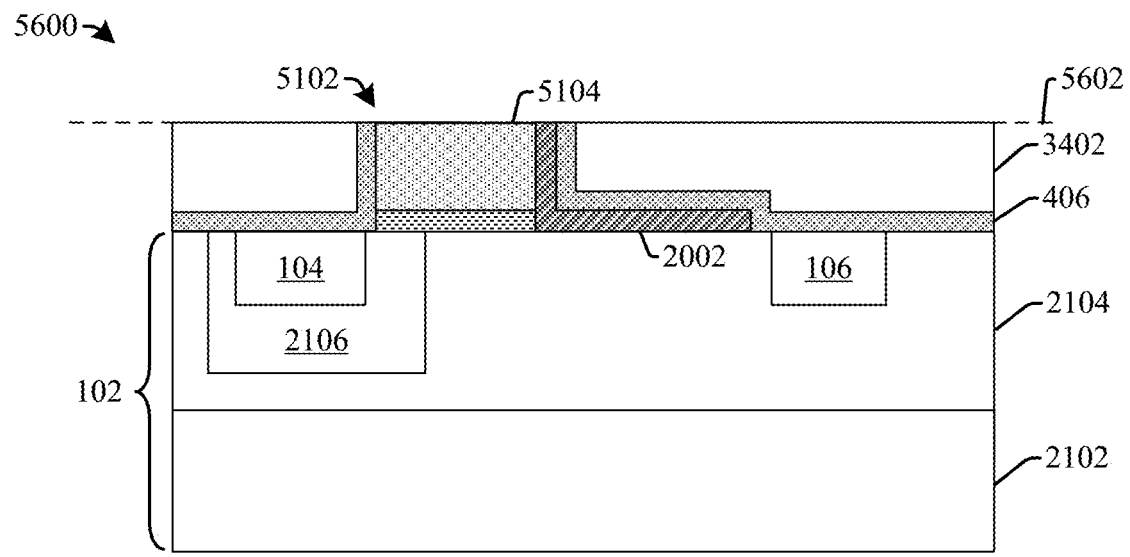

As shown in cross-sectional view 5600 of FIG. 56, a first planarization process is performed along line 5602. The first planarization process removes parts of the first ILD layer 3402, the CESL 406, and the RPO 2002 over the sacrificial gate structure 5102. By removing parts of the first ILD layer 3402, the CESL 406, and the RPO 2002 over the sacrificial gate structure 5102, a top of the sacrificial gate electrode 5104 is exposed.

Figure 57:
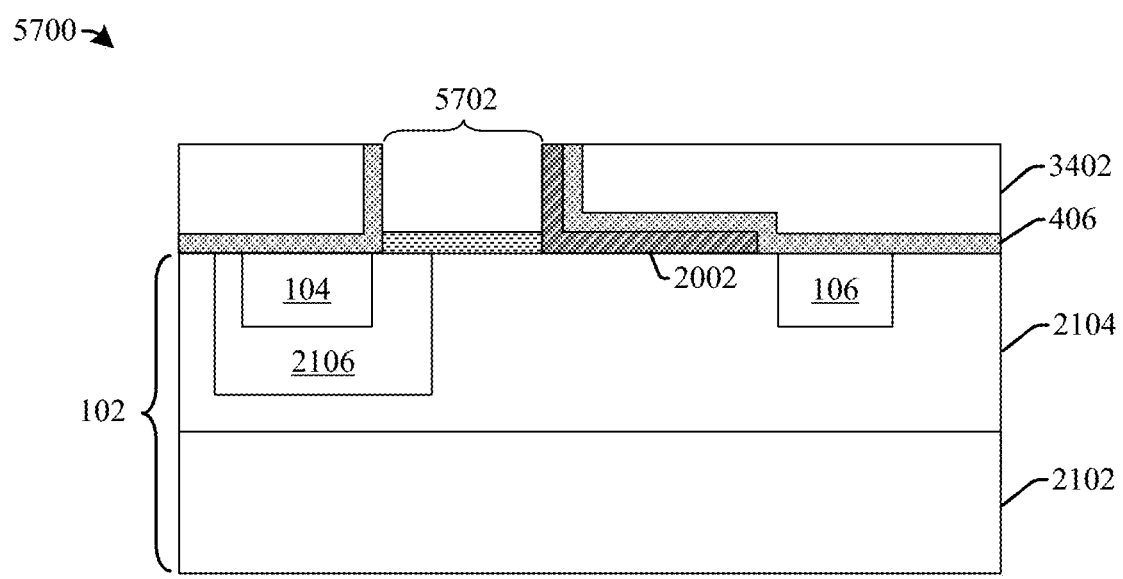

As shown in cross-sectional view 5700 of FIG. 57, the sacrificial gate structure 5102 is removed to form a replacement gate cavity 5702 between sidewalls of the CESL 406.

In some embodiments, the sacrificial gate structure 5102 may be removed using an etchant that is selective with respect to the sacrificial gate structure 5102.

Figure 58:
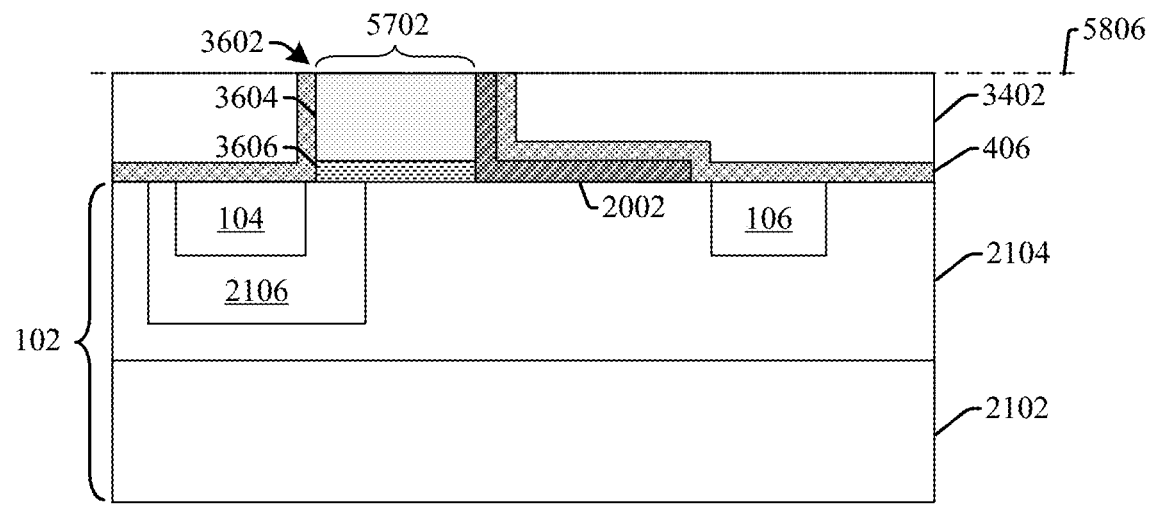

As shown in cross-sectional view 5800 of FIG. 58, a metal gate electrode 3604 is formed within the replacement gate cavity 5702 to define a metal gate structure 3602. In some embodiments, the metal gate electrode 3604 may be formed by depositing a conductive material (e.g., aluminum, tantalum, nickel, molybdenum, or the like) within the replacement gate cavity 5702 using a deposition process (e.g., CVD, PE-CVD, PVD, ALD, sputtering, or the like). In some embodiments (not shown), one or more gate dielectrics may be formed in the replacement gate cavity 5702 prior to the deposition of the conductive material. A second planarization process (e.g., CMP process) is performed (along line 5806) after depositing a conductive material within the replacement gate cavity 5702. The second planarization process removes the conductive material from over the first ILD layer 3402 to define the metal gate electrode 3604.

Figure 59:
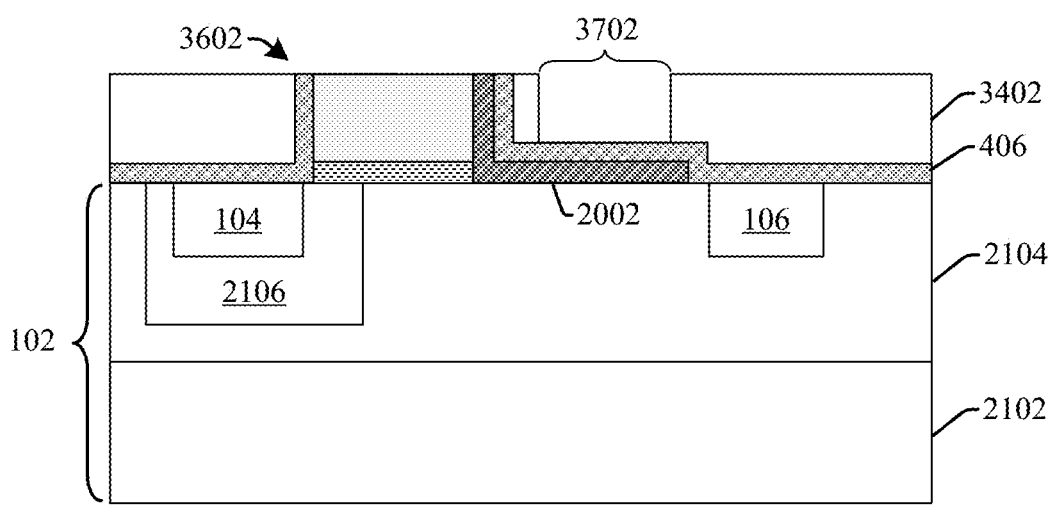

As shown in cross-sectional view 5900 of FIG. 59, an etching process is performed to define a cavity 3702 within the first ILD layer 3402 between the metal gate structure 3602 and the drain region 106. The cavity 3702 is defined by sidewalls of the first ILD layer 3402 and by an upper surface of the CESL 406. In some embodiments, the cavity 3702 may be defined forming a masking layer (not shown) over the first ILD layer 3402 and subsequently exposing the first ILD layer 3402 to an etchant in areas not covered by the masking layer.

Figure 60:
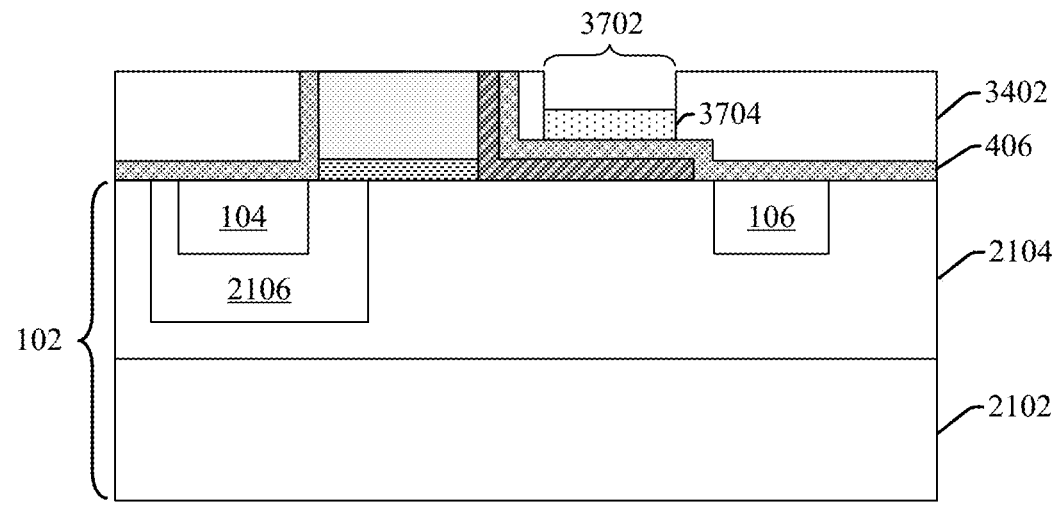

As shown in cross-sectional view 6000 of FIG. 60, a dielectric material 3704 is formed within the cavity 3702. In some embodiments, the dielectric material 3704 may comprise an oxide (e.g., silicon oxide), a nitride, or the like. In some embodiments, the dielectric material 3704 may be formed by a deposition process (e.g., CVD, PE-CVD, PVD, ALD, or the like) followed chemical mechanical planarization (CMP) process and/or an etch process to remove the dielectric material from outside of the cavity 3702.

Figure 61:
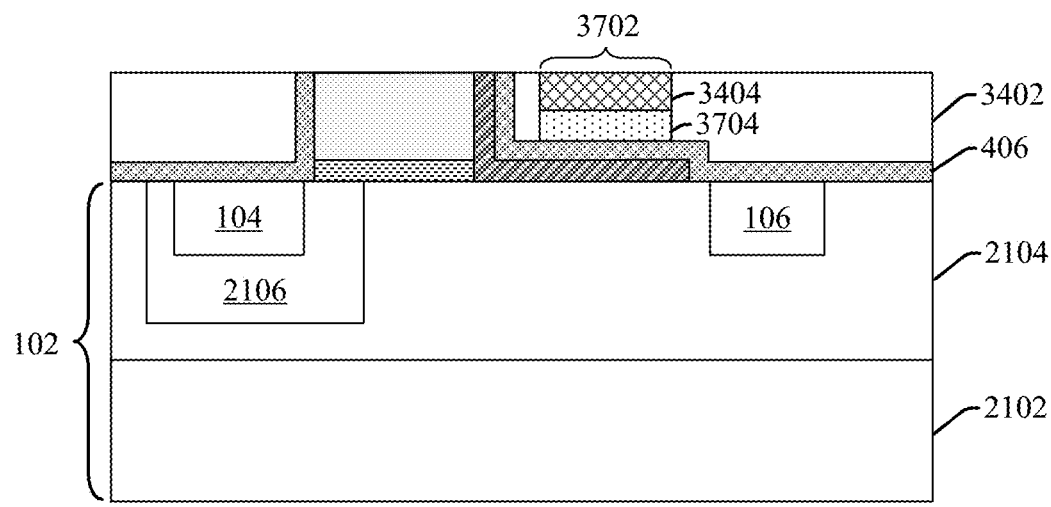

As shown in cross-sectional view 6100 of FIG. 61, a field plate etch stop structure 3404 is formed within the cavity 3702 over the dielectric material 3704. In various embodiments, the field plate etch stop structure 3404 may comprise silicon nitride ($SiN_x$), silicon oxynitride ($SiO_xN_y$), amorphous silicon (a-Si), hafnium oxide ($HfO_x$), zirconium oxide ($ZrO_x$), a metal-oxide, or the like. In various embodiments, the field plate etch stop structure 3404 may be formed to have a thickness in a range of between approximately 1 nm and approximately 150 nm. In some embodiments, the field plate etch stop structure 3404 may be formed by depositing a field plate etch stop material (e.g., silicon nitride, amorphous silicon, a metal-oxide, or the like) followed by a chemical mechanical planarization (CMP) process and/or an etching process to remove the dielectric material and/or the field plate etch stop material from outside of the cavity 3702.

Figure 62:
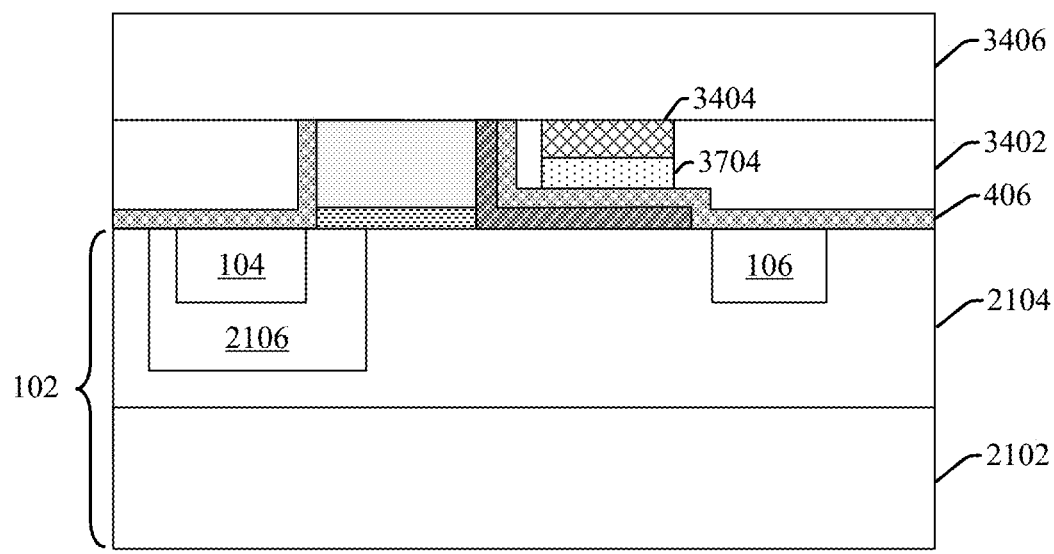

As shown in cross-sectional view 6200 of FIG. 62, a second ILD layer 3406 is formed over the first ILD layer 3402 and the field plate etch stop structure 3404.

Figure 63:
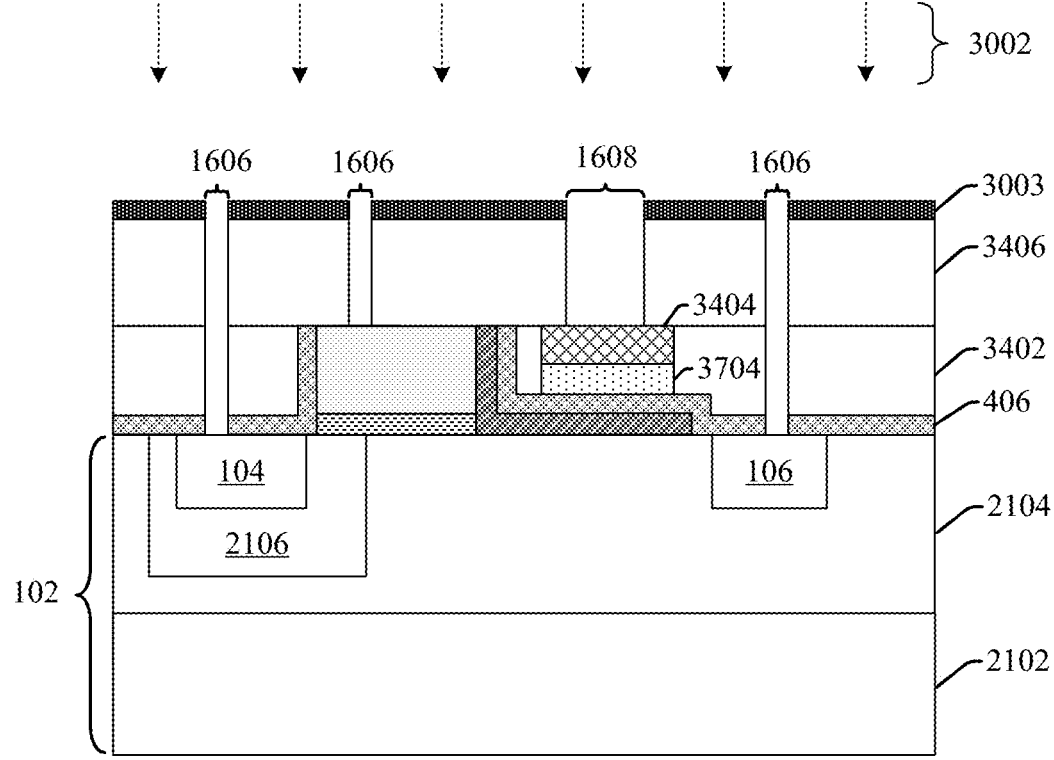

As shown in cross-sectional view 6300 of FIG. 63, an etching process is performed to concurrently define a plurality of contact openings 1606 and a field plate opening 1608. In some embodiments, the etching process exposes an upper surface of the second ILD layer 3406 to an etchant 3002 in areas not covered by a masking layer 3003 to define the plurality of contact openings 1606 and the field plate opening 1608. The plurality of contact openings 1606 are defined by sidewalls of the first ILD layer 3402 and the second ILD layer 3406. The field plate opening 1608 is defined by sidewalls of the second ILD layer 3406 and an upper surface of the field plate etch stop structure 3404. The contact openings 1606 and the field plate opening 1608 have an etching depth offset of a non-zero distance. In some embodiments, the non-zero distance may be in a range of between approximately 400 Angstroms and approximately 700 Angstroms.

Figure 64:
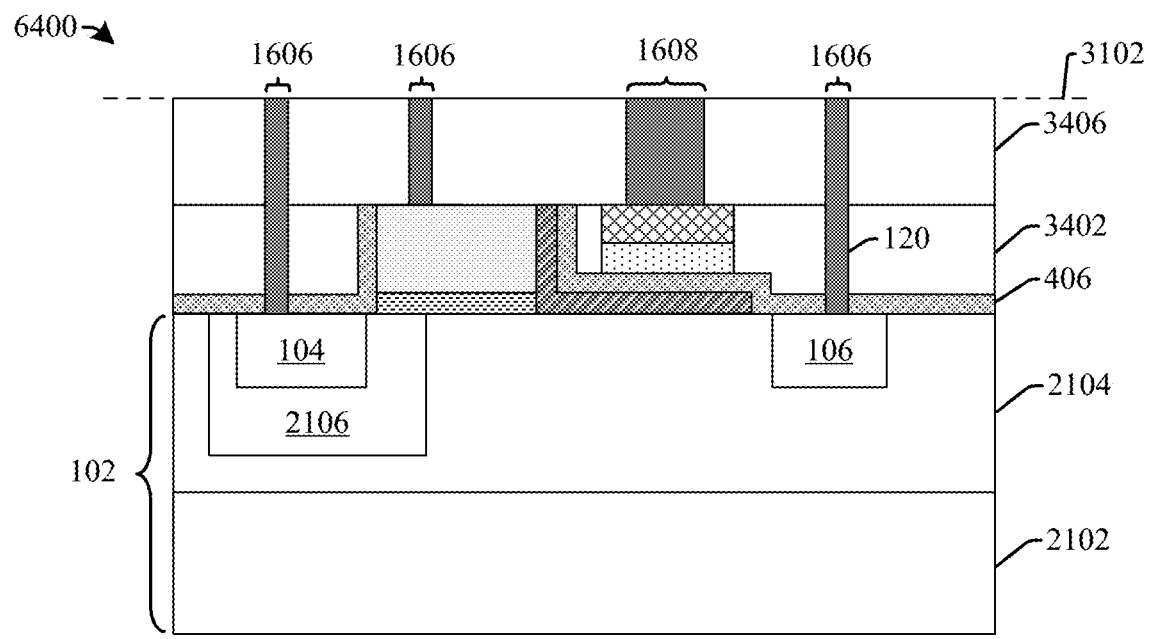

As shown in cross-sectional view 6400 of FIG. 64, the contact openings 1606 and the field plate opening 1608 are filled with one or more conductive materials. In some embodiments, the one or more conductive materials may be deposited by way of a vapor deposition technique (e.g., CVD, PVD, PE-CVD, sputtering, etc.) and/or a plating process (e.g., an electroplating or electro-less plating process). A planarization process (e.g., chemical mechanical planarization) may be subsequently performed to remove excess of the one or more conductive materials and to form a planar surface along line 3102.

Figure 65:
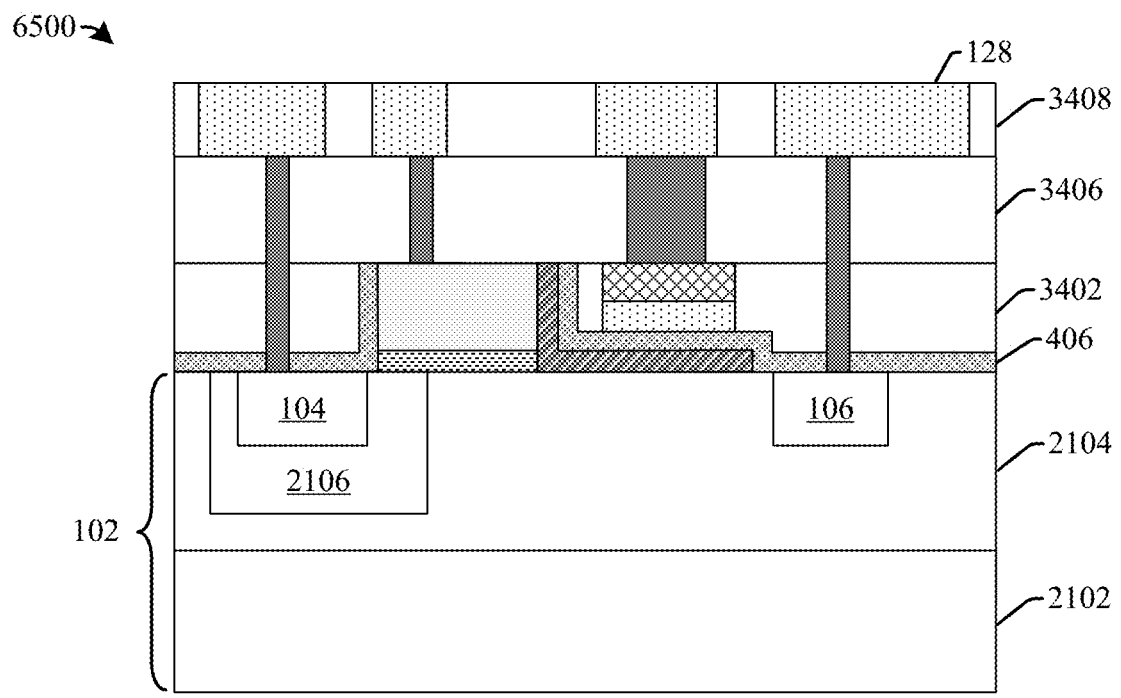

As shown in cross-sectional view 6500 of FIG. 65, a third ILD layer 3408 is formed over the second ILD layer 3406 and a first back-end-of-the-line (BEOL) metal wire layer 128 is formed within the third ILD layer 3408.

FIGS. 66-76 illustrate cross-sectional views 6600-7600 of some additional embodiments showing a method of forming a high voltage transistor device having a field plate etch stop structure defining a field plate comprising a bottom surface that is vertically offset from bottom surfaces of conductive contacts. Although the cross-sectional views 6600-7600 shown in FIGS. 66-76 are described with reference to a method, it will be appreciated that the structures shown in FIGS. 66-76 are not limited to the method but rather may stand alone separate of the method.

Figure 66:
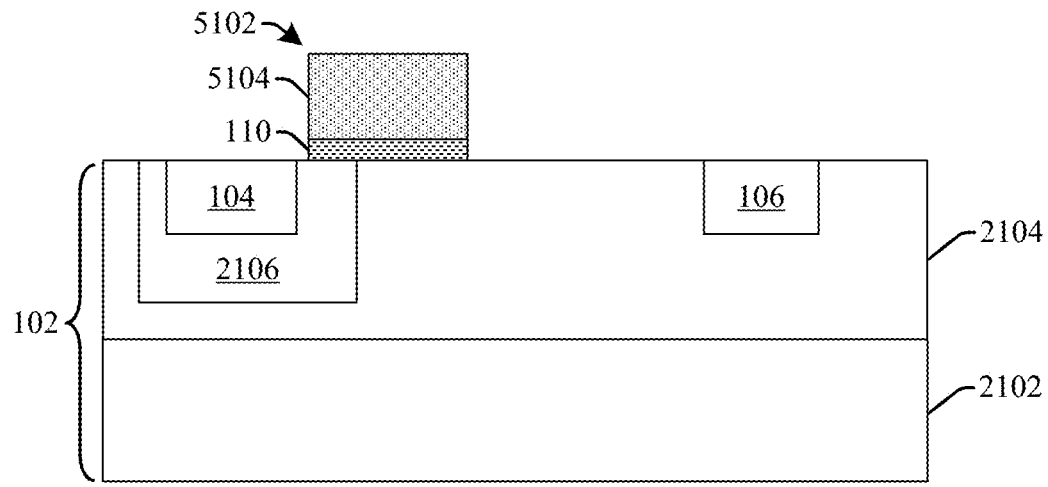
FIGS. 66-76 illustrate cross-sectional views of some additional embodiments showing a method of forming a high voltage transistor device having a field plate etch stop structure defining a field plate comprising a bottom surface that is vertically offset from bottom surfaces of conductive contacts.

As shown in cross-sectional view 6600 of FIG. 66, a semiconductor substrate 102 is selectively implanted to form a plurality of implantation regions (e.g., well regions, contact regions, etc.). In some embodiments, the semiconductor substrate 102 may be selectively implanted to form a body region 2106, a drift region 2104, a source region 104, and a drain region 106. In other embodiments, the semiconductor substrate 102 may be selectively implanted to form different implantation regions (e.g., such as any of those illustrated in FIGS. 1-10).

A sacrificial gate structure 5102 is formed over the semiconductor substrate 102 between the source region 104 and the drain region 106. The sacrificial gate structure 5102 comprises a sacrificial gate electrode 5104. In some embodiments, the sacrificial gate electrode 5104 may comprise polysilicon. In some embodiments, the sacrificial gate structure 5102 may further comprise a gate dielectric 3606 separating the sacrificial gate electrode 5104 from the semiconductor substrate 102. In some embodiments, the gate dielectric 3606 may comprise a high-k dielectric material.

Figure 67:
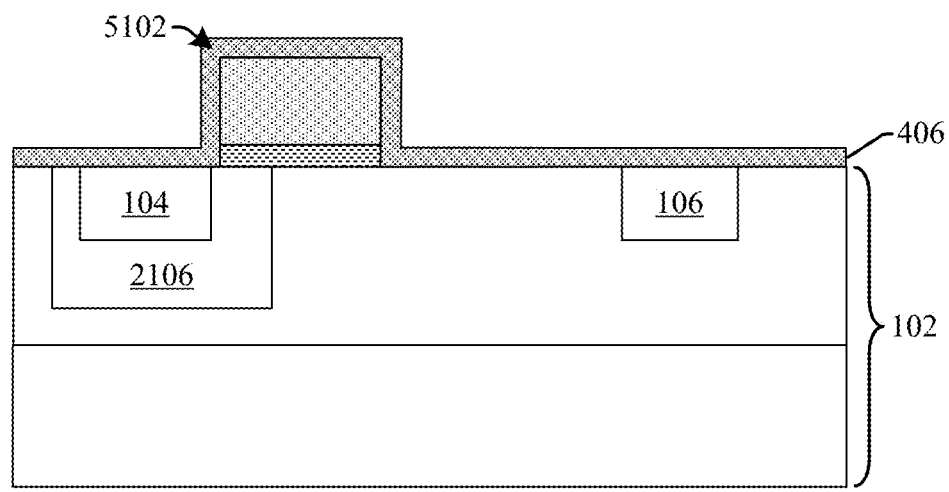

As shown in cross-sectional view 6700 of FIG. 67, a contact etch stop layer (CESL) 406 is formed over the semiconductor substrate 102 and the sacrificial gate structure 5102. In some embodiments, the CESL 406 may be formed by a vapor deposition process. The CESL 406 may comprise a nitride layer (e.g., $Si_3N_4$), a carbide layer (SiC), or the like.

Figure 68:
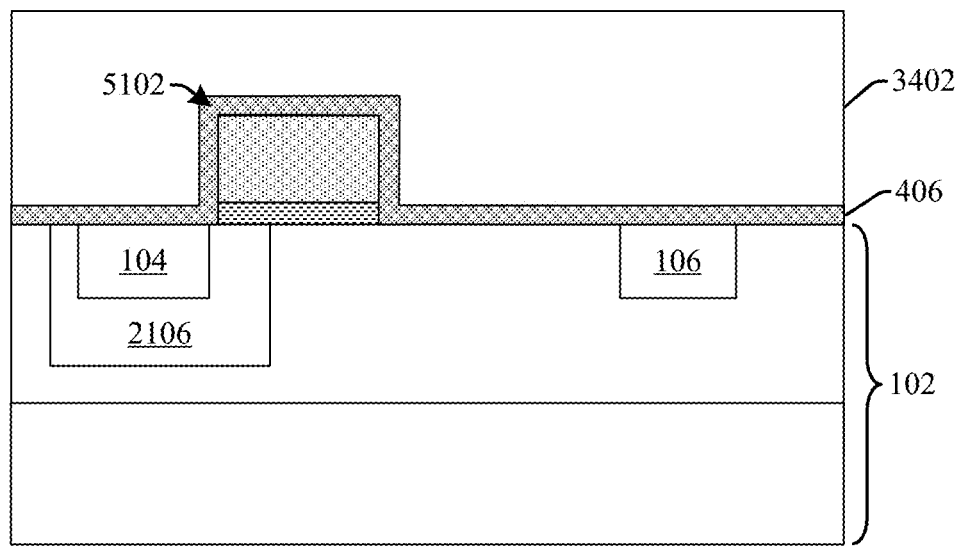

As shown in cross-sectional view 6800 of FIG. 68, a first inter-level dielectric (ILD) layer 3402 is formed over the CESL 406.

Figure 69:
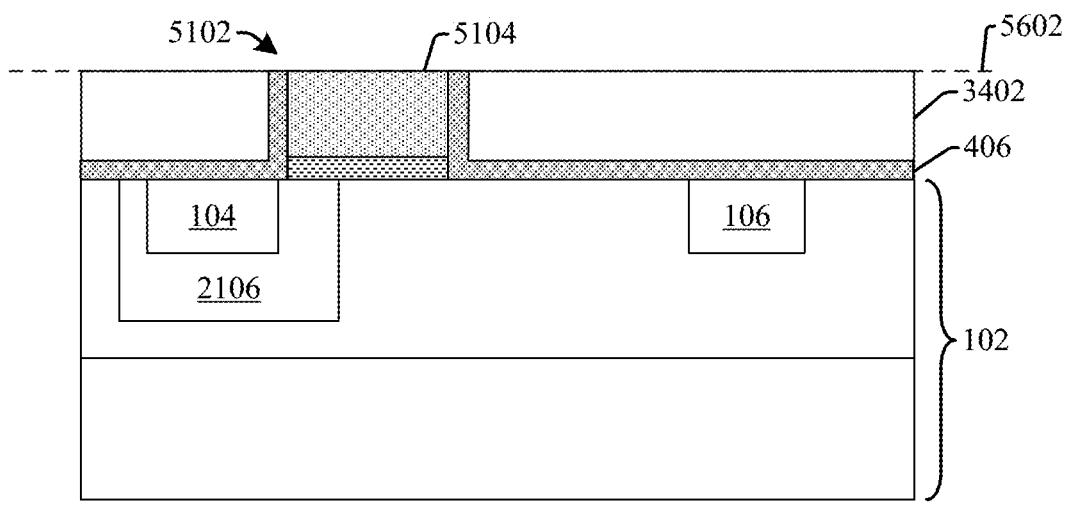

As shown in cross-sectional view 6900 of FIG. 69, a first planarization process is performed along line 5602. The first planarization process removes parts of the first ILD layer 3402 and the CESL 406 from over the sacrificial gate structure 5102. By removing parts of the first ILD layer 3402 and the CESL 406 from over the sacrificial gate structure 5102, a top of the sacrificial gate electrode 5104 is exposed.

Figure 70:
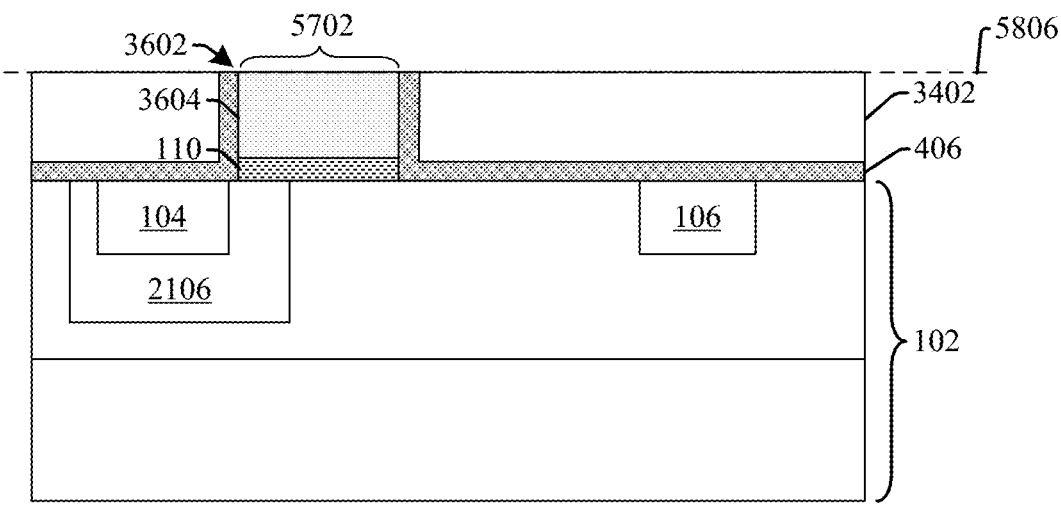

As shown in cross-sectional view 7000 of FIG. 70, the sacrificial gate structure 5102 is removed to form a replacement gate cavity 5702 between sidewalls of the CESL 406. In some embodiments, the sacrificial gate structure 5102 may be removed by using an etchant that is selective with respect to the sacrificial gate structure 5102. A metal gate electrode 3604 is subsequently formed within the replacement gate cavity 5702 to define a metal gate structure 3602. In some embodiments, the metal gate electrode 3604 may be formed by depositing a conductive material within the replacement gate cavity 5702. In some embodiments, one or more gate dielectrics may be formed in the replacement gate cavity 5702 prior to the deposition of the conductive material. A second planarization process (e.g., CMP process) is performed (along line 5806) after depositing a conductive material within the replacement gate cavity 5702. The second planarization process (along line 5806) removes the conductive material from over the first ILD layer 3402 to define the metal gate electrode 3604.

Figure 71:
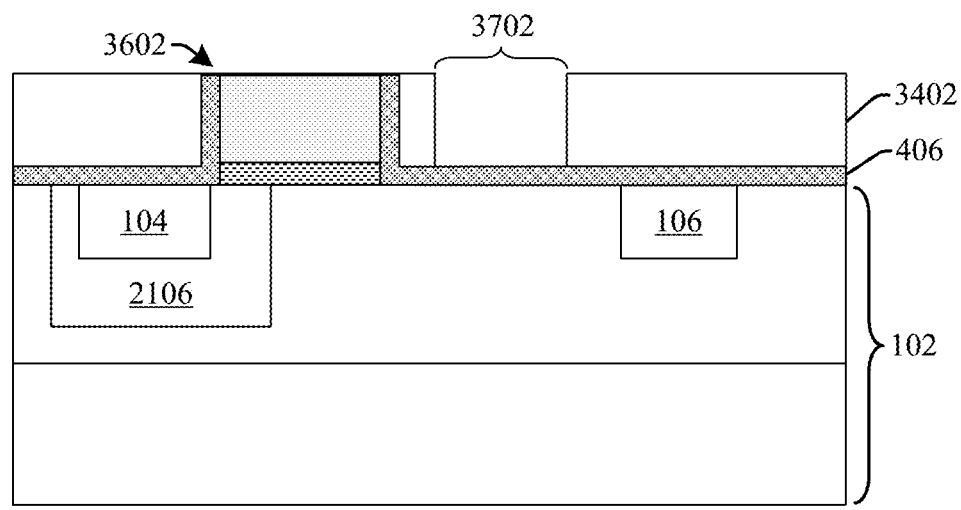

As shown in cross-sectional view 7100 of FIG. 71, an etching process is performed to define a cavity 3702 within the first ILD layer 3402 between the metal gate structure 3602 and the drain region 106. The cavity 3702 is defined by sidewalls of the first ILD layer 3402 and by an upper surface of the CESL 406. In some embodiments, the cavity 3702 may be defined forming a masking layer (not shown) over the first ILD layer 3402 and subsequently exposing the first ILD layer 3402 to an etchant in areas not covered by the masking layer.

Figure 72:
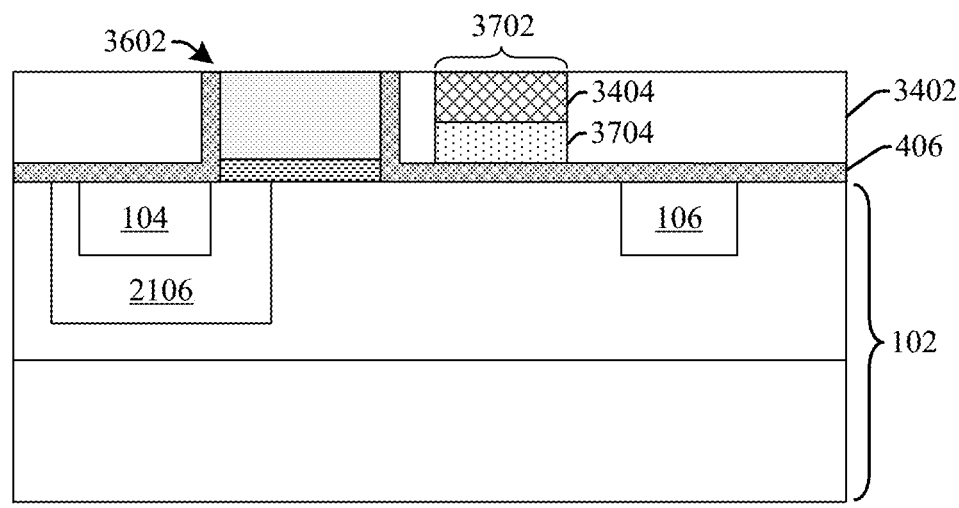

As shown in cross-sectional view 7200 of FIG. 72, a dielectric material 3704 is formed within the cavity 3702. In some embodiments, the dielectric material 3704 may comprise an oxide (e.g., silicon oxide), a nitride, or the like. A field plate etch stop structure 3404 is subsequently formed within the cavity 3702 over the dielectric material 3704. In various embodiments, the field plate etch stop layer 4502 may comprise silicon nitride ($SiN_x$), silicon oxynitride ($SiO_xN_y$), amorphous silicon (a-Si), hafnium oxide ($HfO_x$), zirconium oxide ($ZrO_x$), a metal-oxide, or the like. In some embodiments, the field plate etch stop layer 4502 may be formed by a depositing a field plate etch stop material (e.g., CVD, PE-CVD, PVD, ALD, or the like) followed by a chemical mechanical planarization process and/or an etching process that removes the dielectric material and/or the field plate etch stop material from outside of the cavity 3702.

Figure 73:
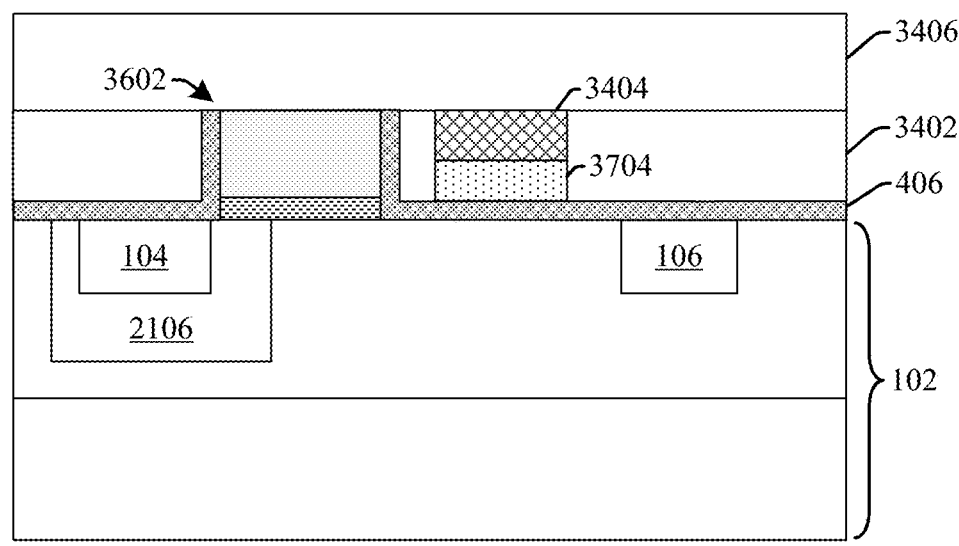

As shown in cross-sectional view 7300 of FIG. 73, a second ILD layer 3406 is formed over the first ILD layer 3402 and the field plate etch stop structure 3404.

Figure 74:
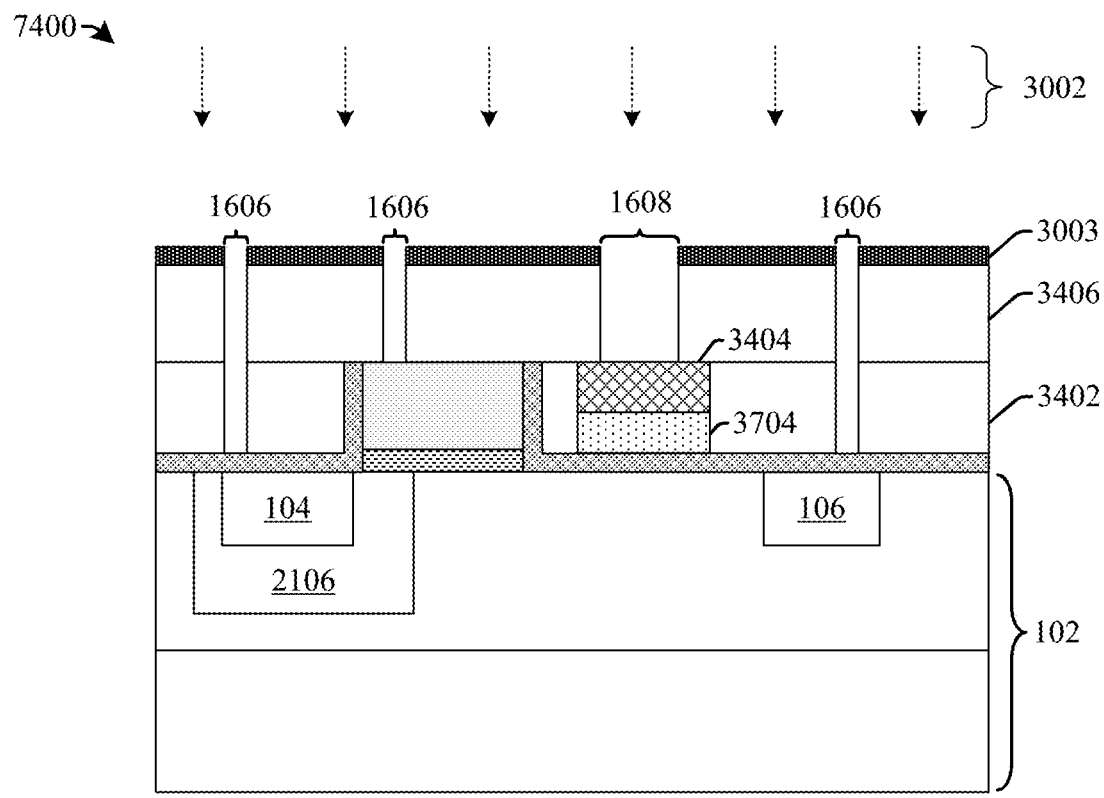

As shown in cross-sectional view 7400 of FIG. 74, an etching process is performed to concurrently define a plurality of contact openings 1606 and a field plate opening 1608. The plurality of contact openings 1606 are defined by sidewalls of the first ILD layer 3402 and the second ILD layer 3406. The field plate opening 1608 is defined by the second ILD layer 3406 and an upper surface of the field plate etch stop structure 3404. The contact openings 1606 and the field plate opening 1608 have an etching depth offset of a non-zero distance. In some embodiments, the non-zero distance may be in a range of between approximately 400 Angstroms and approximately 700 Angstroms.

Figure 75:
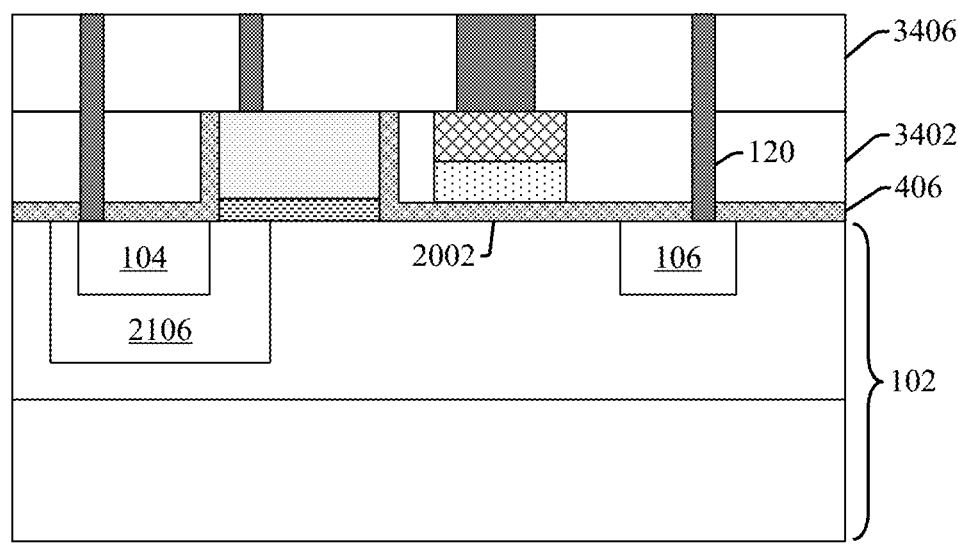

As shown in cross-sectional view 7500 of FIG. 75, the contact openings 1606 and the field plate opening 1608 are filled with one or more conductive materials. In some embodiments, the one or more conductive materials may be deposited by way of a vapor deposition technique (e.g., CVD, PVD, PE-CVD, sputtering, etc.) and/or a plating process (e.g., an electroplating or electro-less plating process). A planarization process (e.g., chemical mechanical planarization) may be subsequently performed to remove excess of the one or more conductive materials from over the second ILD layer 3406.

Figure 76:
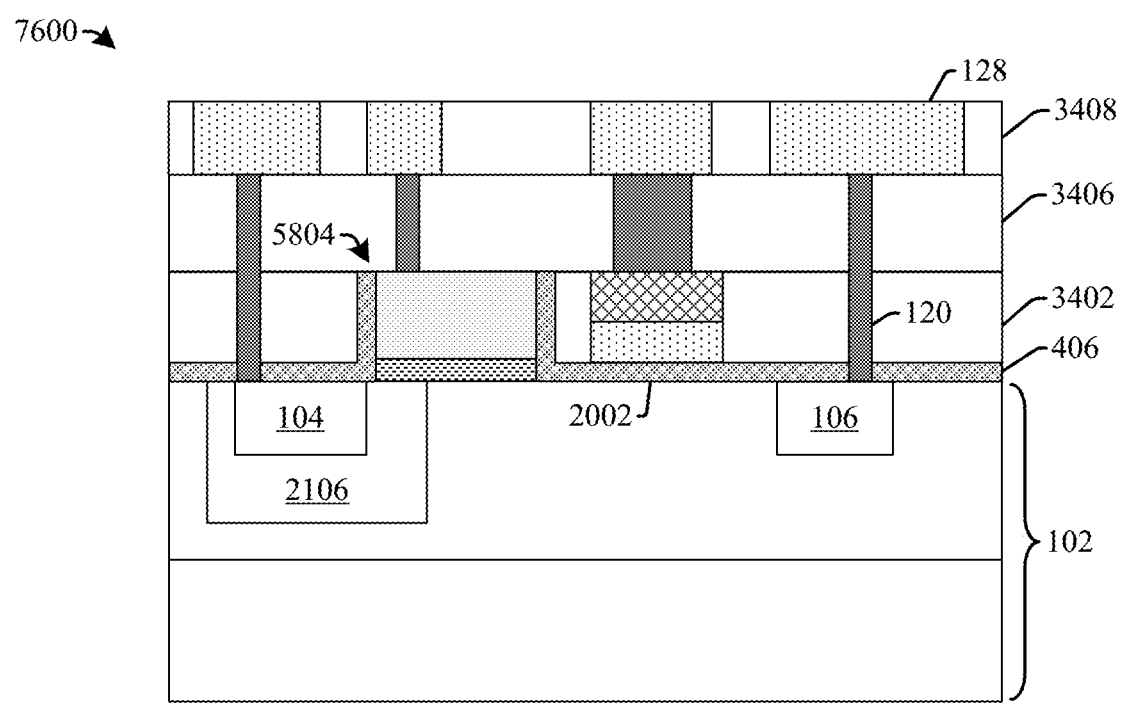

As shown in cross-sectional view 7600 of FIG. 76, a third ILD layer 3408 is formed over the second ILD layer 3406 and a first back-end-of-the-line (BEOL) metal wire layer 128 is formed within the third ILD layer 3408.

Figure 77:
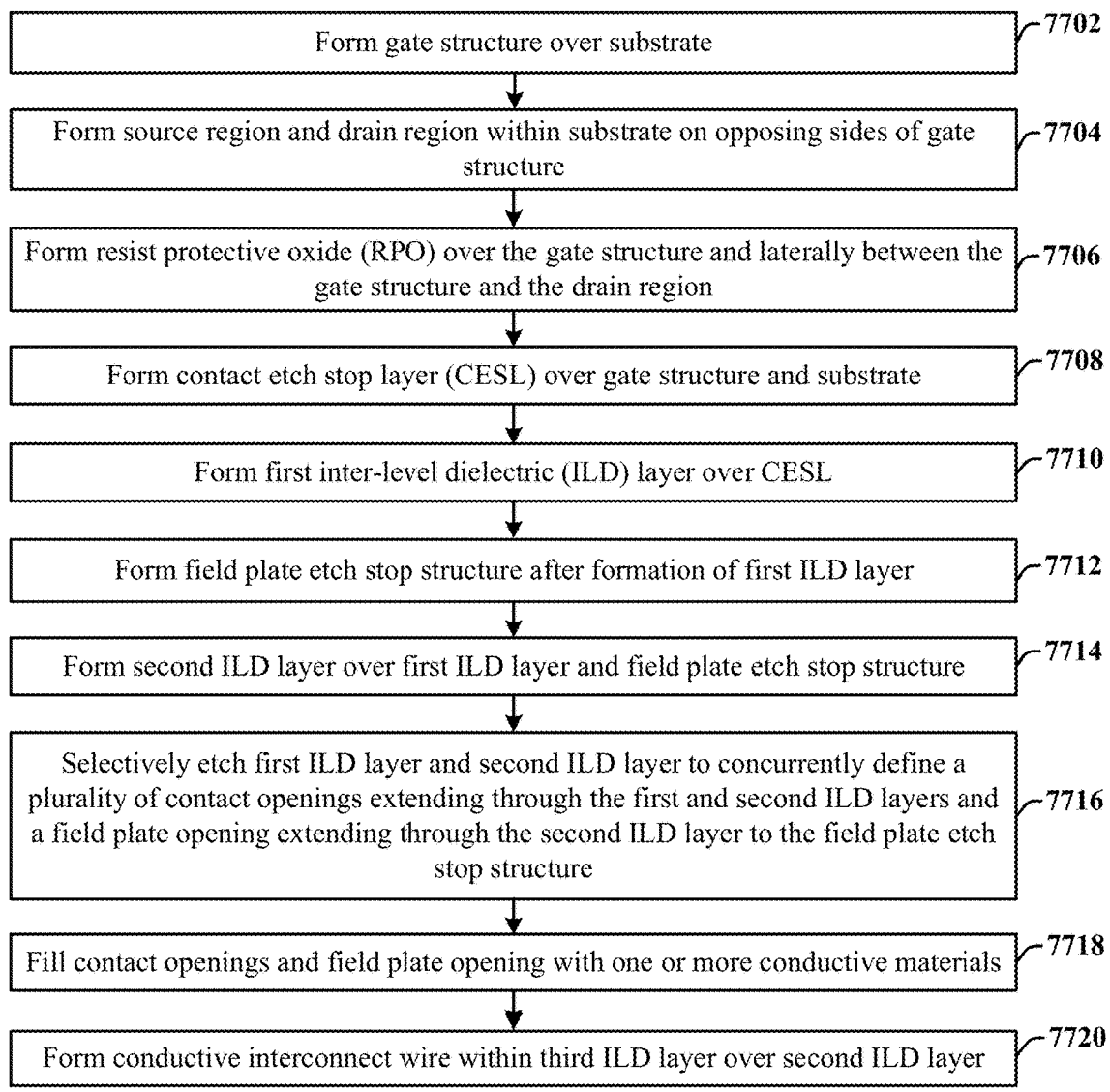
FIG. 77 illustrates a flow diagram of some embodiments of a method of forming a high voltage transistor device having a field plate etch stop structure defining a field plate comprising a bottom surface that is vertically offset from bottom surfaces of conductive contacts.

FIG. 77 illustrates a flow diagram of some embodiments of a method 7700 of forming a high voltage transistor device having a field plate etch stop structure defining a field plate comprising a bottom surface that is vertically offset from bottom surfaces of conductive contacts.

At 7702, a gate structure is formed over a substrate. FIGS. 40, 51, and 66 illustrate cross-sectional views, 4000, 5100, and 6600, corresponding to various embodiments of act 7702.

At 7704, source and drain regions are formed within the substrate on opposing sides of the gate structure. In some additional embodiments, one or more additional doped regions (e.g., a body region, a drift region, etc.) may also be formed within the substrate. FIGS. 40, 51, and 66 illustrate cross-sectional views, 4000, 5100, and 6600, corresponding to various embodiments of act 7704.

At 7706, a resistor protective oxide (RPO) may be formed over the gate structure and laterally between the gate structure and the drain region. FIGS. 41-42 and 52-53 illustrate a cross-sectional views, 4100-4200 and 5200-5300, corresponding to various embodiments of act 7706.

At 7708, a contact etch stop layer (CESL) is formed over the gate structure and substrate. FIGS. 43, 54, and 67 illustrate cross-sectional views, 4300, 5400, and 6700, corresponding to various embodiments of act 7708.

At 7710, a first inter-level dielectric (ILD) layer is formed over the CESL. FIGS. 44, 54, and 68 illustrate cross-sectional views, 4400, 5400, and 6800, corresponding to various embodiments of act 7710.

At 7712, a field plate etch stop structure is formed after the first ILD layer is formed. FIGS. 45-46, 59-61, and 71-72 illustrate cross-sectional views, 4500-4600, 5900-6100, and 7100-7200, corresponding to various embodiments of act 7712.

At 7714, a second ILD layer is formed over the first ILD layer and the field plate etch stop structure. FIGS. 47, 62, and 73 illustrate cross-sectional views, 4700, 6200, and 7300, corresponding to various embodiments of act 7714.

At 7716, the first ILD layer and the second ILD layer are selectively etched to concurrently define a plurality of contact openings extending through the first ILD layer and the second ILD and a field plate opening extending through the second ILD layer to the field plate etch stop structure. FIGS. 48, 63, and 74 illustrate cross-sectional views, 4800, 6300, and 7400, corresponding to various embodiments of act 7716.

At 7718, the plurality of contact openings and the field plate opening are filled with one or more conductive materials. FIGS. 49, 64, and 75 illustrate cross-sectional views, 4900, 6400, and 7500, corresponding to various embodiments of act 7718.

At 7720, a conductive interconnect wire is formed within a third ILD layer over the second ILD layer. FIGS. 50, 65, and 76 illustrate cross-sectional views, 5000, 6500, and 7600, corresponding to various embodiments of act 7720.

Therefore, the present disclosure relates to a high voltage transistor device having a field plate etch stop structure defining a field plate comprising a bottom surface that is vertically offset from bottom surfaces of conductive contacts.

In some embodiments, the present disclosure relates to an integrated chip. The integrated chip includes a gate structure disposed over a substrate between a source region and a drain region; a first inter-level dielectric (ILD) layer disposed over the substrate and the gate structure; a second ILD layer disposed over the first ILD layer; a field plate etch stop structure between the first ILD layer and the second ILD layer; a field plate extending from an uppermost surface of the second ILD layer to the field plate etch stop structure; and a plurality of conductive contacts extending from the uppermost surface of the second ILD layer to the source region and the drain region. In some embodiments, the integrated chip further includes a dielectric layer laterally extending from directly over the gate structure to between the gate structure and the drain region; and a contact etch stop layer disposed over the substrate, the dielectric layer, and the gate structure. In some embodiments, a bottommost surface of the field plate is arranged along a horizontal plane that is parallel to an upper surface of the substrate and that extends through sidewalls of the plurality of conductive contacts. In some embodiments, the field plate etch stop structure has a bottommost surface that is over a topmost surface of the first ILD layer. In some embodiments, the first ILD layer has sidewalls defining a cavity that is laterally between the gate structure and the drain region, the field plate etch stop structure is arranged within the cavity between the sidewalls of the first ILD layer. In some embodiments, the integrated chip further includes a dielectric material disposed within the cavity between the field plate etch stop structure and the substrate. In some embodiments, the integrated chip further includes a contact etch stop layer disposed over the substrate and the gate structure, an upper surface of the contact etch stop layer defines a bottom of the cavity. In some embodiments, the field plate etch stop structure includes amorphous silicon. In some embodiments, the field plate etch stop structure includes silicon nitride, silicon oxy-nitride, or a metal-oxide. In some embodiments, the field plate etch stop structure includes has opposing outermost sidewalls that are laterally between the gate structure and the drain region. In some embodiments, the integrated chip further includes an etch stop layer disposed over the second ILD layer, a bottommost surface of the second ILD layer contacts the first ILD layer and the uppermost surface of the second ILD layer contacts the etch stop layer.

In other embodiments, the present disclosure relates to an integrated chip. The integrated chip includes a gate structure disposed over a substrate between a source region and a drain region; a dielectric structure disposed over the substrate and the gate structure; a field plate etch stop structure disposed within the dielectric structure; a plurality of conductive contacts disposed within the dielectric structure; and a field plate disposed on the field plate etch stop structure, the field plate having a bottommost surface that is arranged along a first horizontal plane that is parallel to an upper surface of the substrate and that intersects sidewalls of the plurality of conductive contacts between top and bottom surfaces of the plurality of conductive contacts. In some embodiments, the field plate etch stop structure has a bottommost surface that is arranged along a second horizontal plane that is parallel to the first horizontal plane and that intersects the sidewalls of the plurality of conductive contacts between the top and bottom surfaces of the plurality of conductive contacts. In some embodiments, the dielectric structure includes a plurality of stacked ILD layers; and the field plate and the plurality of conductive contacts are laterally surrounded by a first ILD layer of the plurality of stacked ILD layers and vertically extend to a top of the first ILD layer. In some embodiments, the dielectric structure includes a first ILD layer and a second ILD layer over the first ILD layer; the conductive contacts extend from a bottom of the first ILD layer to a top of the second ILD layer; and the field plate etch stop structure is over a part of the first ILD layer and below a lower surface of the second ILD layer. In some embodiments, the dielectric structure includes a first ILD layer and a second ILD layer over the first ILD layer; and the field plate etch stop structure contacts an uppermost surface of the first ILD layer.

In yet other embodiments, the present disclosure relates to method of forming an integrated chip. The method includes forming a gate structure over a substrate between a source region and a drain region; forming a contact etch stop layer over the substrate; forming a first ILD layer over the contact etch stop layer; forming a field plate etch stop structure between the gate structure and the drain region after forming the first ILD layer; forming a second ILD layer over the field plate etch stop structure; and concurrently forming a plurality of contacts extending through the first ILD layer and the second ILD layer and a field plate extending through the second ILD layer to the field plate etch stop structure. In some embodiments, the method further includes forming a field plate etch stop layer over the first ILD layer; and patterning the field plate etch stop layer to define the field plate etch stop structure as having outermost sidewalls between the gate structure and the drain region. In some embodiments, the method further includes selectively patterning the first ILD layer to define a cavity between the gate structure and the drain region; and forming the field plate etch stop structure within the cavity. In some embodiments, the method further includes forming a dielectric material within the cavity; and forming the field plate etch stop structure over the dielectric material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated chip, comprising:
 a gate structure disposed over a substrate between a source region and a drain region;
 a first inter-level dielectric (ILD) layer disposed over the substrate and laterally surrounding the gate structure, wherein the first ILD layer has sidewalls defining a cavity that is laterally between the gate structure and the drain region;
 a second ILD layer disposed over the first ILD layer and over the gate structure, wherein the gate structure is between the substrate and the second ILD layer;
 a field plate etch stop structure having opposing outermost sidewalls that are laterally between the gate structure and the drain region, the field plate etch stop structure arranged within the cavity between the sidewalls of the first ILD layer;

a field plate extending from an uppermost surface of the second ILD layer to the field plate etch stop structure; and a plurality of conductive contacts extending from the uppermost surface of the second ILD layer to the source region and the drain region.

2. The integrated chip of claim 1, further comprising:
a dielectric layer continuously extending from along a sidewall of the gate structure to between the gate structure and the drain region; and
a contact etch stop layer disposed over the substrate and the dielectric layer, wherein the field plate etch stop structure contacts an upper surface of the contact etch stop layer.

3. The integrated chip of claim 1, wherein a bottommost surface of the field plate is arranged along a horizontal plane that is parallel to an upper surface of the substrate and that extends through sidewalls of the plurality of conductive contacts.

4. The integrated chip of claim 1, further comprising:
a dielectric material disposed within the cavity between the field plate etch stop structure and the substrate.

5. The integrated chip of claim 1, further comprising:
a contact etch stop layer disposed over the substrate, wherein an upper surface of the contact etch stop layer defines a bottom of the cavity.

6. The integrated chip of claim 1, wherein the field plate etch stop structure comprises amorphous silicon.

7. The integrated chip of claim 1, wherein the field plate etch stop structure comprises silicon nitride, silicon oxynitride, or a metal-oxide.

8. The integrated chip of claim 1, wherein either the first ILD layer or the second ILD layer is directly between the field plate etch stop structure and a conductive contact of the plurality of conductive contacts.

9. The integrated chip of claim 1, wherein a bottommost surface of the field plate is over the field plate etch stop structure; and
wherein a bottommost surface of the field plate etch stop structure laterally extends past opposing outermost sidewalls of the field plate.

10. The integrated chip of claim 9, further comprising:
a contact etch stop layer continuously extending from along a sidewall of the gate structure to directly between the bottommost surface of the field plate etch stop structure and the substrate.

11. The integrated chip of claim 1, wherein the field plate etch stop structure completely covers a bottommost surface of the field plate.

12. An integrated chip, comprising:
a gate structure disposed over a substrate between a source region and a drain region;
a contact etch stop layer disposed over the substrate and between the gate structure and the drain region;
a dielectric structure disposed over the contact etch stop layer and the gate structure, wherein the dielectric structure comprises a first ILD layer and a second ILD layer over the first ILD layer;
a field plate etch stop structure disposed within the dielectric structure, wherein the field plate etch stop structure is over a part of the first ILD layer and below a lower surface of the second ILD layer and wherein the contact etch stop layer continuously extends past opposing outermost sidewalls of the field plate etch stop structure;
a plurality of conductive contacts disposed within the dielectric structure, wherein the plurality of conductive contacts extend from a bottom of the first ILD layer to a top of the second ILD layer; and
a field plate disposed on the field plate etch stop structure, wherein the field plate has a bottommost surface that is arranged along a first horizontal plane that is parallel to an upper surface of the substrate and that intersects sidewalls of the plurality of conductive contacts between top and bottom surfaces of the plurality of conductive contacts.

13. The integrated chip of claim 12, wherein the field plate etch stop structure has a bottommost surface that is arranged along a second horizontal plane that is parallel to the first horizontal plane and that intersects sidewalls of the gate structure between top and bottom surfaces of the gate structure.

14. The integrated chip of claim 12, wherein the field plate and the plurality of conductive contacts are laterally surrounded by the second ILD layer and vertically extend to the top of the second ILD layer.

15. An integrated chip, comprising:
a gate structure disposed over a substrate between a source region and a drain region;
a first inter-level dielectric (ILD) layer disposed over the substrate and laterally surrounding the gate structure;
a second ILD layer disposed over the first ILD layer;
a plurality of conductive contacts extending from an upper surface of the second ILD layer to the source region and the drain region;
a field plate etch stop structure arranged vertically over the substrate and disposed laterally and directly between sidewalls of the first ILD layer or laterally and directly between first sidewalls of the second ILD layer;
a contact etch stop layer disposed over the substrate and between the gate structure and the drain region, wherein the contact etch stop layer continuously extends past opposing outermost sidewalls of the field plate etch stop structure; and
a field plate arranged on the field plate etch stop structure and laterally between second sidewalls of the second ILD layer.

16. The integrated chip of claim 15, further comprising:
a dielectric material having a vertically extending segment disposed along a sidewall of the gate structure and a laterally extending segment protruding outward from a sidewall of the vertically extending segment towards the drain region, wherein an upper surface of the dielectric material is disposed along a horizontal plane that is parallel to an upper surface of the substrate and that extends through the sidewall of the gate structure.

17. The integrated chip of claim 15, wherein the field plate continuously extends from an upper surface of the field plate etch stop structure to above a top of the field plate etch stop structure.

18. The integrated chip of claim 15, wherein the field plate etch stop structure has a maximum height that is smaller than a maximum height of the gate structure.

19. The integrated chip of claim 15, wherein the field plate etch stop structure has an upper surface that is above a top of the gate structure.

20. The integrated chip of claim 15, wherein the field plate etch stop structure comprises silicon.

* * * * *